(12) United States Patent
Harada et al.

(10) Patent No.: US 7,667,630 B2
(45) Date of Patent: Feb. 23, 2010

(54) INFORMATION COMPRESSION-ENCODING DEVICE, ITS DECODING DEVICE, METHOD THEREOF, PROGRAM THEREOF, AND RECORDING MEDIUM STORING THE PROGRAM

(75) Inventors: Noboru Harada, Nerima-ku (JP); Takehiro Moriya, Nerima-ku (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 235 days.

(21) Appl. No.: 11/720,671

(22) PCT Filed: Dec. 7, 2005

(86) PCT No.: PCT/JP2005/022495

§ 371 (c)(1),
(2), (4) Date: Jun. 1, 2007

(87) PCT Pub. No.: WO2006/062142

PCT Pub. Date: Jun. 15, 2006

(65) Prior Publication Data

US 2009/0002207 A1    Jan. 1, 2009

(30) Foreign Application Priority Data

Dec. 7, 2004    (JP) .............................. 2004-354742

(51) Int. Cl.
*H03M 1/36* (2006.01)
(52) U.S. Cl. ........................................ 341/106; 341/50
(58) Field of Classification Search .................... 341/50, 341/106, 63, 65, 67; 710/58, 60, 61; 370/351
See application file for complete search history.

(56) References Cited

U.S. PATENT DOCUMENTS 4,959,785 A * 9/1990 Yamamoto et al. .......... 715/234

(Continued)

FOREIGN PATENT DOCUMENTS

JP    5-127866    5/1993

(Continued)

OTHER PUBLICATIONS

Mark Nelson, et al., "The Data Compression Book, Second Edition", Chapters 7-9, pp. 180-251 and two front pages (with English translation).

(Continued)

*Primary Examiner*—Brian Young
(74) *Attorney, Agent, or Firm*—Oblon, Spivak, McClelland, Maier & Neustadt, L.L.P.

(57) ABSTRACT

The present invention aims to improve the compression ratio of an encoding method using a dictionary for such as LZ77, LZ78 or LZW for a sample string of an audio signal or an image signal. According to the present invention, the samples are aligned from the MSB side (73), and for an $N_C$-th ($N_C$ is the character size, for example, eight bits) character $C1(i)$, the samples are partitioned by starting from the MSB side, and a partitioned portion less than $N_C$ is added with dummy bits "0" until the size reaches $N_C$ to form a character (74). In this processing, lower bits in the samples can be ignored, mask data $M1(i)$ is created in which digits in the ignorable bit and dummy bits for each $C1(i)$ are set to "0" and effective bits (digits) are set to "1" (75), $C1(i)$ is compared with each character $D(j)$ in a character string for an index j in the dictionary using $M1(i)$ to check whether or not there are matches for effective digits portions in $C1(i)$. If there are matches, $C1(i)$ is considered to match $D(j)$.

23 Claims, 32 Drawing Sheets

U.S. PATENT DOCUMENTS 5,701,468 A * 12/1997 Benayoun et al. ........... 707/101
7,233,619 B1 * 6/2007 Roman ....................... 375/240

FOREIGN PATENT DOCUMENTS

| JP | 5-252049 | 9/1993 |
| JP | 7-21010 | 1/1995 |
| JP | 9-36747 | 2/1997 |
| JP | 10-190476 | 7/1998 |
| JP | 2003-179500 | 6/2003 |

OTHER PUBLICATIONS

David Salomon, "Data Compression", Chapter 3, pp. 101-162.
Mat Hans, et al., "Lossless Compression of Digital Audio", IEEE Signal Processing Magazine, vol. 18, No. 4, 2001, pp. 21-32.
Dai Yang, et al., "Lossless Compression for Audio Data in the IEEE Floating-Point Format", AES 115th Convention Paper 5987, Oct. 10-13, 2003, pp. 1-5.
Noboru Harada, et al., "Lossless Compression of IEEE754 floating-point signal in ISO/IEC MPEG-4 Audio Lossless Coding (ALS)", IEICE Transactions B, vol. J89-B, No. 2, Feb. 2006, pp. 1-9 (with English Abstract).
Noboru Harada, et al., "Lossless Compression of IEEE floating-point Audio using Approximate Common Factor Coding and Masked-LZ Compression", AES Convention Paper 6352, May 28-31, 2005, pp. 1-8.
"Information-technology—Coding of audio-visual objects—Part 3: Audio, Amendment 2: Audio Lossless Coding (ALS), new audio profiles and BSAC extensions", ISO/IEC 14496-3: 2005/FDAM 2:2005(E), Aug. 12, 2005, pp. 1-81.

* cited by examiner

FIG. 26

$$
\begin{bmatrix}
& & \text{DECIMAL} & \text{BINARY} \\
& & \text{NOTATION} & \text{NOTATION} \\
A & \begin{cases} x(1) = 250 \\ x(2) = 50 \\ x(3) = 350 \end{cases} & \begin{matrix} 11111010 \\ 110010 \\ 101011110 \end{matrix} \\
\\
B & \begin{cases} y(1) = x(1) \div A = 250 \div 1.5625 = 160 \\ y(2) = x(2) \div A = 50 \div 1.5625 = 32 \\ y(3) = x(3) \div A = 350 \div 1.5625 = 224 \end{cases} \\
\\
& & \text{DECIMAL} & \text{BINARY} \\
& & \text{NOTATION} & \text{NOTATION} \\
C & \begin{cases} y(1) = 160 \\ y(2) = 32 \\ y(3) = 224 \end{cases} & \begin{matrix} 10100000 \\ 100000 \\ 11100000 \end{matrix}
\end{bmatrix}
$$

FIG. 27

$$
A \begin{cases}
\text{NUMERICAL VALUE} & \text{SIGN} & \text{EXPONENT} & \text{MANTISSA (23bit)} \\
478.4 & : 0 & : 8 & : 11011110011001100110011 : \\
95.68 & : 0 & : 6 & : 01111110101110000101001 : \\
669.76 & : 0 & : 9 & : 01001110111000010100100 :
\end{cases}
$$

$$
B \begin{cases}
\text{NUMERICAL VALUE} & \text{SIGN} & \text{EXPONENT} & \text{MANTISSA (23bit)} \\
160 \,(= 478.4/2.99) & : 0 & : 7 & : 01000000000000000000000 : \\
32 \,(= 95.68/2.99) & : 0 & : 5 & : 00000000000000000000000 : \\
224 \,(= 669.76/2.99) & : 0 & : 7 & : 11000000000000000000000 :
\end{cases}
$$

FIG. 37A  INSTANCE OF SAMPLE (x(1),···)
x(1) 1 0 0 0 0 0 0 0 1 0 1 0 1 1 1 1 0
x(2) 1 0 0 0 0 1 0 1 0 1 1 1 1
x(3) 1 0 0 0 1 0 1 0 1
x(4) 1 0 0 1 0 1 0 1
FIG. 37B  CHARACTER STRING (y(1),···)
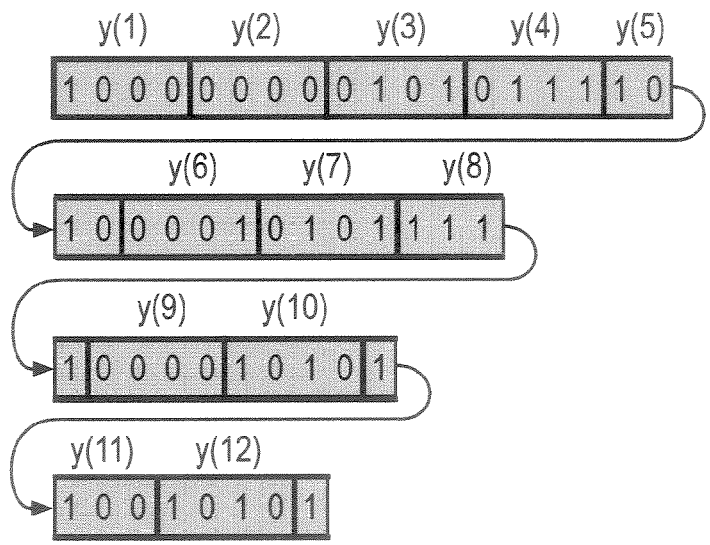
FIG. 37C  CHARACTER STRING (y(1),···)
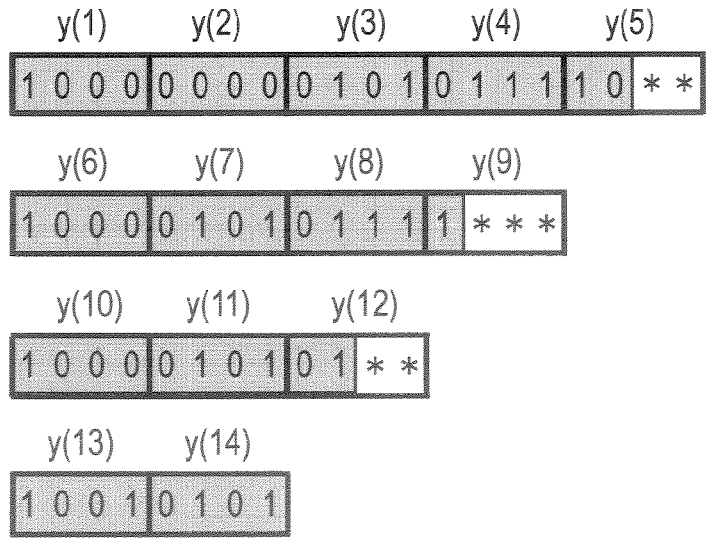

| INPUT SIGNAL | | PRIOR ART | | PRESENT INVENTION | |
|---|---|---|---|---|---|
| | ORIGINAL SIZE | SIZE AFTER COMPRESSION | COMPRESSION RATIO | SIZE AFTER COMPRESSION | COMPRESSION RATIO |
| SIGNAL 1 | 96kHz, 24bit | 66,007,332 | 28,091,208 | 42.558% | 27,346,043 | 41.429% |
| SIGNAL 2 | 96kHz, 24bit | 24,465,628 | 11,593,255 | 47.386% | 11,152,211 | 45.583% |
| SIGNAL 3 | 48kHz, 24bit | 11,520,244 | 6,230,924 | 54.087% | 5,798,421 | 50.332% |

INFORMATION COMPRESSION-ENCODING DEVICE, ITS DECODING DEVICE, METHOD THEREOF, PROGRAM THEREOF, AND RECORDING MEDIUM STORING THE PROGRAM

TECHNICAL FIELD

The present invention relates to a device that compression-codes information using a dictionary for such as the LZ, its decoding device, a method thereof, a program thereof and a recording medium storing the program.

BACKGROUND ART

In recent years, such as when character string data, acoustic signal data or image information data is transmitted via a communication path or when the data is recorded in an information recording medium, the amount of information in the data is often reduced using information compression-coding.

In some encoding methods, information is compressed by handling a unit of a predetermined number of bits as a character and using repetitive character strings as a model (for example, see the non-patent literature 1). These encoding methods include methods such as LZ77, LZ88 or LZW (for example, see the non-patent literature 1 and the non-patent literature 2).

The information compression-coding method by handling repetitive character strings as a model is used not only or compression-coding of such as a text document, but also for encoding of a modem signal and an image signal.

FIG. 1A shows an instance of an information compression-coding device for a character string by the LZ77 method and FIG. 1B shows an instance of a corresponding decoding device. In the encoding device according to the LZ77 method, a dictionary registering part 12 retains an input character string from an input terminal 11 in a dictionary part 13 by a certain amount. A match searching part 14 compares a new inputted character string with the past character strings in the dictionary part 13. A code generating part 15 outputs a position (index) in the dictionary part (buffer) 13 of a character string with the largest number of matching characters containing more than a predetermined number of characters (longest matching character string), the length of the matching portion, and a character following the longest matching characters in the input character string (mismatching character) as a code to an output terminal 16. If the length of the longest matching character string is less than the predetermined number of characters, the code generating part 15 outputs a code indicating the mismatch, for example a code of a position (index) 0 in the buffer and the matching length 0, and the first character of the input character string having the matching length less than the predetermined number of characters.

With respect to the dictionary part 13, its end connects to a read-ahead buffer 17 to collectively configure a slide buffer, as shown in FIG. 1C for example. Input character strings are stored serially from the end, a right end in the drawing, of the read-ahead buffer 17. When the read-ahead buffer 17 is full, match searching processing on a character string starts from a left end of the read-ahead buffer 17. When a code is outputted, characters having a length of the longest matching character string or a character is discarded from the left end of the dictionary part 13, and the last encoded character string or a character is stored at the right end of the dictionary part 13. And, the input character string is stored at the right end of the read-ahead buffer 17.

In the decoding device according to the LZ77 method, a code parsing part 22 determines whether or not an input code from an input terminal 21 indicates mismatch. If the input code does not indicate mismatch, the code parsing part 22 separates an input character string into position information (an index), the length of sequentially matching part, and a character that mismatches (a mismatching character). A character string retrieving part 23 acquires a corresponding character string from a dictionary part 24 based on the position information and the length of the sequentially matching part. A character string combining part 25 combines the character string acquired from the dictionary part 24 and the mismatching character to output as a decoded character string to an output terminal 26. A dictionary registering part 27 stores the decoded character string in the dictionary part 24. The dictionary part 24 is a slide buffer in which a character string is retained in the same state relative to the dictionary part 13 in FIG. 1A.

If a code indicating mismatch is inputted, the code parsing part 22 outputs the following mismatching character as it is and store it in the dictionary part 24.

The LZ77 encoding method has been improved to LZSS, ZIP and the like. These methods such as ZIP further compress an output of a code obtained by LZ77 with the Huffman coding, a kind of entropy encoding.

FIG. 2A shows an instance of an information compression-coding device for a character string using a typical LZ78 method and FIG. 2B shows an instance of a corresponding decoding device. In the LZ78 encoding, processing starts with a dictionary part 31 being empty. A match searching part 32 compares a new inputted character string from the input terminal 11 with character strings registered in the dictionary part 31. A code generating part 33 pairs up an index in the dictionary part 31 corresponding to the longest matching character string which contains the longest number of matching characters, with an index corresponding to the next mismatching input character next to the longest matching character, and outputs the pair as a code to the output terminal 16. Each time a dictionary registering part 34 outputs a code, it newly registers a character string containing said longest matching character string attached with the next character in the dictionary part 31. The dictionary part 31 is not a slide buffer, but a fixed one. If an inputted character is not found in the dictionary part 31, the encoding device in FIG. 2A outputs a special index indicating the mismatch and a character as it is as a code.

In the LZ78 decoding device in FIG. 2B, the initial state of a dictionary part 941 is the same as that of the dictionary part 31 used for the encoding. That is, the dictionary part 941 starts its processing in the empty state. A code parsing part 942 separates the input code into an index of the longest matching character string and an index of a following mismatching character. A character string retrieving part 943 acquires the matching character string and the mismatching character from the dictionary part 941 using the indices. The character string combining part 25 decodes the character string by combining the acquired matching character string and the mismatching character to output to the output terminal 26. While this processing, a dictionary registering part 944 newly registers a character string containing the longest matching character string attached with the mismatching character in the dictionary part 941 by the same method as that is used in the encoding device. In this manner, the dictionary part 941 in the decoding device and the dictionary part 31 in the encoding device are kept in the same internal state.

In the LZ78 encoding, the dictionary parts 31 and 941 are configured in a tree structure. A method is also known of speeding up the search such as by compressing a character string with a hash function when the search is made to check whether or not an element equal to an input character string has been registered in the dictionary.

FIG. 3A shows an LZW encoding device and FIG. 3B shows a corresponding decoding device. In a dictionary part 35 in the LZW encoding device, a limited number of initial characters (data) have been previously registered. A match searching part 36 compares an inputted character string with character strings registered in the dictionary part 35. Then, the match searching part 36 outputs the longest matching character string, which contains the largest number of matching characters, and an index in the dictionary part 35 corresponding to the character string to a code generating part 37. The code generating part 37 outputs the index in the dictionary part 35 as a code from the output terminal 16. The code generating part 37 further outputs the longest matching character string to a dictionary registering part 38. The first character $C_F$ of the character string is attached to the end of the previous longest matching character string retained temporarily in a previous buffer 38a and registered in the dictionary part 35. That is, the previous encoded character string and the first character $C_F$ of the current encoded character string are registered in the dictionary part 35 as a sequential character string.

Next, the decoding device in FIG. 3B will be described. A code parsing part 946 acquires an index of the longest matching character string serially from an input code from a terminal 21. A character string retrieving part 947 reads out a character string corresponding the acquired index from a dictionary part 945. A character string combining part 948 outputs the character string read out from the dictionary part 945 as a decoded character string to the output terminal 26. At the same time, a dictionary registering part 949 attaches the first character $C_F$ of the current decoded character string to the end of the previous decoded character string in a previous buffer 949a to register in the dictionary part 945.

On the other hand, compression-coding methods involving distortion for acoustic signal data (a digital sample value string) include MP3, AAC, TwinVQ and the like. Compression-coding methods for image information data (a sample value) include JPEG and the like. Techniques of reversible encoding (lossless encoding) involving no distortion are also known (for example, see the non-patent literature 3). Moreover, lossless compression of data in a floating-point format which is easy to edit and manufacture is also important. Particularly, in some techniques, an audio signal in a floating-point format is partitioned into only an integer string and possible non-zero bits in a mantissa being the remaining (difference) portion and each of them is encoded, thereby improving compression efficiency (for example, see the non-patent literature 4).

Multiplying each sample s0($i$) in an original sample string by a common real number G as a gain results in a sample s1($i$) being s1($i$)=s0($i$)×G. It is often the case that the sample s1($i$) obtained by multiplying by the real number G is represented in a binary notation or a binary floating-point notation according to an IEEE-754 format and the digital sample strings are encoded. A floating-point format standardized according to the IEEE-754 is 32-bit format as shown in FIG. 4, which is composed of, from the highest-order bit, a sign of 1 bit, an exponent of 8 bits and a mantissa of 23 bits. Denoting the sign by S, a value represented by the 8-bit exponent by E in a decimal number and the binary number of the mantissa by M, respectively, the numerical value in a floating-point format is represented in a magnitude binary notation as an formula (1):

[Formula 1]

$$(-1)^S \times 1 \cdot M \times 2^{E-E_0} \quad (1)$$

According to the IEEE-754, it is defined that $E_0=2^7-1=127$, so $E-E_0$ in the formula (1) can have the following range of arbitrary values:

$$-127 \leq E-E_0 \leq 128$$

However, $E-E_0=-127$ is defined to be all "0"s and $E-E_0=128$ is defined to be all "1"s. $E-E_0=n$ represents a value obtained by subtracting one (1) from the number of digits (the number of bits) in an integer portion of a value represented by the formula (1), i.e., the number of lower significant bits below the most significant "1".

Non-patent literature 1: Nelson & Gailly (translated into Japanese by Ogiwara & Yamaguchi), "The Data Compression Book, Second Edition", Chapters 7-9

Non-patent literature 2: D. Salomon, "Data Compression", pp. 101-162 (Chapter 3)

Non-patent literature 3: Hans, M. and Schafer, R. W., "Lossless Compression of Digital Audio", IEEE Signal Processing Magazine, Vol. 18, No. 4, pp 21-32 (2001)

Non-patent literature 4: Dai Yang and Takehiro Moriya, "Lossless Compression for Audio Data in the IEEE Floating-Point Format", AES Convention Paper 5987, AES 115th Convention, New York, N.Y., USA, 2003 Oct. 10-13

DISCLOSURE OF THE INVENTION

Problem to be Solved by the Invention

Using an information compression-coding method with a model of repetitive character strings, the compression ratio improves in the case of repetitively appearing similar combination of characters due to characteristics of the base model.

It is contemplated that compression-coding digital information such as a digital sample value of an audio signal, a digital sample value of an image signal, an electrocardiographic wave digital sample value, a digital sample value of a measured signal such as an earthquake wave digital sample value, a digital value of a residual signal for linear prediction analysis or other digital numerical values using a dictionary for such as the LZ. However, actually, similar combinations (of digital values) appear comparatively less often, so that a desired compression ratio can be hardly attained.

It is an object of the present invention to provide an information compression-coding device to solve the above problem, its decoding device, a method thereof, a program thereof and a recording medium storing the program.

Means to Solve the Problems

According to the present invention, in an information compression-coding method using a dictionary for such as the LZ for information represented in a processing unit of a predetermined number of bits, input information with a known number of effective bit digits (hereinafter referred to as the length of effective digits) is compared with information registered in a dictionary. If a match is found for all bits of said length of effective digits in the input information, the method outputs an index of the registered information as at least part of codes of the input information.

EFFECTS OF THE INVENTION

We reviewed groups of information represented in a binary notation, or information represented in arrangement of binary values "0" and "1", and found that each piece of the information comparatively often has imbalance between the numbers of one binaries and the other binaries. Conventionally a target of search is input information that perfectly matches registered information in a dictionary. However, in the present invention, the target of the search is an important portion in the imbalanced information, i.e., bits in a portion corresponding to at least effective digits of the bits constituting the input information that match the registered information in the dictionary, and the matching index is decided as an output code. Consequently, an identical index is more often found by searching, i.e., a code of an identical index is more often outputted, thereby the compression ratio improves than the prior arts.

BRIEF DESCRIPTION OF THE DRAWINGS

FIG. 26 is a diagram showing an instance of specific numerical values that are converted to increase the encoding ratio by dividing a plurality of numbers represented in binary notation by a common multiplier;

FIG. 27 is a diagram showing an instance of specific numerical values that are converted to increase the encoding ratio by dividing a plurality of floating-point numbers by a common multiplier;

FIG. 37A is a diagram showing an instance of a string of samples, each of which has a different number of bits.

FIG. 37B is a diagram showing an instance of converting the sample string into a character string by simply defining four bits as a character.

FIG. 37C is a diagram showing an instance of converting the sample into a character string using dummy bits while correlation between the samples is maintained.

BEST MODES FOR CARRYING OUT THE INVENTION

Figure 1A:
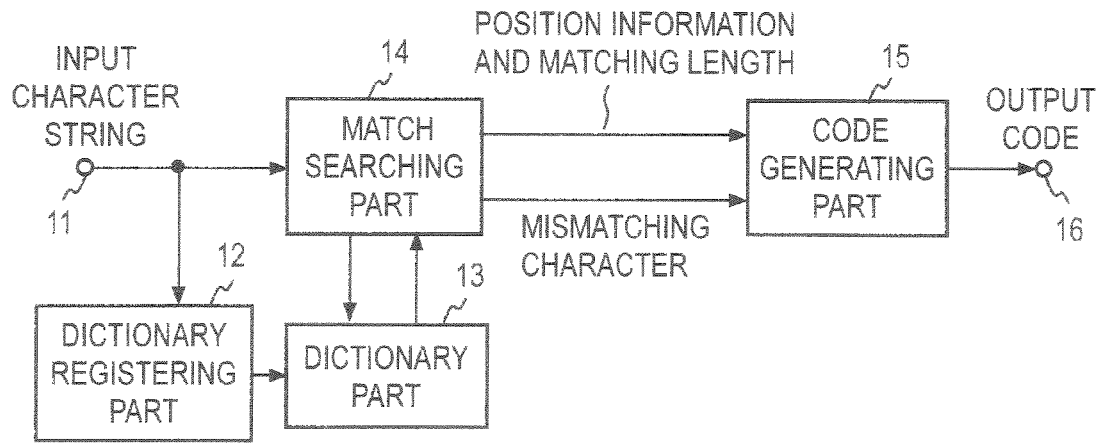
FIG. 1A is a block diagram illustrating function configuration of a conventional LZ77 encoding device.

While embodiments of the present invention will be described with reference to the drawings in the following, corresponding portions in the drawings are given the same reference numerals and their description will be omitted to avoid repetition.

First Embodiment

Encoding Configuration

The following describes encoding of input information (data) with a known number of effective bit digits. Although various types of input information are contemplated, typically, input information is not a character. However, the present invention carries out encoding using a dictionary similarly to the prior arts shown in FIGS. 1 to 3. For the sake of clarity, in the following description, a bit string in input information subjected to the encoding is partitioned into units referred to as "characters" herein, each of which is composed of a plurality of bits (for example, eight bits). In this embodiment, mask data is used as effective digits information for illustration. For example, an input character (unit of processing information) $C1(i)$ is "01010101" and its mask data $M1(i)$ is "11110000". A binary "1" in mask data M1 means that a corresponding digit in the character bit string is effective, while a binary "0" means that a corresponding digit is ineffective or ignorable. That is, in this instance, the upper four bits 0101 in the character $C1(i)$ are effective, while the lower four bits 0101 are ineffective or ignorable.

Figure 5:
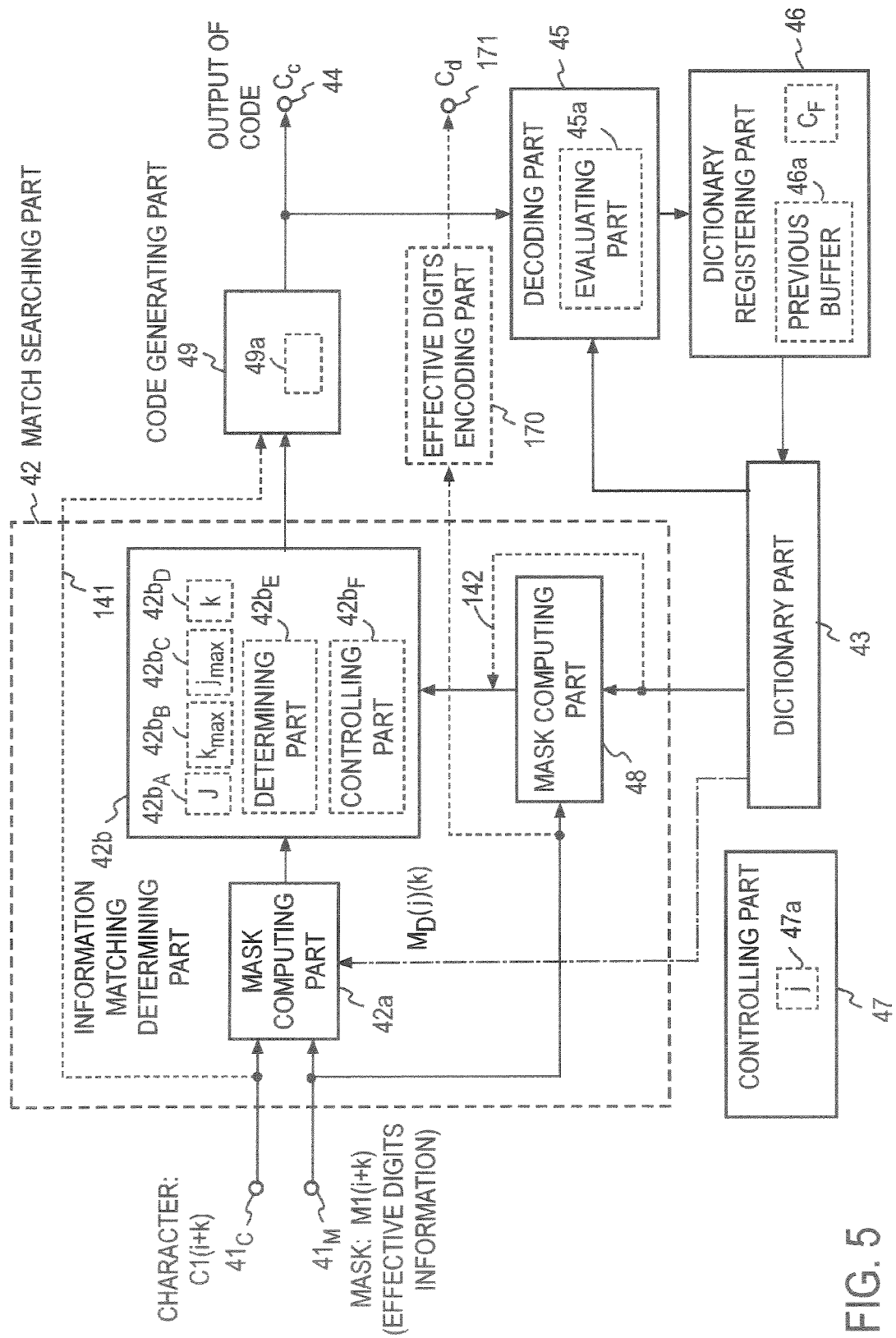
FIG. 5 is a block diagram showing an instance of function configuration of an encoding device according to a first embodiment (embodiment A-3)

FIG. 5 illustrates functional configuration of the first embodiment. A terminal $41_C$ successively inputs an input string of characters $C1(i+0)$ to $C1(i+k)$ with the first input character $C1(i)$ on the basis of a character. A terminal $41_M$ successively inputs a string of mask data (effective digits information) $M1(i+0)$ to $M1(i+k)$ corresponding to the input character string $C1(i+0)$ to $C1(i+k)$ on the basis of a character. The reference character k herein denotes a positive integer incrementing by one from 0.

In a dictionary part 43, a character string for each index is registered. In this instance a string of $K_j$ characters $D(j)(0)$ to $D(j)(K_j-1)$, is registered for each index j. Each character constituting a character string registered in an storage area corresponding to the index j in the dictionary is represented by $D(j)(k)$, where $0 \leq k \leq K_j-1$. A character string is expressed by $D(j)(k)$ [k: $0 \leq k \leq K_j-1$] or $D(j)(k)$ [k: $0 \leq k < K_j$].

A match searching part 42 compares the input string of characters $C1(i+0)$ to $C1(i+K_j-1)$ and the string of characters $D(j)(0)$ to $D(j)(K_j-1)$ registered at a j-th index in the dictionary part 43 from their first characters, with considering the string of information of effective digits $M1(i+0)$ to $M1(i+K_j-1)$. Specifically, the match searching part 42 acknowledges a match if a k-th character $C1(k)$ matches $D(j)(k)$ bits corresponding to bits being "1" of the constitution bits in the effective digits information $M1(i+k)$. If a match is found, the match searching part 42 searches for a dictionary index j of the longest character string, which contains an effective digits portion perfectly matching an input character string registered in the dictionary part by incrementing k by one. As a result of the search, a retrieved index j is outputted as at least a portion of a compressed code to an output terminal 44.

The following description details an instance of searching for a dictionary registered character which matches in at least the bits of effective digits portion using logical AND of a character and its mask data as mask processing.

The input character C1($i$+k) and the effective digits information M1($i$+k) are successively inputted to a mask computing part 42a by incrementing k by one from 0. The mask computing part 42a computes bitwise logical AND, of C1($i$+k) and M1($i$+k) i.e. C1($i$+k)&M1($i$+k).

The effective digits information M1($i$+k) is also inputted to a mask computing part 48. The mask computing part 48 computes bitwise logical AND: D(j)(k)&M1($i$+k) of a character D(j)(k) in a character string D(j)(k) [k: $0 \leq k < K_j$] registered at a j-th index in the dictionary part 43, and M1($i$+k).

Hereinafter, a result C1($i$)&M1($i$) of mask processing of a character C1($i$) with effective digits information M1($i$) is called a masked character. Similarly, a result D(j)(i)&M1($i$) of mask processing of a character D(j)(i) with a corresponding effective digits information M1($i$) is also called a masked character.

An information matching determining part 42b compares each masked character from the mask computing part 42a and each masked character from the mask computing part 48 successively by incrementing k by one from k=0. If C1($i$+k)&M1($i$+k) and D(j)(k)&M1($i$+k) match from k=0 to $K_j$−1 throughout, the information matching determining part 42b determines that there is a match between a character string registered at a dictionary index j and the input character string.

The above determination corresponds to determination that there is a match between two characters if there are matches for at least bits being 1 and effective among constitution bits of effective digits information M1($i$+k), when determining a match between C1($i$+k) and D(j)(k).

For example, if C1($i$+k) is 01010101, its mask data M1($i$+k) is 11110000 and D(j)(k) is 01011010, then C1($i$+k)&M1($i$+k) is 01010000 and D(j)(k)&M1($i$+k) is also 01010000. Accordingly, it is determined that there is a match between a masked character C1($i$+k)&M1($i$+k) and a masked character D(j)(k)&M1($i$+k). That is, there is a match between C1($i$+k) and D(j)(k) in terms of at least bits in portions corresponding to effective digits.

Meanwhile, to the dictionary part 43 a character string that is obtained by encoding and outputting a past inputted character string has been registered.

For example, represent a character string consisting of K characters in which x characters were inputted in the past by C1($i$−x+k) [k: $0 \leq k \leq K$−1]. A character string outputted from the mask computing part 42a is represented by C1($i$−x+k)&M1($i$−x+k) [k: $0 \leq k \leq K$−1]. In this case, if $x_j$ characters in the past character string has been registered at an index j in the dictionary part 43, each character constituting the registered character string is represented by the following formula:

$$D(j)(k) = C1(i-x_j+k) \& M1(i-x_j+k)$$

Using the above formula, comparison of character strings by the information matching determining part 42b results in obtaining an index j corresponding to a character string with the longest $K_j$ in which C1($i$+k)&M1($i$+k) and C1($i$−$x_j$+k)&M1($i$−$x_j$+k)&M1($i$+k) completely match in a range of $0 \leq k \leq K_j$−1.

The match searching part 42 outputs a dictionary index as at least a portion of a compression code for the input character string in which the index corresponds to a character string whose matching length is not less than a pre-determined number and whose number of characters matching an input character string is largest. Specifically, the match searching part 42 may output only a dictionary index (referred to as a mask LZW method), output the dictionary index and a masked mismatching character C1($i$+$K_j$)&M1($i$+$K_j$) obtained by masking the first character determined to mismatch (referred to as a mismatching character) with its mask data (referred to as a mask LZ78 method), or output the dictionary index, the length of sequentially matching characters, and a masked mismatching character C1($i$+$K_j$)&M1($i$+$K_j$) (referred to as a mask LZ77 method). Furthermore, in the mask LZ77 and mask LZ78 methods, the match searching part 42 outputs a code indicating that the matching length of a character string in the above mentioned match searching is less than a pre-determined number, and a masked mismatching character C1($i$)&M1($i$) of the first character in the character string. Based on a result of the determination by the information matching determining part 42b, a code generating part 49 outputs a code to a terminal 44 depending on the above mentioned encoding methods.

Figure 1B:
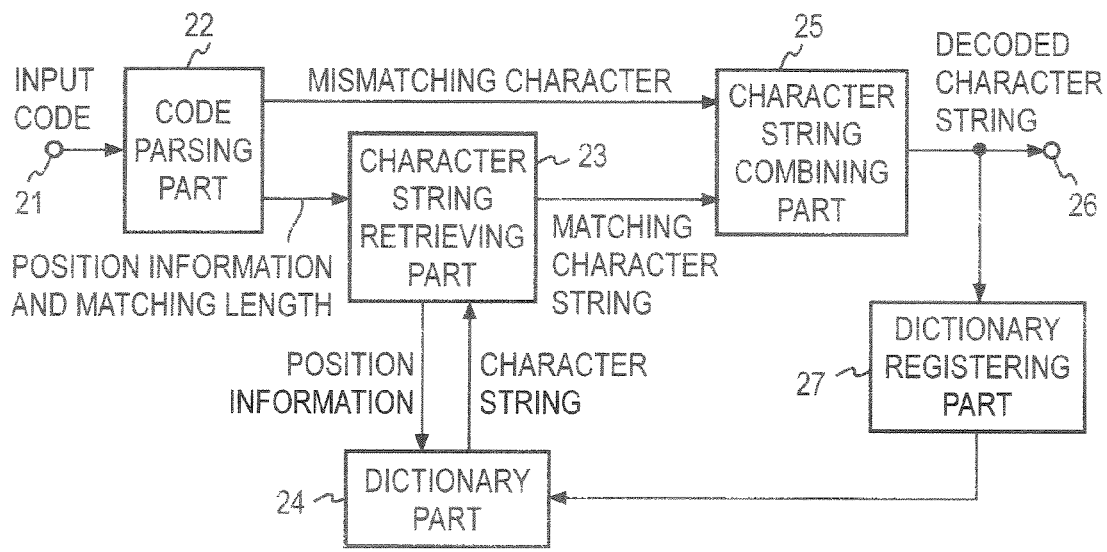
FIG. 1B is a block diagram illustrating function configuration of a corresponding decoding device.
Figure 1C:
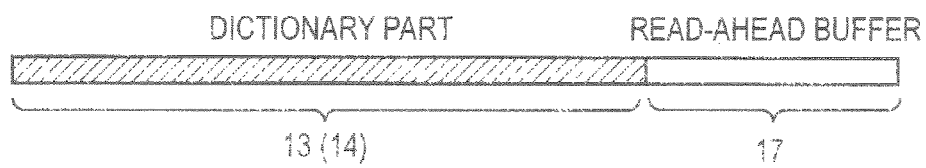
FIG. 1C is a diagram illustrating a dictionary part and a read-ahead buffer configured in a series of slide buffers.
Figure 2A:
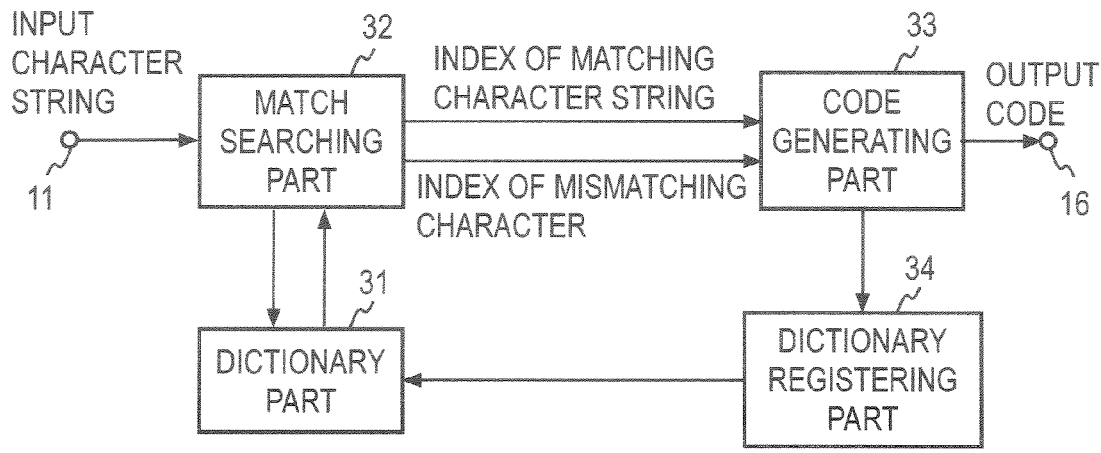
FIG. 2A is a block diagram illustrating function configuration of a conventional LZ78 encoding device.
Figure 2B:
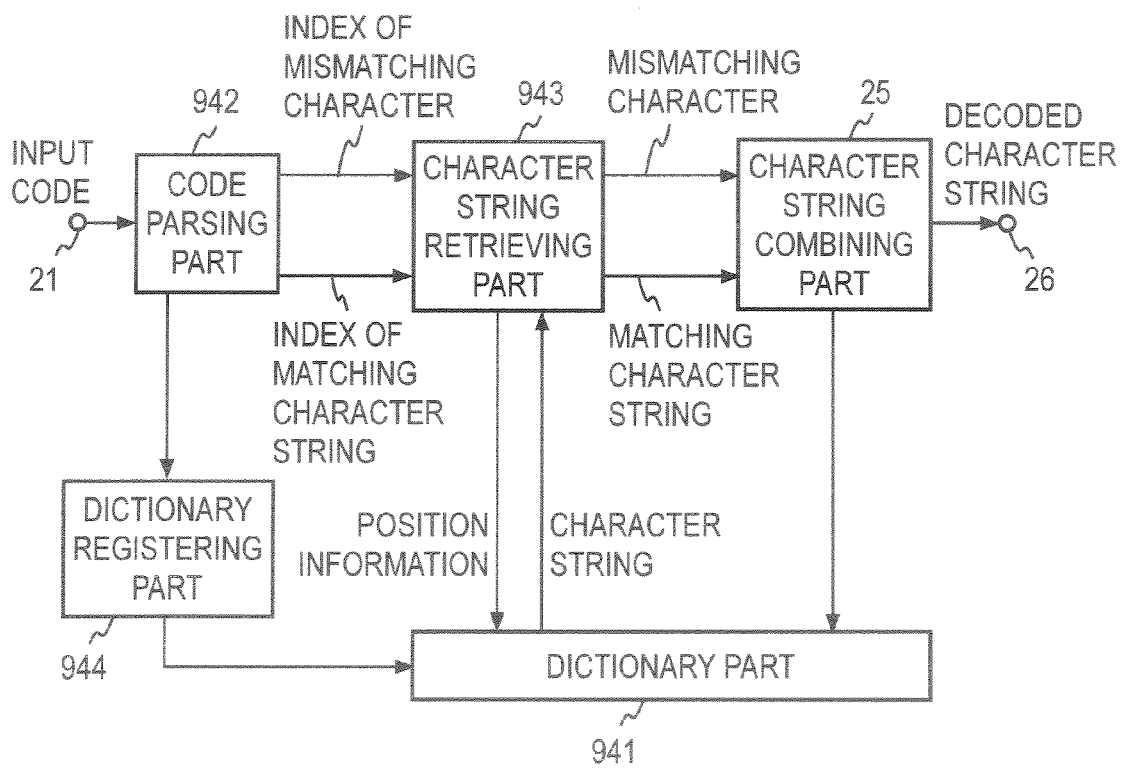
FIG. 2B is a block diagram illustrating function configuration of a corresponding decoding device.
Figure 3A:
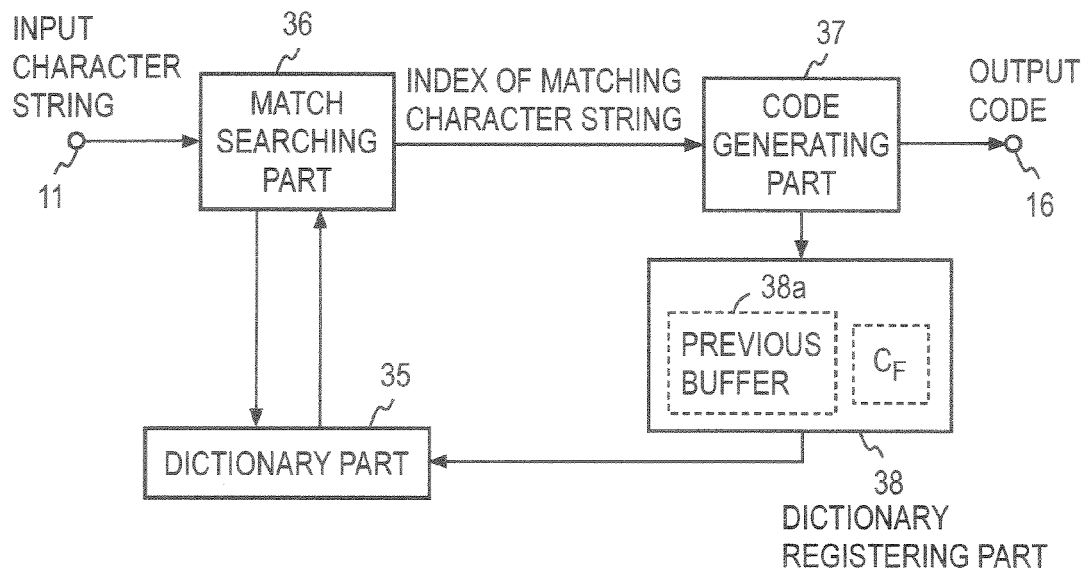
FIG. 3A is a block diagram illustrating function configuration of a conventional LZW encoding device.
Figure 3B:
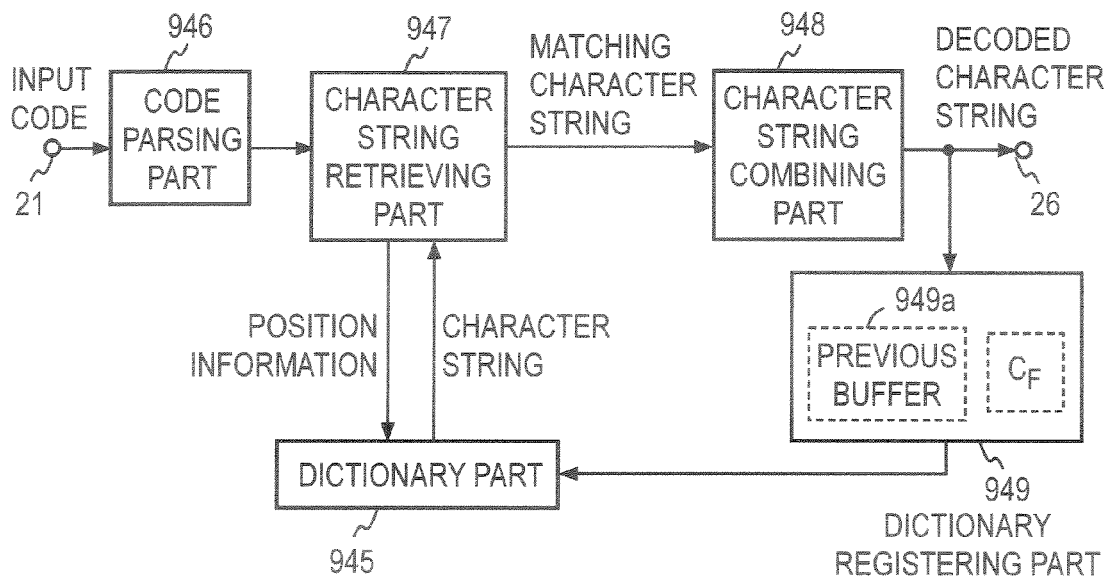
FIG. 3B is a block diagram illustrating function configuration of a corresponding decoding device.
Figure 4:
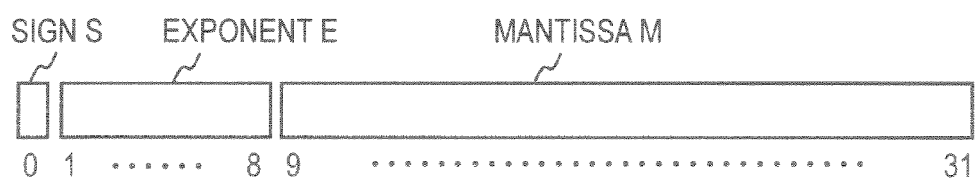
FIG. 4 is a diagram illustrating an IEEE-754 floating point sequence.

The information matching determining part 42b and the code generating part 49 correspond to, for example, the match searching part 14 and the code generating part 15 in FIG. 1A, the match searching part 32 and the code generating part 33 in FIG. 2A, or the match searching part 36 and the code generating part 37 in FIG. 3A, respectively. The difference is that the information matching determining part 42b and the code generating part 49 determine matching by comparing only effective digits in two characters. Similarly, the present invention can be applied to LZ methods other than the above mentioned methods. In that case, different corresponding encoding methods to be applied perform different processing. Also, function configuration of the dictionary part 43, contents retained in a dictionary, an output of an index and the like vary depending on the corresponding encoding method. However, it is common to either case that the longest matching character string is searched for while a match is acknowledged between characters if there are matches for at least bits determined to be effective due to effective digits information. It is also common that the number of characters in a character string and effective bits in each character are determined in decoding by using effective digits information. The decoding is performed depending on the encoding methods. Hereinafter, the corresponding encoding methods are generally referred to as, for example, a mask LZ77 method, a mask LZ78 method, a mask LZW method, and a mask LZ encoding method.

A decoding part 45 decodes a code outputted by the code generating part 49 into a character string. A dictionary registering part 46 generates a string of $K_j$+1 characters obtained by attaching a masked character (masked mismatching character) C1($i$+$K_j$)&M1($i$+$K_j$) next to the last character C1($i$+$K_j$−1) in the longest matching character string to the longest matching decoded character string. Then, the dictionary registering part 46 registers the generated character string at an index larger by one than the largest index in the dictionary part 43 at which the current character string is registered. Each character in the decoded character string is.

$$D(j)(k) \ [k: 0 \leq k < K_j], \text{ i.e., } (C1(i-x_j+k) \& M1(i-x_j+k)) \ [k: 0 \leq k < K_j].$$

Therefore, a new character string registered at a dictionary index $j_{max}$ is obtained by attaching C1($i$+$K_j$)&M1($i$+$K_j$) to the end of (C1($i$−$x_j$+k)&M1($i$−$x_j$+k)) [k: $0 \leq k < K_j$].

In the mask LZ77 and mask LZ78 methods, if a code indicating that the matching length is not more than a pre-determined value is inputted to the decoding part 45, then the masked mismatching character C1($i$)&M1($i$) is inputted to the dictionary registering part 46 as it is, and the masked mismatching character is registered at an index larger by one than the largest index in the dictionary part 43 at which the current character is registered. Moreover, in the mask LZ77 and mask LZ78 methods, no character has been registered in the dictionary part 43 at the start of the encoding, while in the mask LZW method, every character has been registered in the dictionary part 43 at the start of the encoding. The function configuration and processing of the decoding part 45 and the dictionary registering part 46 will be described below.

The effective digits information is encoded by effective digits encoding part 170 as necessary and outputted to an effective digits code by a terminal 171. The effective digits encoding par 170 compression-codes effective digits information corresponding to a plurality of characters collectively, thereby improving encoding effect.

Encoding Process

Figure 6:
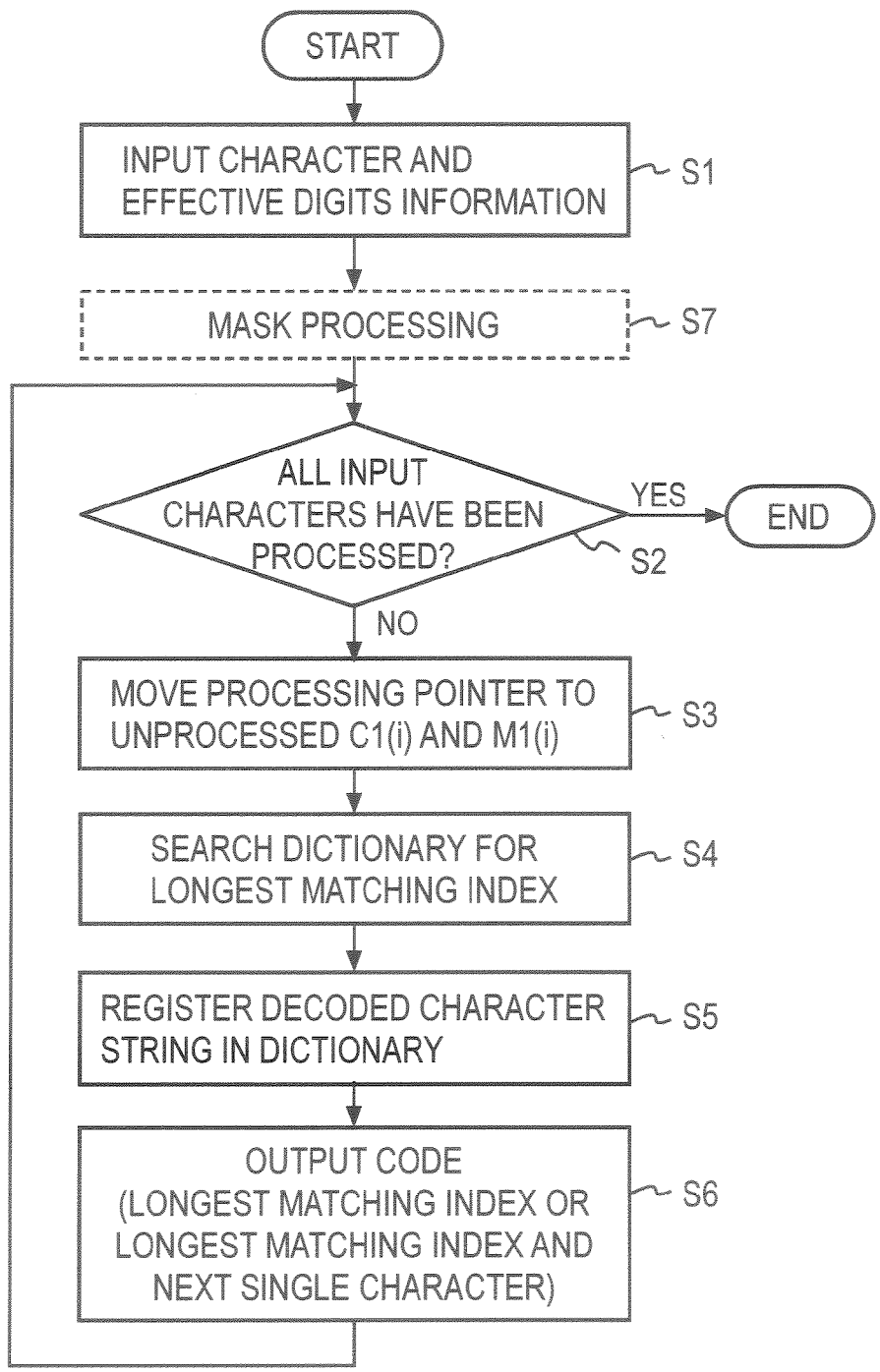
FIG. 6 is a flow diagram showing an instance of a processing procedure according to the first embodiment (embodiment A-3)

FIG. 6 shows an instance of the encoding process according to the first embodiment. At step S1, a character (unit of processing information) C1($i$+k) and its effective digits information M1($i$+k) are inputted to the match searching part 42 (typically, captured from a storage part inside or outside of an encoding device by executing a program). A controlling part 47 checks whether or not processing at steps S3 to S6 on all input characters has finished (step S2). If the processing has not finished, a processing pointer i is moved to the first unprocessed character C1($i$) in the input character and M1($i$) (step S3). The mask computing part 42a computes C1($i$+k)&M1($i$+k). The information matching determining part 42b searches a dictionary part 45 for a masked character string matching C1($i$+k)&M1($i$+k) [k: $0 \leq k$] by means of the mask computing part 48. Then, an index (the longest matching index) $j_{max}$ is obtained that corresponds to the longest matching character string D(j)(k)&M1($i$+k) [k: $0 \leq k \leq K_j - 1$] (step S4).

The above search is executed by, for example, a subroutine shown in FIG. 7 (described below). A character string is decoded that corresponds to the searched index $j_{max}$. A character string obtained by attaching the next mismatching character C1$_D$ or the following decoded first character C$_F$ to the decoded character string is masked with the corresponding mask data to generate a masked character string. Then, the masked character string is registered in the dictionary part 43 (step S5). In the mask LZW method, the code generating part 49 outputs the longest matching index $j_{max}$. In the mask LZ78 method, the code generating part 49 outputs the longest matching index $j_{max}$ and the next masked mismatching character C1($i$+K$_{max}$)&M1($i$+K$_{max}$). In the mask LZ77 method, the code generating part 49 outputs the longest matching index $j_{max}$, the length of the matching character K$_{max}$, and the next masked mismatching character C1($i$+K$_{max}$)&M1($i$+K$_{max}$) (step S6). Then, the processing returns to step S2. If processing on all characters has finished at step S2, the encoding processing on the input character string completes. Herein K$_{max}$ denotes the length (number of characters) of a character string registered at a $j_{max}$-th index in a dictionary, that is, the length of the matching character (the number of characters in the longest matching character string).

In the mask LZ77 and mask LZ78 methods, if the length of matching character is less than a pre-determined value at step S4, then a first character C1($i$) in the input character string masked with mask data M1($i$) is registered at the next index to the largest index at which the current character is registered at step S5. At step S6, the masked mismatching character C1($i$)&M1($i$) is outputted along with a code (referred to as a mismatching index) indicating that the length of the matching character is less than the pre-determined value.

In this instance, the mask processing of masking bits excluding the number of effective digits with the mask data M($i$) on the input character C1($i$) is performed at step S4 in the dictionary search, while the mask processing can be performed collectively on all input characters immediately after step 1 at which a character and effective digits information are inputted, as shown by the dashed line in FIG. 6 (step S7). Also, if it is known that C1($i$) and C1($i$)&M1($i$) are always equal, the processing of masking C1($i$) with M1($i$) can be omitted.

As appreciated from the above description, the movement of the pointer i at step S3 is in a range from i to i+k$_{max}$+1 if the matching length is not less than the pre-determined value. In the mask LZ77 and mask LZ78 methods, the range of the movement is i+1 if the matching length is not more than the pre-determined value. In the mask LZW method, the pre-determined length is the number of initially registered characters of an index in the dictionary part 43, but is not present if the matching length is less than the pre-determined value.

The controlling part 47 shown in FIG. 5, which retains a pointer i in a register 47a, controls the pointer captures C1($i$) and M1($i$) based on the pointer, and performs controlling to operate other parts.

Search Process

A specific instance of the dictionary search process at step S4 in FIG. 6 will be described with reference to FIG. 7. The information matching determining part 42b first initializes the dictionary index j to 0, the number (length) k$_{max}$ of the longest matching characters to 0, and the index $j_{max}$ having the length k$_{max}$ of the longest matching character to 0, respectively (step R1). Next, the information matching determining part 42b checks whether or not the current search index j is not less than the maximum value J of indices in the dictionary part 43 (step R2). If the index j is less than J, the information matching determining part 42b initializes the number k of matching characters to 0 (step R3). The information matching determining part 42b checks whether or not there is a match between a k-th character D(j)(k−1) in a character string registered at a j-th index in the dictionary part 43 and a k-th character C1($i$+k−1) in the input character string in terms of bits corresponding to their effective digits. In this instance, the information matching determining part 42b compares the k-th character D(j)(k−1) registered at the index j in the dictionary part 43 and the k-th character C1($i$+k−1) in the input character string using a mask data M1($i$+k−1). Specifically, the information matching determining part 42b first obtains bitwise logical AND of the character D(j)(k−1) in the dictionary and the mask data M1($i$+k−1) (step R10). Then, the information matching determining part 42b checks whether or not a k-th masked dictionary character D(j)(k−1)&M1($i$+k−1) in the index j is equal to a k-th masked input character C1($i$+k−1)&M1($i$+k−1) in the pointer i. (The processing for computing the masked input character C1($i$+k−1)&M1($i$+k−1) can be performed at step R10, or computed previously at step S7 indicated by the dashed line in FIG. 6.)

The information matching determining part 42b checks whether or not there is a match between the two masked characters (step R4). If there is a match, k is incremented by one and the processing returns to step R10 (step R5). If there is no match at step R4, it is checked whether or not the number k of matching characters is larger than the length k$_{max}$ of the current longest matching character (step R6). If k is larger, the information matching determining part 42b updates the longest index $j_{max}$ to the current index j and updates the length k$_{max}$ of the longest matching character to current k (step R7). If k is not larger at step R6 or the processing at step R7 has finished, the dictionary index j is incremented by one and the processing returns to step R2 (step R8). In this manner, the information matching determining part 42b compares a registered masked character string of each index j and an input masked character string in their masked states to serially check characters one by one until a mismatching character occurs. Then, if j is not less than the maximum value J of the indices at step R2, the information matching determining part 42b outputs the index $j_{max}$ having the number $k_{max}$ of the longest matching character (step R9). The dictionary search processing can be performed similarly for any of the mask LZ77, mask LZ78 and mask LZW methods.

If $k_{max}$ is not less than the predetermined value, codes outputted by a compression-coding device are, in the mask LZ77 and mask LZ78 methods, the longest matching index $j_{max}$, the length $k_{max}$ of matching character ($k_{max}$ is omitted in the mask LZ78 method), bitwise logical AND ($C1_D\&M1_D$) of the first mismatching character $C1(i+k_{max})$ (typically denoted by $C1_D$) in an input character string of the processing pointer i at that time and its mask data $M1(i+k_{max})$ (typically denoted by $M1_D$). If $k_{max}$ is less than the pre-determined value, codes outputted by the compression-coding device are an index indicating mismatch (for example, an index being 0 and the number of matching characters being 0 in the BACKGROUND ART, hereinafter referred to as a mismatching index), and logical AND ($C1(i)\&M1(i)$) (referred to as a masked mismatching character) of the first input character $C1(i)$ (referred to as a mismatching input character $C1_D$) of the processing pointer i and its mask data $M1(i)$.

As described above, the code generating part 49 corresponding to the code generating part 15 in FIG. 1A and the code generating part 33 in FIG. 2A is provided as shown in FIG. 5. In the mask LZW method, only $j_{max}$ is outputted. Since the processing shown in FIG. 7 is possible, for example, the information matching determining part 42b in FIG. 5 is provided with registers $42b_A$, $42b_B$, $42b_C$ and $42b_D$ storing said parameters j, $k_{max}$, $j_{max}$ and k, respectively, provided with a determining part $42b_E$ that performs the determination at steps R2, R4 and R6, and provided with a controlling part $42b_F$ that controls processing procedure. The controlling part $42b_F$ can be combined with the controlling part 47.

In the first embodiment, the comparison between a registered character (information) in the dictionary part 43 and an input character checks whether or not there are matches between characters and dictionary registered characters in their masked states. Accordingly, even if a masked portion contains a mismatching bit, it is determined that there is a match between the two characters, hence there is also a match between L character strings. This increases the frequency in outputting the longest matching index ($j_{max}$) in relation to past method and can improve the compression ratio of an output code. In this way, the processing of detecting the matching of a masked character, $C1(i+k)\&M1(i+k)=D(j)(k)\&M1(i+k)$, is same in all method. The mask LZW method outputs the index $j_{max}$ with the largest number of matching characters as a code. If the number of matching characters is larger than the pre-determined number, the mask LZ78 method outputs $j_{max}$ and $C1_D\&M1_D$ as a code. The mask LZ77 method outputs $j_{max}$, $k_{max}$ and $C1_D\&M1_D$ as a code. If the umber of matching characters is less than the pre-determined number, the mask LZ77 and mask LZ78 methods output an index indicating the number of matching characters is less than the pre-determined number and $C1(i)\&M1(i)$ as a code.

The LZ77 method decodes an output code in the decoding part 45 and registers it to the dictionary part 43. If the number of matching characters is not less than the predetermined one, then in the dictionary part 43, a character string obtained by attaching a masked mismatching character $C1(i+k_{max})\&M1(i+k_{max})$ to a string of characters $D(j_{max})(0)$ to $D(j_{max})(k_{max}-1)$ corresponding to the longest matching index $j_{max}$ outputted as a code is registered at a storage position of the newest character string in a slide dictionary. If the number of matching characters is less than the pre-determined number, then in the dictionary part 43, a masked character $C1(i)\&M1(i)$ is registered at a storage position of the newest character string in the slide dictionary.

In the LZ78 and LZW methods, a character string obtained by attaching a masked mismatching character $C1(i+k_{max})\&M1(i+k_{max})$ to a string of characters $D(j_{max})(0)$ to $D(j_{max})(k_{max}-1)$ corresponding to the longest matching index $j_{max}$ outputted as a code is registered at a position of an index J in the dictionary part 43. After the registration, J is incremented by one.

Decoding Configuration 1

Figure 8:
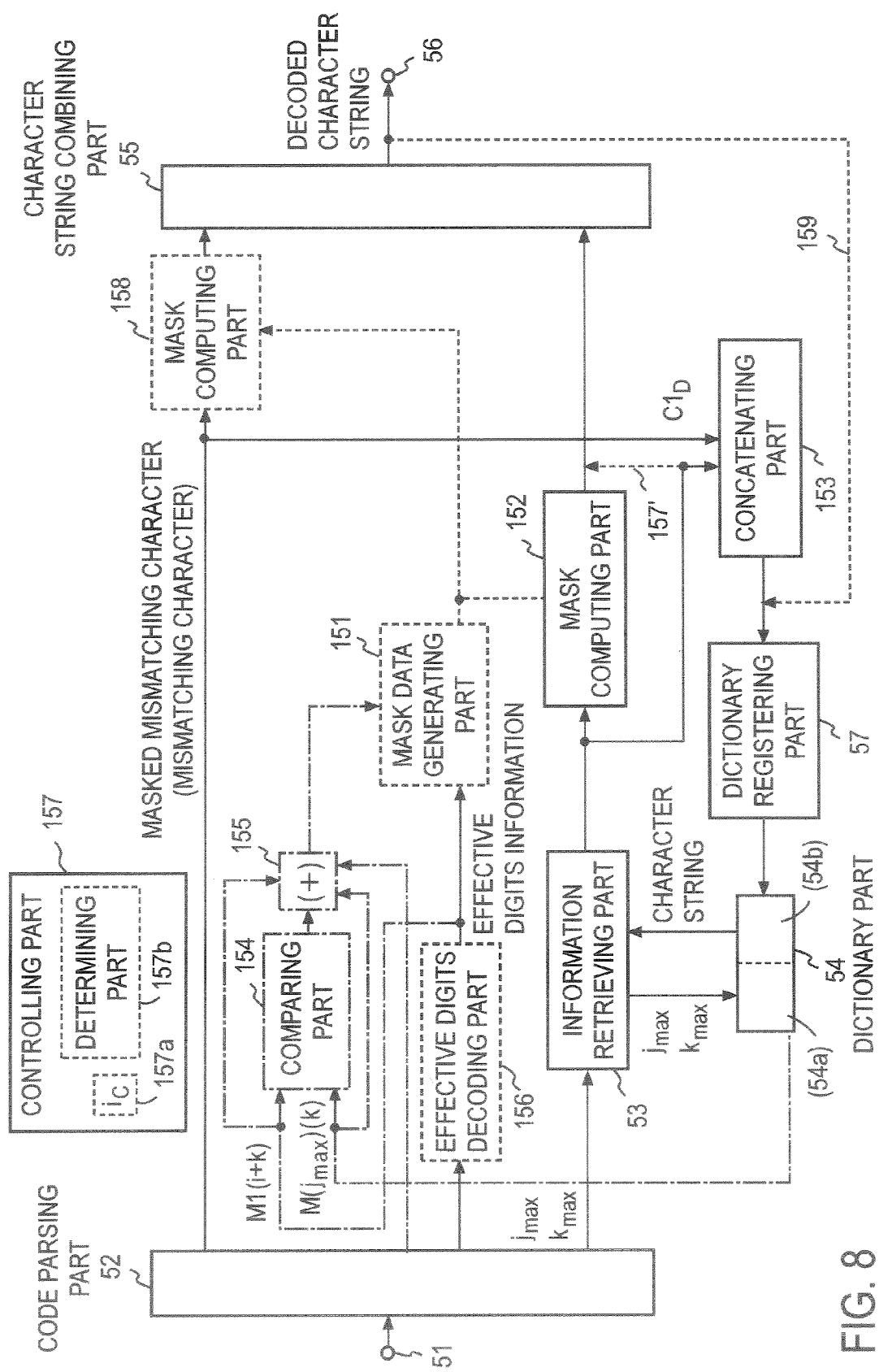
FIG. 8 is a block diagram showing an instance of function configuration of a decoding device using the mask LZ77 and mask LZ78 according to the first embodiment (embodiment A-3)

A decoding device according to the first embodiment will be described. FIG. 8 illustrates a decoding device applied for the mask LZ77 and mask LZ78 methods. This configuration can be used as the decoding part 45 in the encoding device shown in FIG. 5.

A code parsing part 52 separates an input code from an input terminal 51 into the longest matching index $j_{max}$, the length $k_{max}$ of matching characters (omitted in the mask LZ78 method) and a masked mismatching character ($C1_D\&M1_D$). The index $j_{max}$ and the length $k_{max}$ of matching character are inputted to an information retrieving part 53. In the mask LZ77 method, the information retrieving part 53 acquires a character string $D(j_{max})(k)$ [k: $0 \leq k < k_{max}$] by the length $k_{max}$ of matching character from a position of the index $j_{max}$ in a dictionary part 54. In the mask LZ78 method, the information retrieving part 53 acquires a string of $k_{max}$ characters, $D(j_{max})(k)$ [k: $0 \leq k < k_{max}$], registered at the index $j_{max}$ in the dictionary part 54. Then, the information retrieving part 53 passes the acquired string to a mask computing part 152 and a concatenating part 153. The mask computing part 152 performs a logical AND operation of a k-th character in a character string obtained by decoding the index $j_{max}$ and effective digits information $M1(i+k-1)$ to generate a character string $(D(j_{max})(k)\&M1(i+k))$ [k: $0 \leq k < k_{max}$] and inputs the string to a character string combining part 55. The character string combining part 55 concatenates a masked mismatching character ($C1_D\&M1_D$) from the code parsing part 52 to the end of the inputted character string to output as a decoded character string to an output terminal 56. The concatenating part 153 concatenates the masked mismatching character ($C1_D\&M1_D$) from the code parsing part 52 to the character string $D(j_{max})(k)$ [k: $0 \leq k < k_{max}$] passed from the information retrieving part 53 to pass to a dictionary registering part 57. The dictionary registering part 57 registers a character string inputted by the concatenating part 153 in the dictionary part 54 (a character string $D(j_{max})(k)$ [k: $0 \leq k < k_{max}$] to be registered in a dictionary is not masked). If the code parsing part 52 detects a code (a mismatching index) indicating that the length of a matching character is less than a pre-determined value, then the inputted masked mismatching character $C1_D\&M1_D$ is outputted as a decoded character to the output terminal 56 and registered in the dictionary part 54 using the dictionary registering part 57. This registration processing is the same as that by the dictionary registering part 27 in FIG. 1B. If an effective digits code is inputted, it is used to decode effective digits information group in an effective digits decoding part 156. Then, a character $D(j_{max})(k)$ and a corresponding effective digits information $M1(i+k)$ are inputted serially to a mask data generating part 151 from the effective digits information group.

Decoding Process 1

Figure 9:
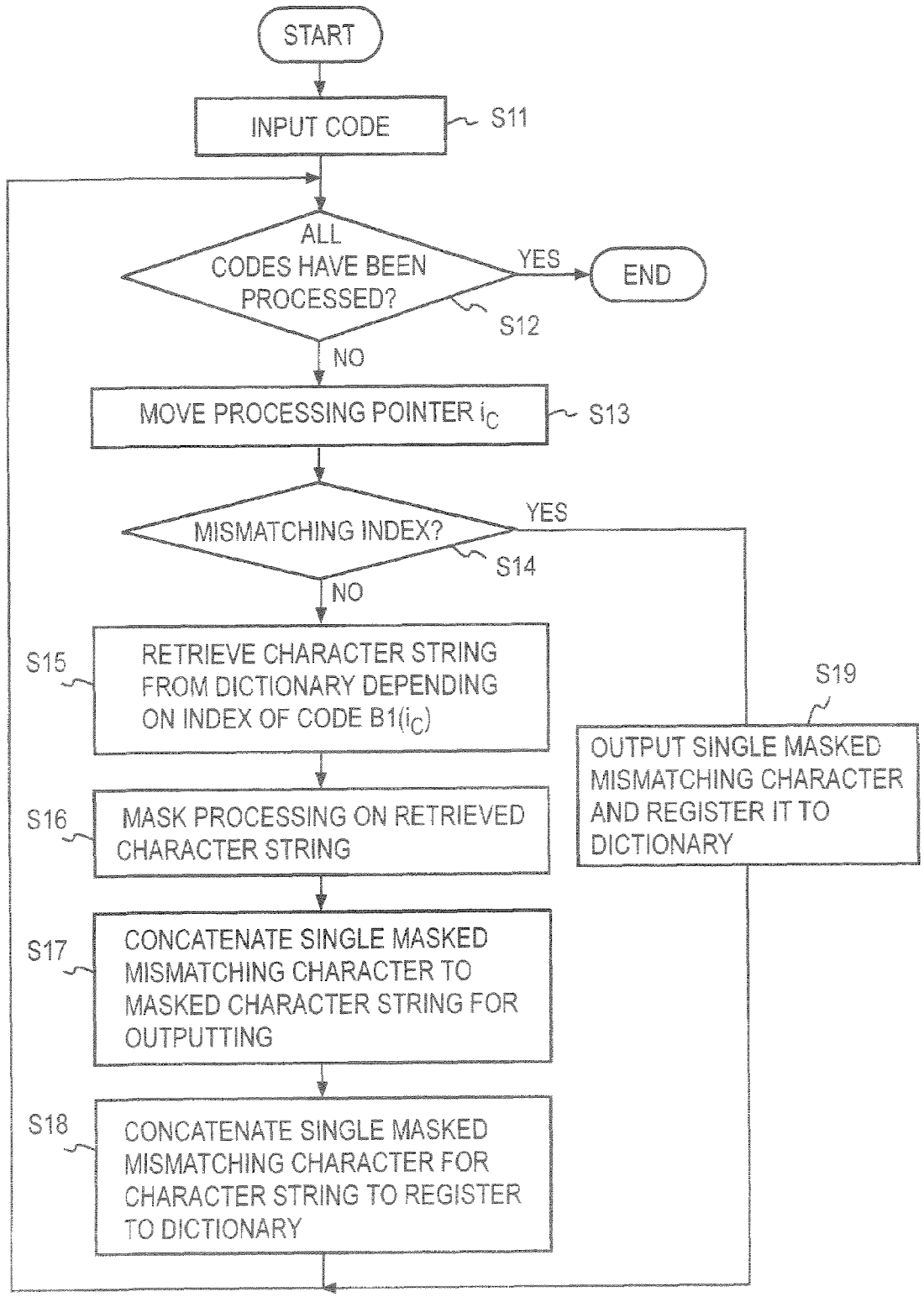
FIG. 9 is a flow diagram showing an instance of a processing procedure of a decoding device using the mask LZ77 and mask LZ78 according to the first embodiment (embodiment A-3)

An instance of a process by the function configuration shown in FIG. 8 will be described with reference to FIG. 9. The code parsing part 52 receives a code (step S11). A controlling part 157 checks whether or not the processing at steps S13 to S19 has been completed on all codes (step S12). If the processing has not been completed, a processing pointer $i_C$ is moved (step S13). The controlling part 157 determines whether or not an index in an unprocessed input code $B1(i_C)$ pointed by the pointer $i_C$ is a mismatching index (step S14). If the index is not a mismatching index, the information retrieving part 53 retrieves a character string registered at an index $j_{max}$ in the dictionary part 54 indicated by the index $j_{max}$ (step S15). In the mask LZ77 method, the information retrieving part 53 retrieves the character string by the length $k_{max}$ of matching character in the unprocessed input code $B1(i_C)$ from the position indicated by the index. In the mask LZ78 method, the information retrieving part 53 retrieves a character string of $k_{max}$ characters registered at the position corresponding to the index.

A logical AND operation of the retrieved character string and effective digits information $M1(i_C+k-1)$ is performed to generate a character string $(D(j_{max})(k)\&M1(i+k))$ [k: $0 \leq k < k_{max}$] (step S16). This masked character string is concatenated with a masked mismatching character and outputted as a decoded character string (step S17).

Further, the character string (an unmasked character string) $D(j_{max})(k)$ [k: $0 \leq k < k_{max}$] retrieved at step S15 is concatenated with a masked mismatching character and registered in the dictionary part 54, then the processing returns to step S12 (step S18).

If it is determined to be an mismatching index at step S14, a masked mismatching character separated by the code parsing part 52 is outputted as a decoded character. Further, the masked mismatching character is registered in the dictionary part 54 and the processing returns to step S12 (step S19). If all codes have been processed at step S12, the processing on the current input code string finishes. The controlling part 157 in FIG. 8, which serially operates other parts, comprises a register 157a for storing a processing parameter $i_C$ and a determining part 157b for performing the determination at steps S12 and S19.

Decoding Configuration 2

Figure 10:
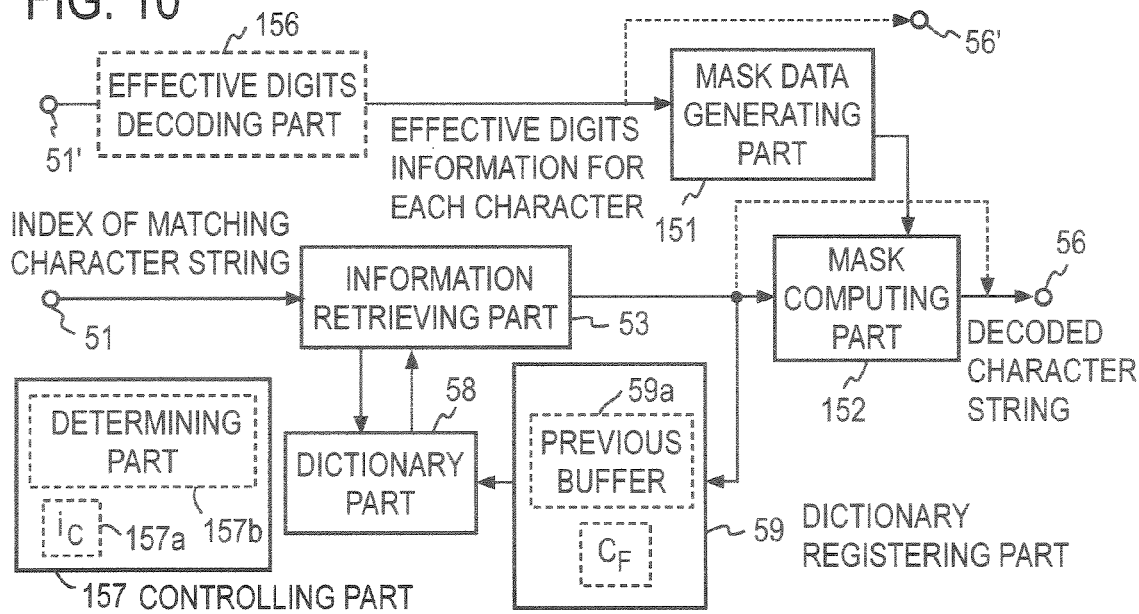
FIG. 10 is a block diagram showing an instance of function configuration of a decoding device using the mask LZW according to the first embodiment (embodiment A-3)

FIG. 10 shows an instance of the decoding device for the mask LZW method according to the first embodiment. In this case, a string of characters (units of processing information) inputted to the input terminal 51 is an index $j_{max}$ only. The information retrieving part 53 acquires a character string $D(j_{max})(k)$ [k: $0 \leq k < k_{max}$] corresponding to the index $j_{max}$ registered in a dictionary part 58. The mask data generating part 151 generates effective digits information $M1(i+k)$ corresponding to each character $D(j_{max})(k)$. The mask computing part 152 performs a logical operation on the effective digits information $M1(i+k)$ and its corresponding character $D(j_{max})(k)$ to generate a character string $(D(j_{max})(k)\&M1(i+k))$ [k: $0 \leq k < k_{max}$], and outputs the string as a decoded character string to the output terminal 56. If effective digits information is inputted as an effective digits code to a terminal 51', the effective digits decoding part 156 performs the decoding to obtain effective digits information, as shown by a dashed line in the drawing.

The character string retrieved by the information retrieving part 53 is also inputted to a dictionary registering part 59. When a new character string is decoded and outputted, then the dictionary registering part 59 concatenates a first character $C_F = D(j_{max})(0)$ in a new decoded (acquired from a dictionary part) character string to a character string $D(j_{max}')(k)$ [k: $0 \leq k < k_{max}'$] acquired from a dictionary part immediately before being temporarily retained in a previous buffer 59a and registers the concatenation result to the dictionary part 58. Then, the dictionary registering part 59 retains the decoded character string $D(j_{max})(k)$ [k: $0 \leq k < k_{max}$] to the previous buffer 59a temporarily.

Decoding Process 2

Figure 11:
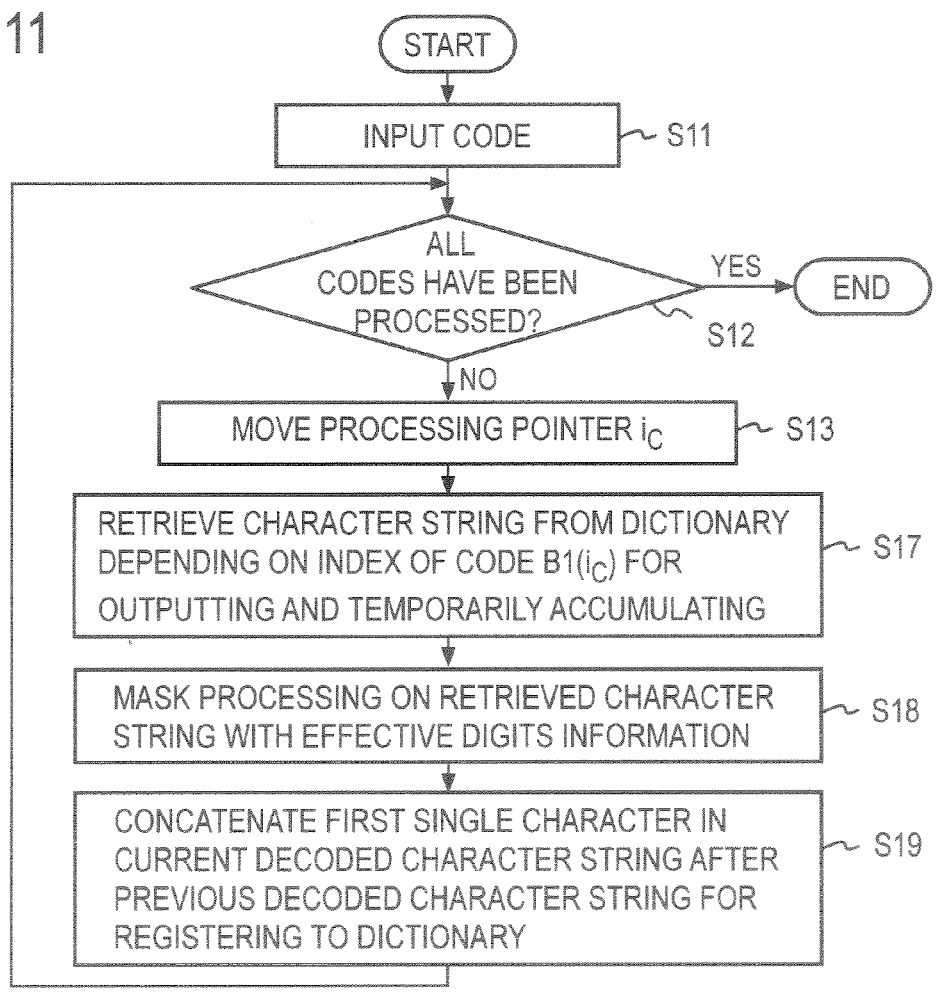
FIG. 11 is a flow diagram showing an instance of a processing procedure of a decoding device using the mask LZW according to the first embodiment (embodiment A-3)

FIG. 11 shows an instance of a decoding process for the mask LZW method. First, the information retrieving part 53 captures a code input (step S11). A controlling part 157 checks whether or not the processing at steps S13 to S19 has been completed on all codes (step S12). If the processing has not been completed, a processing pointer $i_C$ is moved (step S13). The steps S11 to S13 are same as those in FIG. 9. Next, in the mask LZW method, the information retrieving part 53 acquires a character string $D(j_{max})(k)$ [k: $0 \leq k < k_{max}$] corresponding to an index $j_{max}$ of a code $B1(i_C)$ from the dictionary part 58. The dictionary registering part 59 retains temporarily the character string $D(j_{max})(k)$ [k: $0 \leq k < k_{max}$] in the previous buffer 59a (step S17). The logical AND operation of effective digits information $M1(i+k)$ corresponding to each character $D(j_{max})(k)$ and $D(j_{max})(k)$ generates a character string $(D(j_{max})(k)\&M1(i+k))$ [k: $0 \leq k < k_{max}$], and the output terminal 56 outputs the string as a decoded character string (step S18).

When a new character string is decoded and outputted, then the dictionary registering part 59 concatenates a first character $C_F = D(j_{max})(0)$ in a new decoded (acquired from a dictionary part) character string to a character string $D(j_{max}')(k)$ [k: $0 \leq k < k_{max}'$] acquired from a dictionary part immediately before being temporarily retained in a previous buffer 59a and registers the concatenation result to the dictionary part 58. Then, the dictionary registering part 59 retains the decoded character string $D(j_{max})(k)$ [k: $0 \leq k < k_{max}$] to the previous buffer 59a temporarily and the processing returns to step S12 (step S19).

As appreciated from the above, the decoding device according to the first embodiment differs in configuration of a dictionary part, a part that performs the mask computing and a content registered in a dictionary from a decoding device for the conventional LZ77, LZ78 and LZW methods.

[Variation of the First Embodiment]

The following will describe various types of variations of the first embodiment.

The specific embodiment used in the description of the above mentioned first embodiment is hereinafter referred to as the embodiment A-3. According to the embodiment A-3, in the mask LZ77 and mask LZ78 methods, determination of a match between character strings is performed in a state in which an input character string and a character string registered in a dictionary are both masked with $M1(i+k)$ as shown in FIG. 5. The mask computing part 42a obtains the information in which a masked mismatching character $C1_D \& M1_D$ obtained by masking a mismatching character $C1_D$ with its mask data $M1_D$, i.e., an ineffective digits (bits) portion in the mismatching character is a fixed value there are "0s" in the above instance, but can be "1s"). Then, the mask computing part 42a outputs a dictionary index $j_{max}$ indicating the longest matching character string and the masked mismatching character $C1_D \& M1_D$ as a code. The decoding part 45 acquires a character string $D(j_{max})(k)$ [k: $0 \leq k < k_{max}$] corresponding to a dictionary index $j_{max}$ in the dictionary part 43. The dictionary registering part 46 registers a character string concatenated with the masked mismatching character $C1_D \& M1_D$ in the dictionary part 43.

In a dictionary search the dictionary index j providing the longest $K_j$ satisfying $C1(i+k)\&M1(i+k) = D(j)(k)\&M1(i+k)$ in all [k: $0 \leq k < K_j$] is searched. In this search, the content registered in D(j)(k) is a character string inputted in the past by $x_j$ characters. As such, each character constituting the character string can be represented as D(j)(k)=C1($i-x_j+k$)&M1($i-x_j+k$) as above mentioned.

That is, the dictionary search corresponds to the search of a dictionary index j providing the longest $K_j$ which satisfies C1($i+k$)&M1($i+k$)=C1($i-x_j+k$)&M1($i-x_j+k$)&M1($i+k$) in all [k: $0 \leq k < K_j$].

In addition, a decoding side outputs a character string obtained by concatenating a masked mismatching character C1$_D$&M1$_D$ to a character string D($j_{max}$)(k)&M1($i+k$) [k: $0 \leq k < k_{max}$].

The following describes variations of the embodiment A-3 mainly in terms of differences from the embodiment A-3.

Embodiment A-1

According to an embodiment A-1, the determination of a match between character strings is performed in a state in which an input character string and a character string registered in a dictionary are both masked with M1($i+k$). Then, the longest matching dictionary index $j_{max}$ and the information of an unmasked mismatching character C1$_D$ itself are outputted as a code. Accordingly, a character C1($i+k$) is also inputted to the code generating part 49, as shown by a dashed line 141 in FIG. 5. Then, the code generating part 49 outputs the character C1($i+k$) as a mismatching character C1$_D$ (outputs a masked mismatching character C1$_D$&M1$_D$ according to the embodiment A-3).

The decoding part 45 acquires a character string D($j_{max}$)(k) [k: $0 \leq k < k_{max}$] corresponding to the dictionary index $j_{max}$ from the dictionary part 43. The dictionary registering part 46 registers a character string concatenated with the mismatching character C1$_D$ itself to the dictionary part 43. As such, an unmasked character string is registered in the dictionary part 43.

That is, in dictionary search, the dictionary index j providing the longest $K_j$ satisfying C1($i+k$)&M1($i+k$)=D(j)(k)&M1($i+k$) and [k: $0 \leq k < K_j$] is sought. In this search, the content registered in D(j)(k) is a character string corresponding to the character string inputted in the past by $x_j$ characters. Each character in that character string can be represented as D(j)(k)=C1($i-x_j+k$).

In other words, the dictionary search corresponds to the search of a dictionary index j providing the longest $K_j$ which satisfies C1($i+k$)&M1($i+k$)=C1($i-x_j+k$)&M1($i+k$) and [k: $0 \leq k < K_j$].

In addition, a decoding side outputs a character string concatenated with a mismatching character C1$_D$ acquired from the code parsing part 52 as shown in the parentheses in FIG. 8 to a character string D($j_{max}$)(k) [k: $0 \leq k < k_{max}$] retrieved from the dictionary part 54, as shown by a dashed line 157' in FIG. 8 instead of an output by the mask computing part 152.

According to the embodiment A-1, a character registered in the dictionary part 43 is not masked. However an input character string and a character string recorded in the dictionary (a dictionary character string) are both compared in their masked states, then a dictionary character string of the longest matching length is selected. For this reason, a plurality of longest matching indices $j_{max}$ can be obtained. In that case, a dictionary character string with the least distance (for example, in the case of a numerical value, difference between two numerical values) from the input character string is selected among the dictionary character strings containing the identical $j_{max}$. This means that a dictionary character string is selected which is most similar to the input character string.

Figure 7:
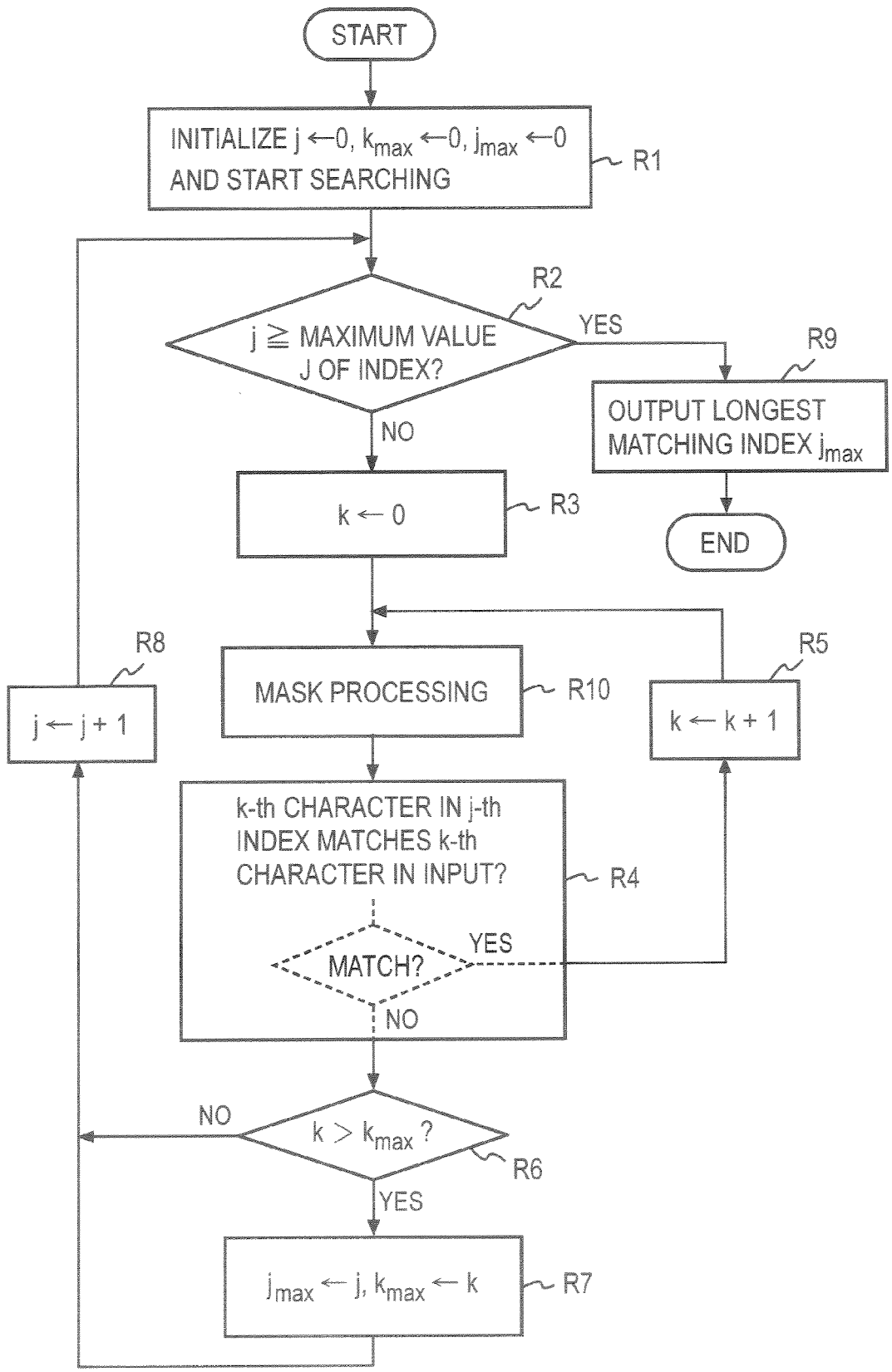
FIG. 7 is a flow diagram showing an instance of a specific processing procedure at step S4 in FIG. 6.
Figure 12A:
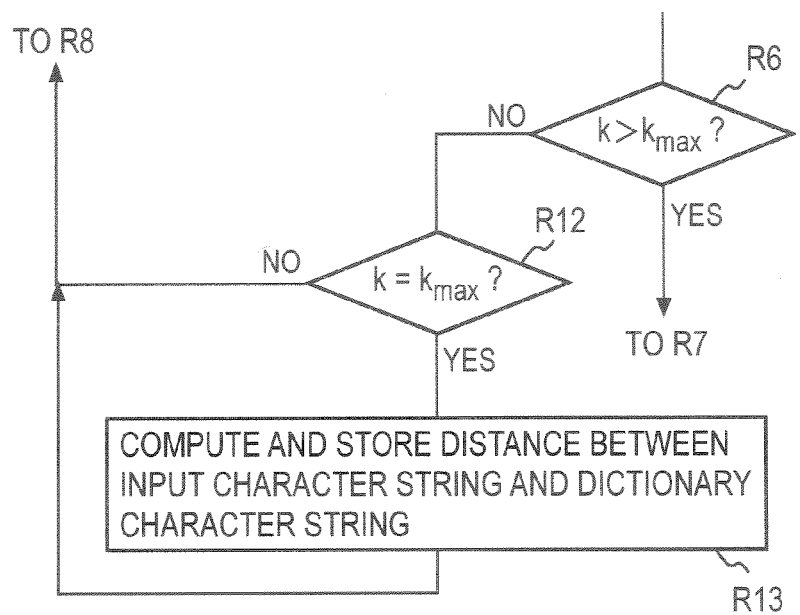
FIG. 12A is a flow diagram illustrating part of a processing procedure according to an embodiment A-1.
Figure 12B:
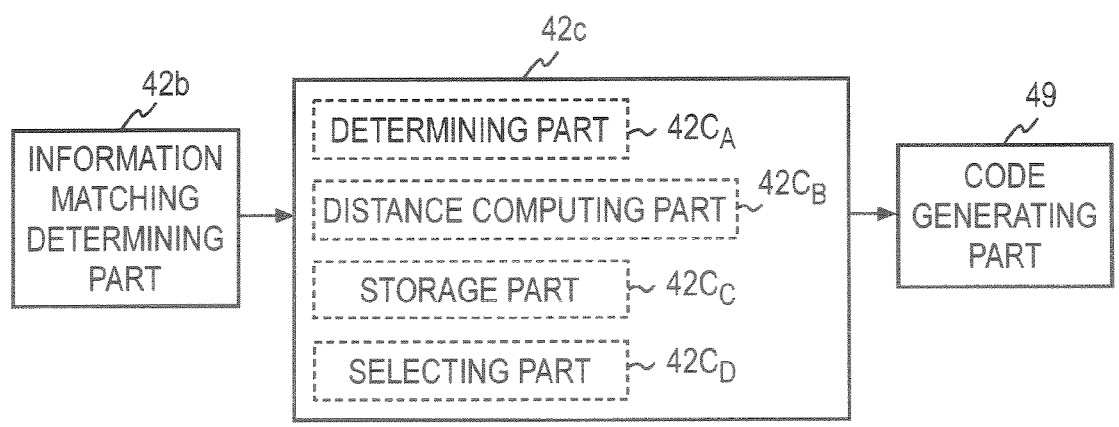
FIG. 12B is a block diagram showing an instance of unction configuration of an evaluating part 42c according to the embodiment A-1.

For example, if it is determined that k is not more than $k_{max}$ at step R6 in FIG. 7, it is checked whether or not k equals $k_{max}$, as shown in FIG. 12A (step R12). If k equals $k_{max}$, the distance between the current input character string C1($i+n$) [n: $0 \leq n \leq k-1$] and a dictionary character string D(j)(n) [n: $0 \leq n \leq k-1$] is computed. Then, the distance associated with $j_{max}$ is stored in a storage part, and the processing moves to step R8 (step R13). If k does not equal $k_{max}$ at step R12, the processing moves to step R8. For the function configuration, an evaluating part 42c is provided between the information matching determining part 42b and the code generating part 49 in FIG. 5, for example as shown in FIG. 12B. The evaluating part 42c is provided with a determining part 42C$_A$ that executes step R12, a distance computing part 42C$_B$ that executes step R13, a storage part 42C$_C$ that stores the association between each $j_{max}$ and the distance, and a selecting part 42C$_D$ that selects one of a plurality of $j_{max}$ in the storage part 42C$_C$ having the shortest distance. In the above processing, the updating of $j_{max}$ at step R7 in FIG. 7 is also performed on $j_{max}$ in the storage part 42C$_C$.

The above description of the embodiment A-1 is for the mask LZ77 or mask LZ78 method. In the mask LZW method, the mask computing part 152 in FIG. 10 and the mask processing at step S18 in FIG. 11 are unnecessary.

Embodiment A-1'

According to the embodiment A-1, the decoding side outputs unmasked D($j_{max}$)(k) [k: $0 \leq k < k_{max}$] and C1$_D$. According to an embodiment A-1', a mask computing part 158 (indicated by a dashed line in FIG. 8) computes a masked mismatching character C1$_D$&M1$_D$ obtained by masking a mismatching character C1$_D$ (indicated in parentheses in FIG. 8) from the code parsing part 52 with mask data M1$_D$. The character string combining part 55 outputs a character string obtained by concatenating a masked mismatching character C1$_D$&M1$_D$ from the mask computing part 158 to a masked character string D($j_{max}$)(k)&M1($i+k$) [k: $0 \leq k < k_{max}$] from the mask computing part 152.

The processing in the mask LZW method is similar to the processing according to the embodiment A-3 in reference to FIG. 10 and FIG. 11.

Embodiment A-2

The difference from the embodiment A-3 is that a character D(j)(k) acquired from the dictionary part 43 is inputted directly to the information matching determining part 42b, as indicated by the dashed line 142 in FIG. 5. That is, the mask computing part 48 is not used. A character string registered in the dictionary part 43 is similarly to the embodiment A-3, a masked string. Accordingly, the information matching determining part 42b determines that there is a match between the two characters if C1($i+k$)&M1($i+k$)=D(j)(k) is satisfied.

On the decoding side, a masked character string retrieved by the information retrieving part 53 is inputted to the character string combining part 55 not through the mask computing part 152, as indicated by a dashed line 157' in FIG. 8.

Embodiment A-4

An embodiment A-4 differs from the embodiment A-3 in that the search is performed for a matching index based on one of an input character C1($i$+k) and a dictionary character D(j)(k) having a less number of effective digits.

Figure 13A:
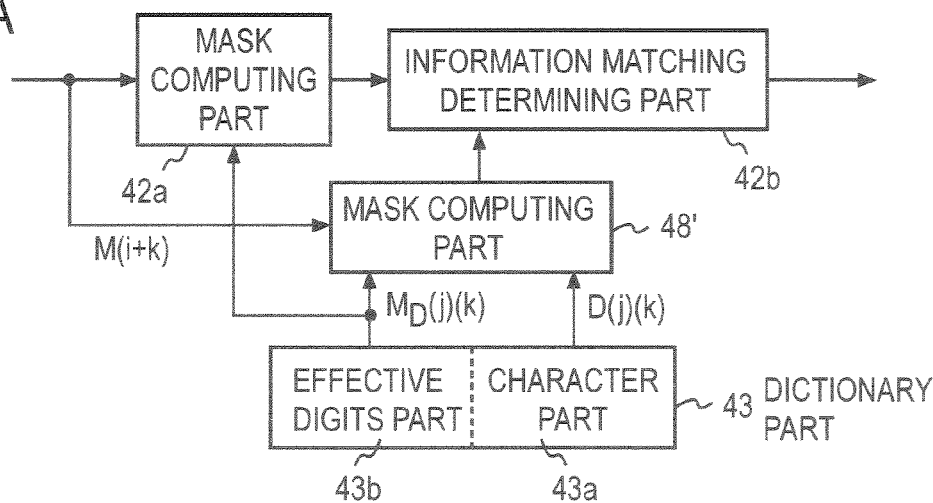
FIG. 13A is a block diagram showing instances of a dictionary part 43 and a mask computing part 48' in the mask LZW according to an embodiment A-4.

The dictionary part 43 has, as shown in FIG. 13A, a character part 43$a$ that stores an unmasked character string D(j)(k) [k: $0 \leq k < K_j$], and an effective digits part 43$b$ that stores effective digits information (for example, mask data $M_D$(j)(k) [k: $0 \leq k < K_j$]) of each character in each character string. The mask computing part 48' receives input of mask data M1($i$+k) for an input character C1($i$+k), and mask data $M_D$(j)(k) corresponding to a dictionary character D(j)(k) from the dictionary part 43. The mask computing part 48' computes mask data M' used for the match determination by bitwise logical AND of the inputted mask data. That is, the mask computing part 48' computes M' (k)=M1($i$+k)&$M_D$(j)(k). The mask computing part 42$a$ computes a mask input character C1($i$+k)&M'(k) while the mask computing part 48' computes D(j)(k)&M'(k). Then, C1($i$+k)&M'(j)(k) and D(i)&M'(k) are inputted to the information matching determining part 42$b$.

Similarly, as output of code, a dictionary index $j_{max}$ for the longest matching character string (as well as the matching length $k_{max}$ in the mask LZ77 method) is outputted. However a mismatching character $C1_D$ is an unmasked character, so that the mismatching character $C1_D$ itself is outputted.

Figure 13B:
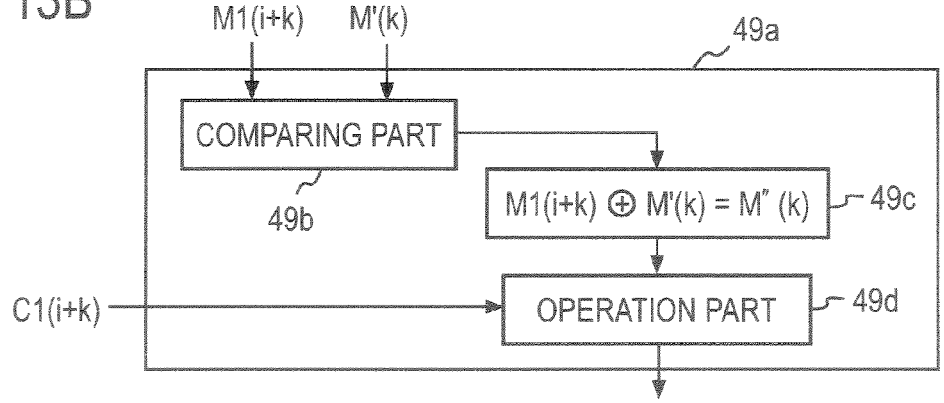
FIG. 13B is a block diagram showing an instance of specific function configuration of a section of a code generating part 49 in the mask LZW according to the embodiment A-4.

If the length of effective digits in an input character C1($i$+k) is more than the length of effective digits in a dictionary character D(j)(k), the next data needs to be outputted as well. For example, the processing part 49$a$ is provided in the code generating part 49 in FIG. 5. FIG. 13B illustrates function configuration of the processing part 49$a$. A comparing part 49$b$ compares each bit constituting M1($i$+k) and M'(k) by considering mask data as a binary numerical value. If the comparing part 49$b$ encounters a bit with which M1($i$+k) equals 1 and M'(k) equals 0, information corresponding to the bit in the input character C1($i$+k) needs to be outputted separately. Consequently, an operation part 49$c$ performs a bitwise exclusive OR operation of M1($i$+k) and M'(k). If a result of the operation M"(k)>0, the operation part 49$d$ acquires a bit in the input character C1($i$+k) corresponding to the bit with which M"(k) equals 1 and outputs the result.

In this way, bits of the effective digits (bits) in C1($i$+k) but corresponding digits (bits) in D(j)(k) are not effective digits are outputted along with $j_{max}$ and a mismatching character $C1_D$.

In the mask LZW method, the processing corresponding to that in FIG. 13B is performed when a code is outputted, but no mismatching character $C1_D$ is outputted.

A decoding device complements each k in a character string D($j_{max}$)(k) [k: $0 \leq k < k_j$] acquired from the information retrieving part 53 with bits using M1($i$+k) and $M_D$($j_{max}$)(k), and then calculates bits to be outputted, as indicated in parentheses and a dashed-dotted line in FIG. 8. That is, a comparing part 154 obtains k that satisfies M1($i$+k)^(M1($i$+k)&$M_D$($j_{max}$)(k))>0. Then, information corresponding to bits being 1s by M1($i$+k)^(M1($i$+k)&$M_D$($j_{max}$)(k)) for the obtained k is acquired from the code parsing part 52. An operation part 155 replaces the bits being is by M1($i$+k)^(M1($i$+k)&$M_D$($j_{max}$)(k)) with the bit information acquired from the code parsing part 52. The mask information thus obtained is inputted as M1'(i+k) to the mask data generating part 151. Then, the mask computing part 152 decodes a character string to be outputted by the mask processing. That is, (D($j_{max}$)(k)&$M_D$($j_{max}$)(k)& M1($i$+k))|M1'($i$+k) is computed. In this description, A^B represents bitwise exclusive OR of A and B, and A|B represents logical OR of A and B.

In addition, the character string obtained by the above processing will be combined with an unmasked mismatching character $C1_D$ in the character string combining part 55.

Targets of registration in the dictionary part are a character string D($j_{max}$)(k) [k: $0 \leq k < k_j$] retrieved in the information retrieving part 53 and its effective digits information M($j_{max}$)(k) [k: $0 \leq k < k_j$] as well as a mismatching character $C1_D$ and its effective digits information $M1_D$.

Embodiment A-4'

In an embodiment A-4', a mismatching character $C1_D$ is masked with its mask data $M1_D$ and then outputted. Other details are similar to the embodiment A-4.

Embodiment A-5

For an embodiment A-5, only differences from the embodiment A-4 will be described. Instead of a character D(j)(k), its masked character D(j)(k)&$M_D$(j)(k) is registered in the dictionary part 43. A mismatching character $C1_D$ in encoded output is outputted as a masked character $C1_D$&$M1_D$. A decoding device is the same as that of the embodiment A-4.

Figure 14A:
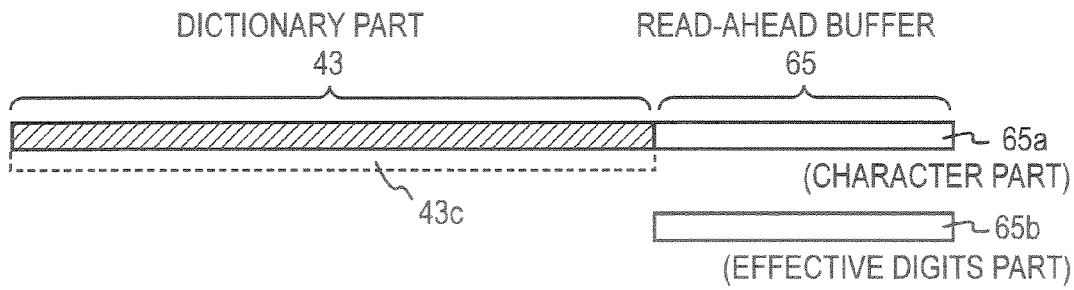
FIG. 14A is a diagram showing an instance of relation between the dictionary part 43, read-ahead buffer 65 and effective digits information buffer in the mask LZ77 according to the embodiments A-1 to A-3.

In the embodiments A-1 to A-3, taking the mask LZ77 method for example, the last inputted character string of pre-determined amount has been registered in the dictionary part 43, as shown in FIG. 14A. In FIG. 14A, the dictionary part 43 has a read-ahead buffer 65 linking to a constituting slide buffer. A character string having the first character to be encoded next is stored in a character part 65$a$ in the buffer 65. The effective digits information (in this instance, mask data M1($i$+k)) of each character C1($i$+k) in the read-ahead buffer 65 is stored in an effective digits part 65$b$.

Figure 14B:
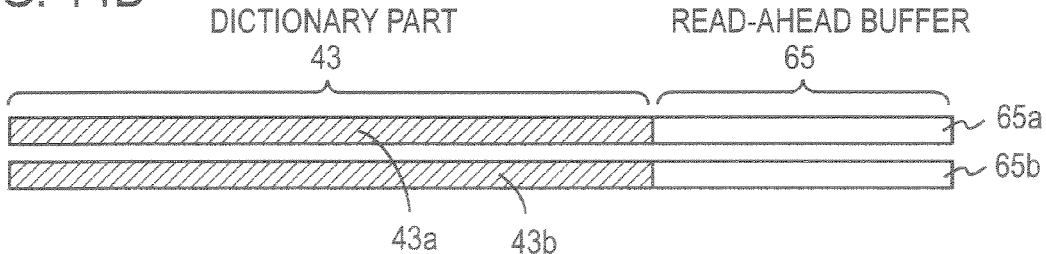
FIG. 14B is a diagram showing an instance of relation between the dictionary part, a read-ahead buffer and an effective digits information buffer in the mask LZ77 according to the embodiments A-4 and A-5.

In the embodiments A-4 to A-5, the dictionary part 43 has the character part 43$a$ in which the same content is registered as the dictionary part 43 in FIG. 14A, and an effective digits part 43$b$ that stores effective digits information (in this instance, mask data $M_D$(j)(k)) of each character D(j)(k) registered in the character part 43$a$, as shown in FIG. 14B. The read-ahead buffer 65 is similar as in the embodiments A-1 to A-3. In the mask LZ78 and mask LZW methods, the dictionary part 43 is not a slide buffer but a fixed buffer.

In order of the embodiments A-1, A-1', A-2, A-3, A-4, A-4' and A-5, the match with a character registered in a dictionary can be likely obtained. As such, the same index $j_{max}$ is outputted more often, improving the compression efficiency while the index $j_{max}$ is searched for more often. In the embodiments A-4, A-4' and A-5, if M1($i$+k)^(M1($i$+k)&$M_D$(j)(k))>0, then effective digits in an input character are significant, but a dictionary character also outputs bits (string) that are not effective digits, decreasing the compression efficiency. As such, any of the embodiments can be selected by considering the number (time) of search processing or the compression efficiency depending on the property of a signal.

Second Embodiment

In a second embodiment, the method and device described in the first embodiment are applied to compression-coding and decoding of a sample string of a digital value such as a signal of audio such as voice or music, an image signal, various types of measured signals or a linear prediction error signal. In the first embodiment, it is assumed that each input character (information) is of a fixed bit length and its effective digits information is known. The description of this embodiment will be mainly for processing of converting a sample string of a digital value such as an audio signal into a unit of a processing information string composed of characters (information) of pre-determined number of bits so as to apply the first embodiment.

First, the reason for performing the above mentioned conversion will be described. The bit length of each sample in the above mentioned sample string differs from those of other samples, so that it right not be a character string (unit processing information string) of characters (information) of a fixed bit length. As such, the following conversion method can be contemplated.

The bits constituting each sample are resolved in a bitwise manner and converted into a bit string in which the resolved bits are arranged in order. Then, the bits are pulled out on the basis of the length of a character (for example, four bits) being a processing unit. The sequence of pulled out character strings of a character length is inputted to an information compression-coding device.

A sample string of a waveform signal such as an audio signal essentially has the property that correlation (redundancy) between neighboring samples or correlation (redundancy) in a sample is large. However, in the above mentioned conversional methods, the property of an original sample string is often lost.

According to the present invention, in order to effectively use correlation (redundancy) among and/or within samples for the compression of an information string the sample strings are converted into unit processing information strings to retain the correlation (redundancy). First, a specific instance is shown in which sample strings are converted into unit processing information (characters).

First Embodiment of Conversion of Unit Processing Information (Variable-Length Sample)

Figure 15A:
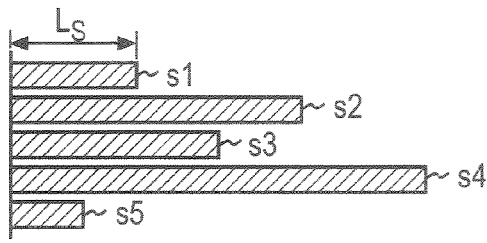
FIG. 15A is a diagram showing an instance of input sample strings in the case of each variable-length sample having different number of bits.

FIG. 15A shows an instance of input sample strings of variable lengths, i.e., different word lengths (numbers of bits) for different samples. If the word length (number of bits) $L_S$ of each sample in input sample strings (s1, s2, ... ) is a variable length, the number of bits in unit processing information needs to be definite (a fixed character size), hence the mask LZ coding method according to the first embodiment cannot be applied. Thus, for example the word length (number of bits) $N_C$ of the unit processing information in the mask LZ method is set to be not less than the maximum word length (number of bits) $L_{S\ max}$ of an input sample to be the unit processing information.

Figure 15B:
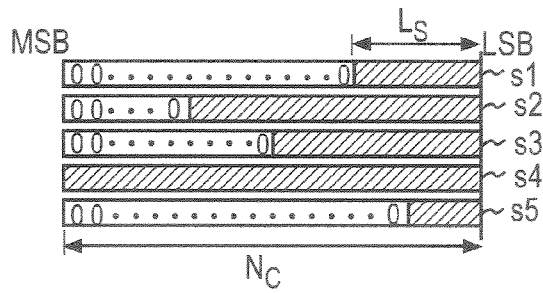
FIG. 15B is a diagram showing an instance in which the input samples are aligned from the LSB side and converted into unit processing information.

FIG. 15B is a diagram showing an instance in which the input samples are aligned from the LSB (least significant bit) side and converted into unit processing information. The input samples s1, s2, ... are aligned from the LSB side and dummy bits (for example, 0) are added to the MSB side of the most significant effective digit to increase the word length (number of bits). In this way, the input samples are unified to be of the same number of bits (the number $N_C$ of bits in the unit processing information).

Figure 15C:
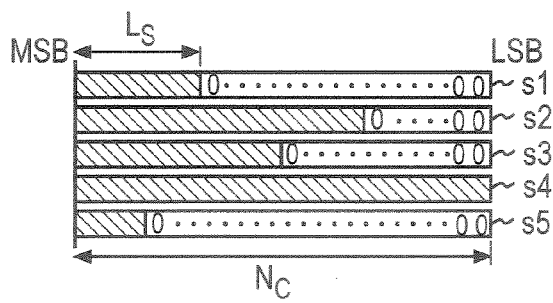
FIG. 15C is a diagram showing an instance in which the input samples are aligned from the MSB side and converted into unit processing information.

FIG. 15C is a diagram showing an instance in which the input samples are aligned from the MSB (most significant bit) side and converted into unit processing information. The input samples s1, s2, ... are aligned from the MSB side and dummy bits (for example, 0) are added to the LSB side of the least significant effective digit to increase the word length (number of bits). In this way, the input samples are unified to be of the same number of bits (the number $N_C$ of bits in the unit processing information).

Figure 15D:
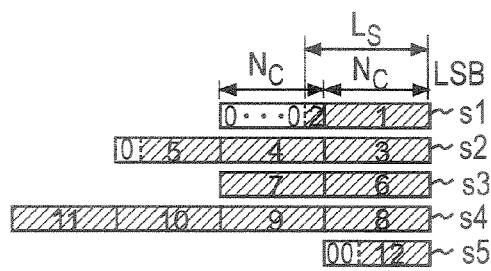
FIG. 15D is a diagram showing an instance in which the input samples are aligned from the LSB side and pulled out on the basis of the number $N_C$ of bits in the unit processing information.

The conversion can be performed using the word length (number of bits) less than the maximum word length $L_{S\ max}$ of the input samples as the number of bits (size of a character) in the unit processing information in the mask LZ method. FIG. 15D shows an instance in which the input samples are aligned from the LSB (least significant bit) side and pulled out on the basis of the number of bits (word length) $N_C$ in the unit processing information (a character). In this instance, the input samples s1, s2, ... are aligned from the LSB side and pulled out on the basis of the number of bits (word length) $N_C$ of unit processing information (a character) for the mask LZ processing from the LSB side toward the MSB side to be partitioned on the basis of unit processing information (a character). In this processing, if the word length $L_S$ of an input sample is not an integral multiple of the word length $N_C$ of the unit processing information, residual bits are left. The residual bits are added with dummy bits (for example, 0) from the MSB side until the word length $N_C$ of a unit is reached to be converted into the unit processing information. The bit length $L_S$ of the sample s1 is more than $N_C$ and less than $2N_C$. As such, the first $N_C$ bits are pulled out and dummy bits are added to the MSB side from the residual bits, thereby making an $N_C$ bits of unit processing information. Dummy bits are not added to the MSB side from an integral multiple of the length $N_C$ of a unit word. The unit processing information (character) pulled out in this way is aligned from the LSB side to the MSB side of the first sample s1, then from the LSB side to the MSB side of the sample s2. In FIG. 15D, the unit processing information are labeled as 1, 2, 3, ... , 12 in the aligned order. In this instance, dummy bits are added at the second character (unit processing information), the fifth character (unit processing information) and the twelfth character (unit processing information). A dummy bits portion is masked in search for and comparison with a dictionary registered character (unit processing information).

Figure 15E:
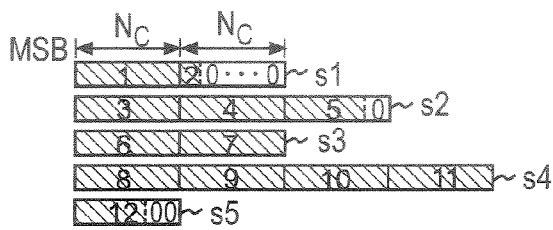
FIG. 15E is a diagram showing an instance in which the input samples are aligned from the MSB side and pulled out on the basis of the number $N_C$ of bits in the unit processing information.

FIG. 15E shows an instance in which the input samples are aligned from the MSB (most significant bit) side and pulled out on the basis of the number $N_C$ of bits (word length) in the unit processing information (a character). In this instance, the input samples s1, s2, ... are aligned from the MSB side and pulled out on the basis of the number of bits (word length) $N_C$ in unit processing information (a character) from the MSB side toward the LSB side to be partitioned on the basis of a single character (unit processing information). In this processing, if the word length $L_S$ of an input sample is not an integral multiple of the word length $N_C$ of the unit processing information, residual bits are left. The residual bits are added with dummy bits from the LSB side until the word length $N_C$ of unit processing information is reached. Dummy bits are not added to the LSB side from an integral multiple of the length $N_C$ of a unit word. The characters (unit processing information) pulled out in this way are aligned from the MSB side to the LSB side of the first sample s1, then from the MSB side to the LSB side of the sample s2. In FIG. 15E, the unit processing information are labeled as 1, 2, 3, ... , 12 in the aligned order. In the drawing, dummy bits are added at the second character, the fifth character and the twelfth character. A dummy bit portion is masked in search for a dictionary registered character.

Figure 15F:
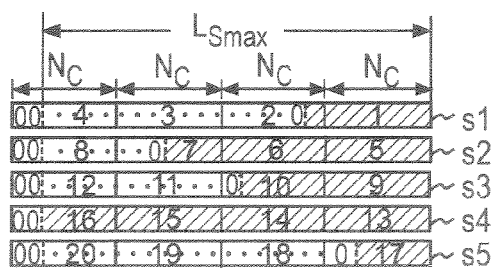
FIG. 15F is a diagram showing an instance in which the input samples are aligned from the LSB side and the number of bits is increased by adding dummy bits to the MSB side from the last effective digit.
Figure 15G:
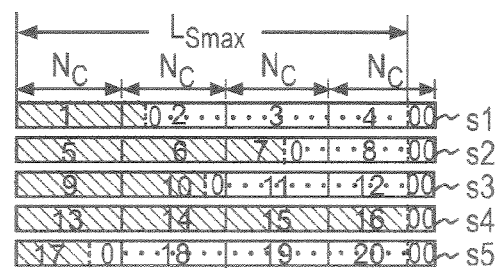
FIG. 15G is a diagram showing an instance in which the input samples are aligned from the MSB side and the number of bits is increased by adding dummy bits to the LSB side from the last effective digit.

FIGS. 15F and 15G show another instance of conversion using a unit word length $N_C$ less than the maximum word length (number of bits) $L_{S\ max}$ of an input sample.

In FIG. 15F, the input samples s1, s2, ... are aligned from the LSB (least significant bit) side and dummy bits (for example, 0) are added from an effective digit to the MSB side to increase the word length (number of bits). In the increasing process, the dummy bits are added such that the number of bits is more than the maximum word length (number of bits) $L_{S\ max}$ of the input samples and is an integral multiple of the unit word length $N_C$. Next, the samples are aligned from the LSB side toward the MSB side and pulled out on the basis of the number of bits (word length) $N_C$ in unit processing information (a character) for the mask LZ processing to be partitioned on the basis of unit processing information (a character).

In FIG. 15 the input samples s1, s2, . . . are aligned from the MSB (most significant bit) side and fixed dummy bits of, for example, 0 are added from an effective digit to the LSB side to increase the word length (number of bits). In the increasing process, the dummy bits are added such that the number of bits is more than the maximum word length (number of bits) $L_{S\ max}$ of the input samples and is an integral multiple of the unit word length $N_C$. Next, the samples are aligned from the MSB side toward the LSB side and pulled out on the basis of the number of bits (word length) $N_C$ of unit processing information (a character) for the mask LZ processing to be partitioned on the basis of unit processing information (a character).

Second Embodiment for Conversion of Unit Processing Information (of Long Definite Word Length)

Figure 16A:
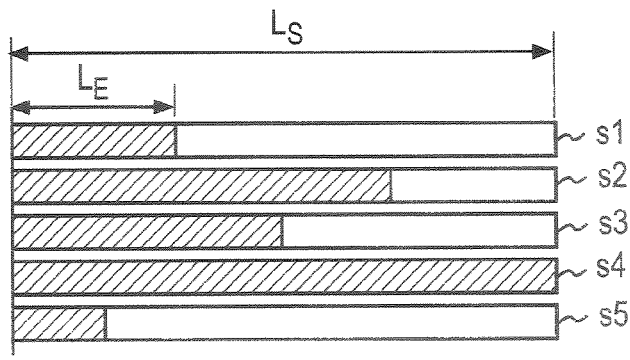
FIG. 16A is a diagram showing an instance of conversion of unit processing information for the mask LZ method if each input sample has a certain bit length and the number of effective digits in the each sample is less than the bit length.
Figure 16B:
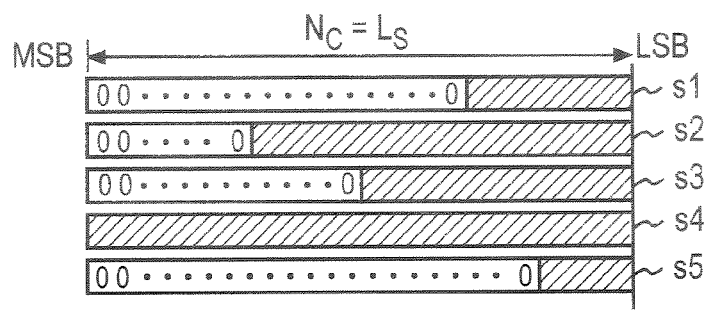
FIG. 16B is a diagram showing an instance in which the effective bits in the sample are aligned from the LSB side and a mask of the dummy bits is set.
Figure 16C:
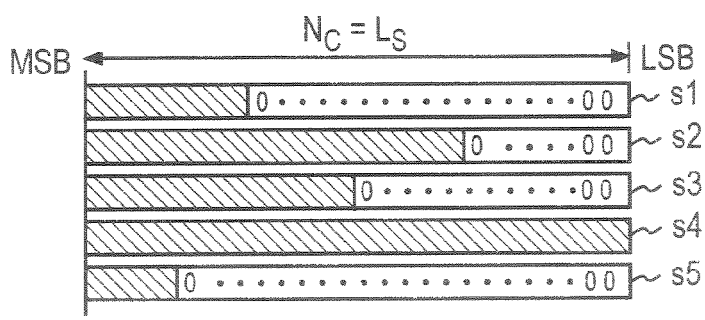
FIG. 16C is a diagram showing an instance in which the effective bits in the sample are aligned from the MSB side and a mask of the dummy bits is set on portions involving an error.

FIG. 16A shows an instance of conversion of the unit processing information (a character) for the mask LZ method if each input sample has a certain word length (bit length) $L_S$ and the number $L_E$ of effective digits in the each sample is less than the word length $L_S$. The number $N_C$ of bits in the unit processing information (a character) for the mask LZ method is set to the same length as the word length $L_S$ of an input sample. Next, effective bits in a sample are aligned from the LSB side and dummy bits (for example, 0) is set, as shown in FIG. 16B. The effective bits in samples s1, s2, . . . can be aligned from the MSB side and the dummy bits (for example, 0) can be set at a portion involving an error, as shown in FIG. 16C.

Figure 16D:
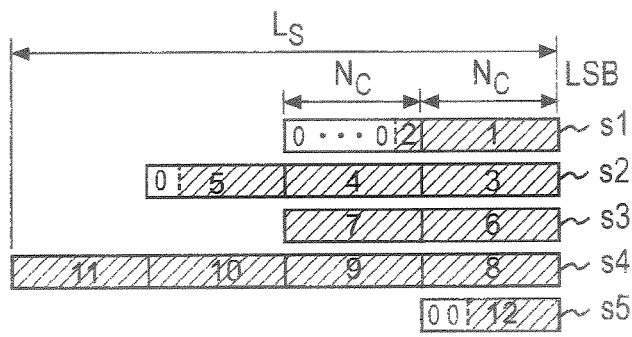
FIG. 16D is a diagram illustrating a method of aligning the effective bits in the sample from the LSB side and pulling out effective bits portion from the sample on the basis of the number of bits in unit processing information having a number of bits less than the length of a sample word.

FIG. 16D illustrates a method for aligning the effective bits in the input samples from the LSB side and pulling out an effective bits portion from the sample on the basis of the number $N_C$ of bits in unit processing information having the number of bits less than the length $L_S$ of the sample word. In this method, first, the effective bits in the input samples s1, s2, . . . are aligned from the LSB side. Then, an effective bits portion is pulled out from the sample s1, on the basis of the number of bits (size of a character) $N_C$ of unit processing information of the number of bits less than the length $L_S$ of the sample word. In the pulling out, if the number of bits in the pulled out effective bits portion is less than the number $N_C$ of bits in the unit processing information, dummy bits are added until the number of bits reaches $N_C$. After that, the pulling out from the sample s1 is stopped. Then, a portion of useful bits is pulled out from the sample s2 on the basis of the number $N_C$ of bits (since an error cannot be involved at higher-order bits than the effective digits portion). The pulled out unit processing information (single characters) are numbered in order from the LSB side toward the MSB side in the first sample.

Figure 16E:
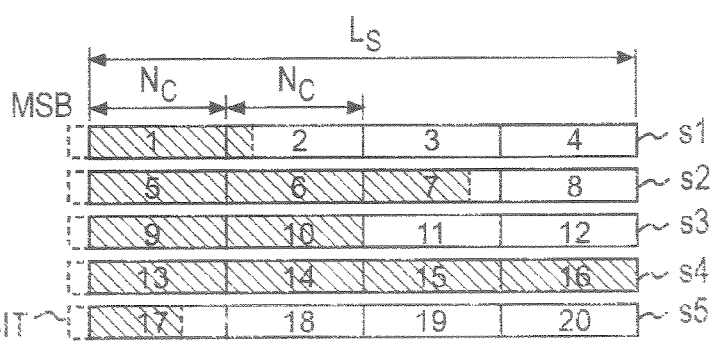
FIG. 16E is a diagram illustrating a method of aligning the effective bits in the sample from the MSB side and pulling out effective bits portion from the sample on the basis of the number of bits in unit processing information having a number of bits less than the length of sample word.

FIG. 16E is a diagram illustrating a method for aligning the effective bits in the input samples from the MSB side and pulling out an effective bits portion from the sample on the basis of the number $N_C$ of bits in unit processing information having the number of bits less than the length $L_S$ of a sample word. In this method, first, an effective digits portion in each sample is aligned from the MSB side. Then, each processing unit of the number $N_C$ of bits (size of a character) is pulled out serially from the MSB side to the LSB side of the first sample. In this case, in order to mask all the portions involving errors, even if the pulling out on an effective digits portion in a sample finishes, the pulling out is performed over the length $L_S$ of all the samples. Then, dummy bits are added in an ineffective digits portion. Also in a dummy bit portion, unit processing information (a character) is numbered. In the instance in FIG. 16D, the processing is performed in adding the dummy bits so as to be an integral multiple of the word length $N_C$ of unit processing information not less than the effective digits, and the number of bits in added dummy bits to be minimum, similarly to FIG. 5F. In addition, characters (unit processing information) of dummy bits only can be added over the longest word.

Configuration for Conversion and Processing Procedure for Processing Unit

Figure 17:
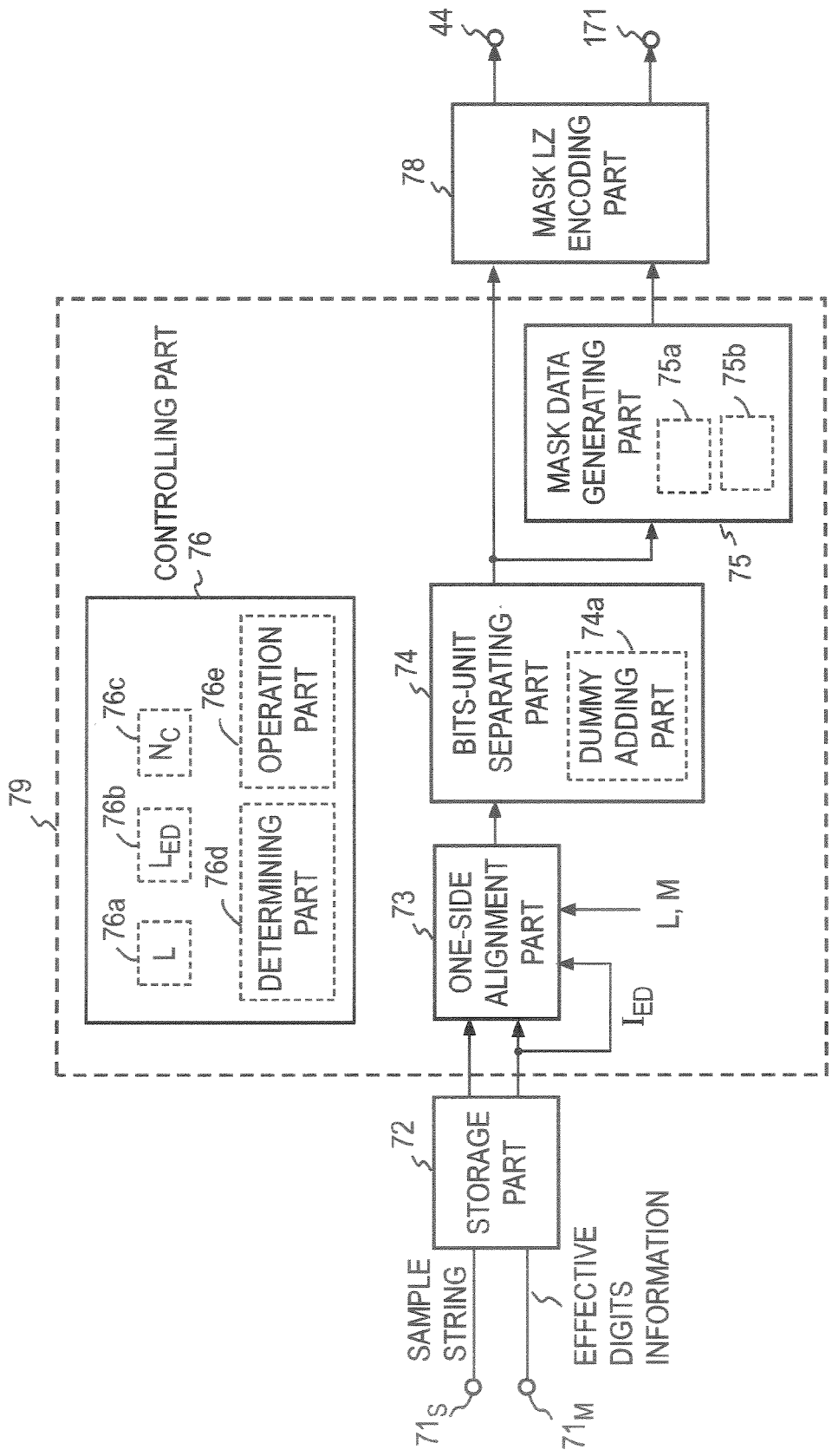
FIG. 17 is a block diagram showing an instance of function configuration of an encoding device according to a second embodiment.
Figure 18:
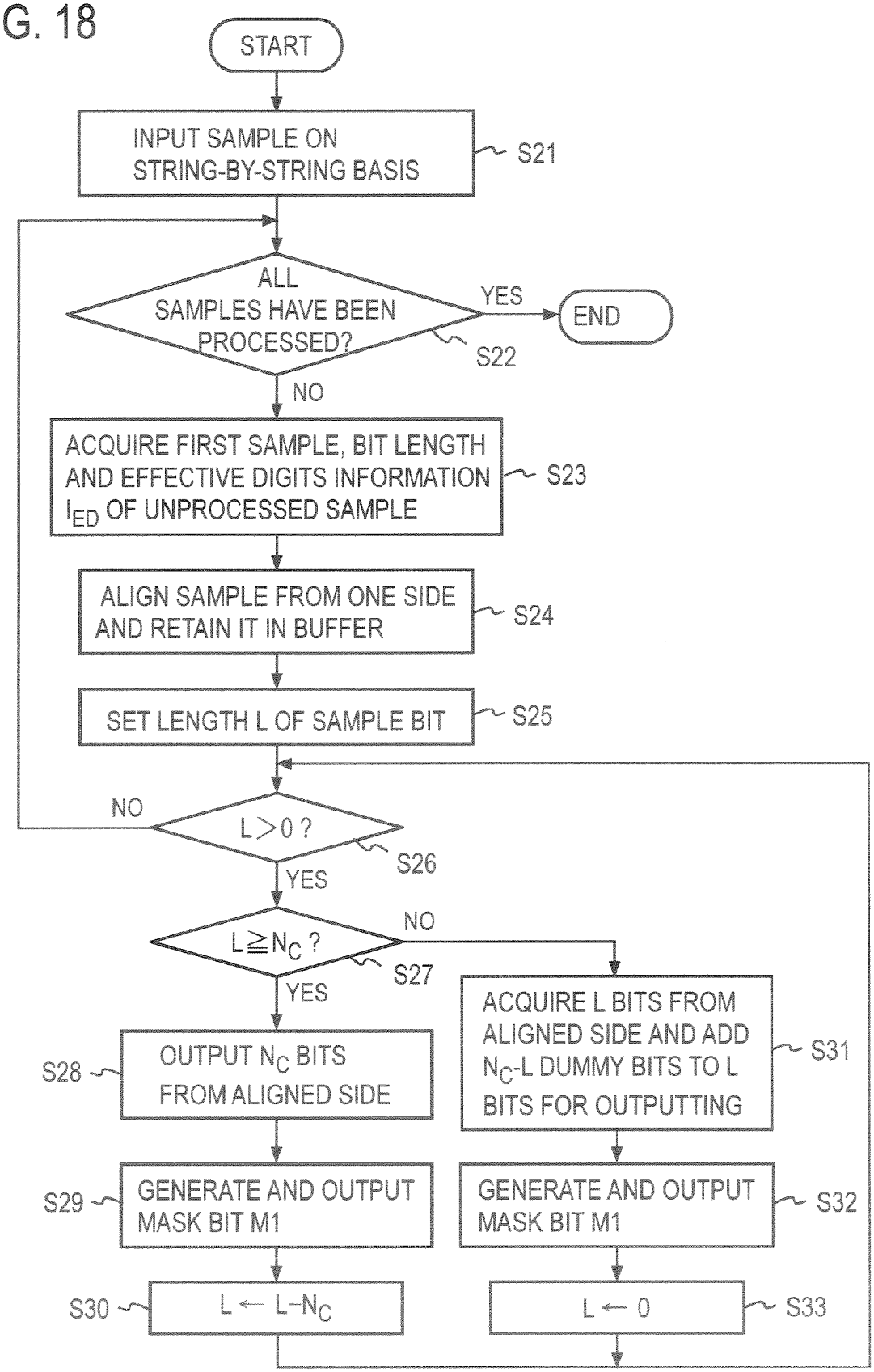
FIG. 18 is a flow diagram showing an instance of a processing procedure of an unit processing string converting part 79 according to the second embodiment.

FIG. 17 shows an instance of function configuration for compression-coding a sample string of digital values by the mask LZ method and FIG. 18 shows an instance of a processing procedure of converting the sample string into an unit processing information string.

An input terminal $71_S$ inputs a sample string, and an input terminal $71_M$ inputs effective digits information $I_{ED}$ for each sample, to a storage part 72 (step S21). A controlling part 76 checks whether or not processing on steps S23 to S33 on all samples has been completed (step S22). If not, a one-side alignment part 73 acquires the first sample in unprocessed samples, the bit length $L_S$ of the sample, and effective digits information $I_{ED}$ corresponding to the sample from the storage part 72 (step S23). The one-side alignment part 73 aligns the acquired sample string from the MSB side or the LSB side as described with reference to FIGS. 15 and 16 and retains the string in a buffer (step S24). If the word length $L_S$ of a sample is fixed as shown in FIG. 16, an effective digits portion is aligned. For example, depending on the number of effective digits, $I_{ED}$ and the longest (fixed) bit length $L_S$, the alignment is performed by shift-processing a sample.

The controlling part 76 initializes the length L for sample processing to the bit length $L_S$ of a sample (step S25). Then, the controlling part 76 checks whether or not the sample bit length L is larger than 0 (step S26). If L is larger than 0, it is checked whether L is not less than the number $N_C$ of bits (size of a character) in the processing unit (step S27). If $N_C \geq L$, then processing corresponding to FIGS. 15B, 15C, 16B and 16C is performed. If $N_C < L$, then processing corresponding to FIGS. 15D, 15E, 16D and 16E is performed.

If it is determined to be $L \geq N_C$ at step S27, a bits-unit separating part 74 acquires the pre-determined number of bits (size of a character) $N_C$ in unit processing information in a sample having a bit length L by starting from an aligned side (the LSB side in the case that the alignment is performed from the LSB side, and the MSB side in the case that the alignment is performed from the MSB side), and outputs the result as a character (unit processing information) (step S28). A mask data generating part 75 generates mask data M1($i$) corresponding to the outputted character (step S29). In this case, a generating part 75a in the mask data generating part 75 outputs the mask data M1($i$) with digits (bits) being "1". After that, the character size $N_C$ is subtracted from the sample bit length L, thereby updating L and the processing returns to step S26 (step S30).

If it is determined to be $N_C < L$ at step S27, the bits-unit separating part 74 acquires L bits by starting from an aligned side. A dummy adding part 74a adds $N_C$–L bits (deficiency in the size $N_C$ of a character) of dummy bits at the opposite side to the aligned side for the acquired L bits, and outputs the result as a character (unit processing information) (step S31). That is, if a sample is aligned from the LSB side, dummy bits are added at the MSB side for the acquired L bits. The mask data generating part 75 generates mask data M1($i$) for the outputted single character (step S32). In this case, a generating part 75b outputs mask data M1($i$) with bits "1" corresponding to L bits of the effective digits and bits "0" corresponding to the $N_C$–L dummy bits. Next, the sample bit length L is updated to 0 and the processing returns to step S26 (step S33).

If it is determined that the length L for sample processing is less than 0 at step S26, the processing returns to step S22. If the processing at steps S23 to S33 on all samples has been completed at step S22, the conversion processing on the current unit processing string finishes.

If $L=N_C$ at step S31, then $N_C-L=0$ and no dummy bit is added. The controlling part 76 in FIG. 17 captures a sample string and acquires a sample from the storage part 72 as well as operates other parts serially. The controlling part 76 is provided with a storage part 76a that stores the sample bit length L as a necessary parameter for its controlling operation, a storage part 76b that stores effective digits information $I_{ED}$, a storage part 76c that stores the character size $N_C$ as well as a determining part 76d that performs the determination at steps S22, S26 and S27, an operation part 76e that operates such as $N_C-L$, and other parts. $N_C$ can be stored in the bits-unit separating part 74. In this way, a sample string is converted into an unit processing information string (character string).

Such a character string and a string of mask data M1(i) corresponding to each character are inputted to a mask LZ encoding part 78 as described in the first embodiment. Then, the encoding processing is performed as mentioned in the above, and a code is outputted to the output terminal 44. In addition a code indicating effective digits information $I_{ED}$ is outputted from the terminal 171 on the basis of a block (so-called frame) of a pre-determined number, for example 1024, of samples, as necessary.

Conversion of Processing Procedure for Conversion of Sample String

Figure 19:
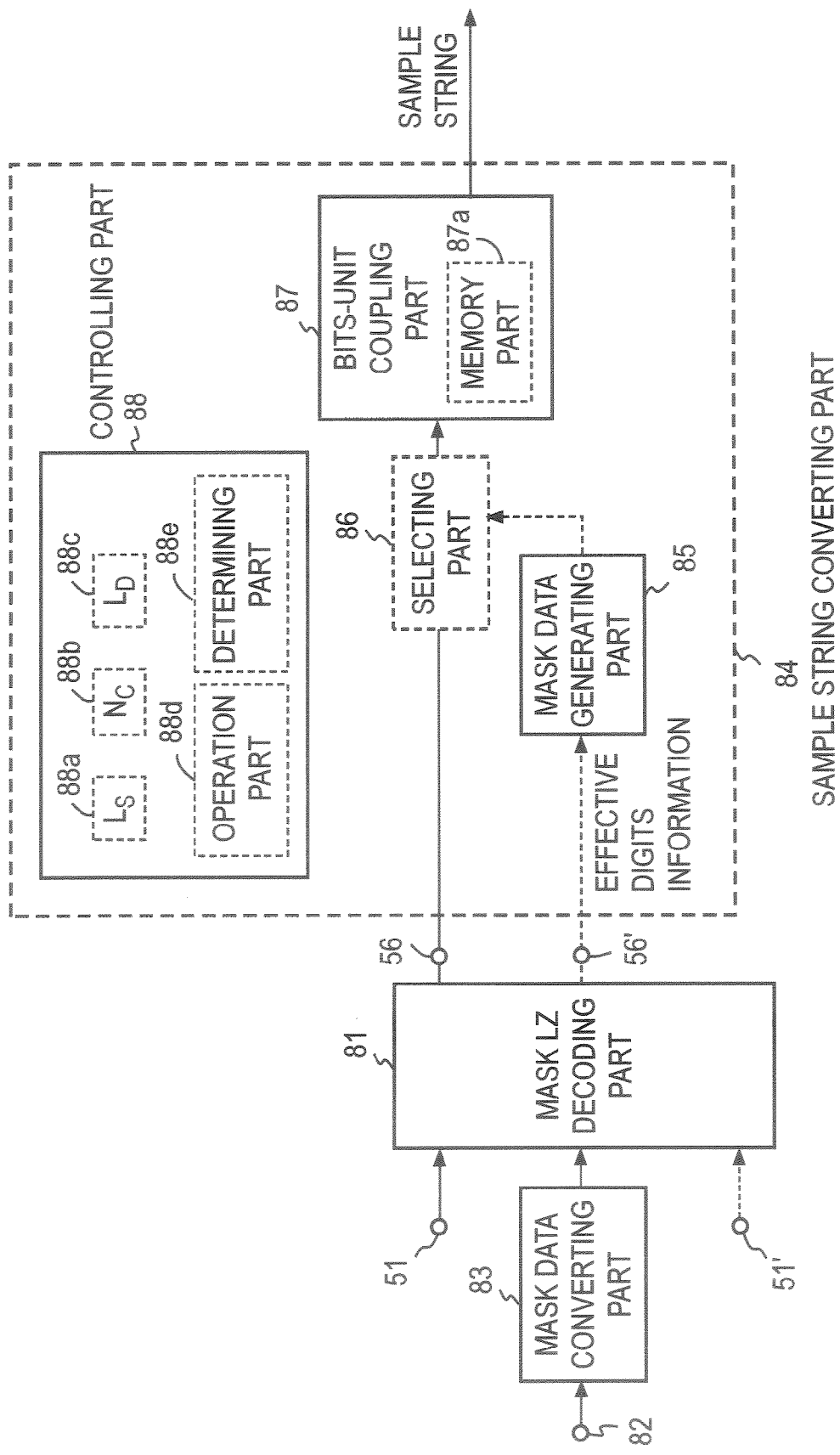
FIG. 19 is a block diagram showing an instance of function configuration of a decoding device according to the second embodiment.
Figure 20:
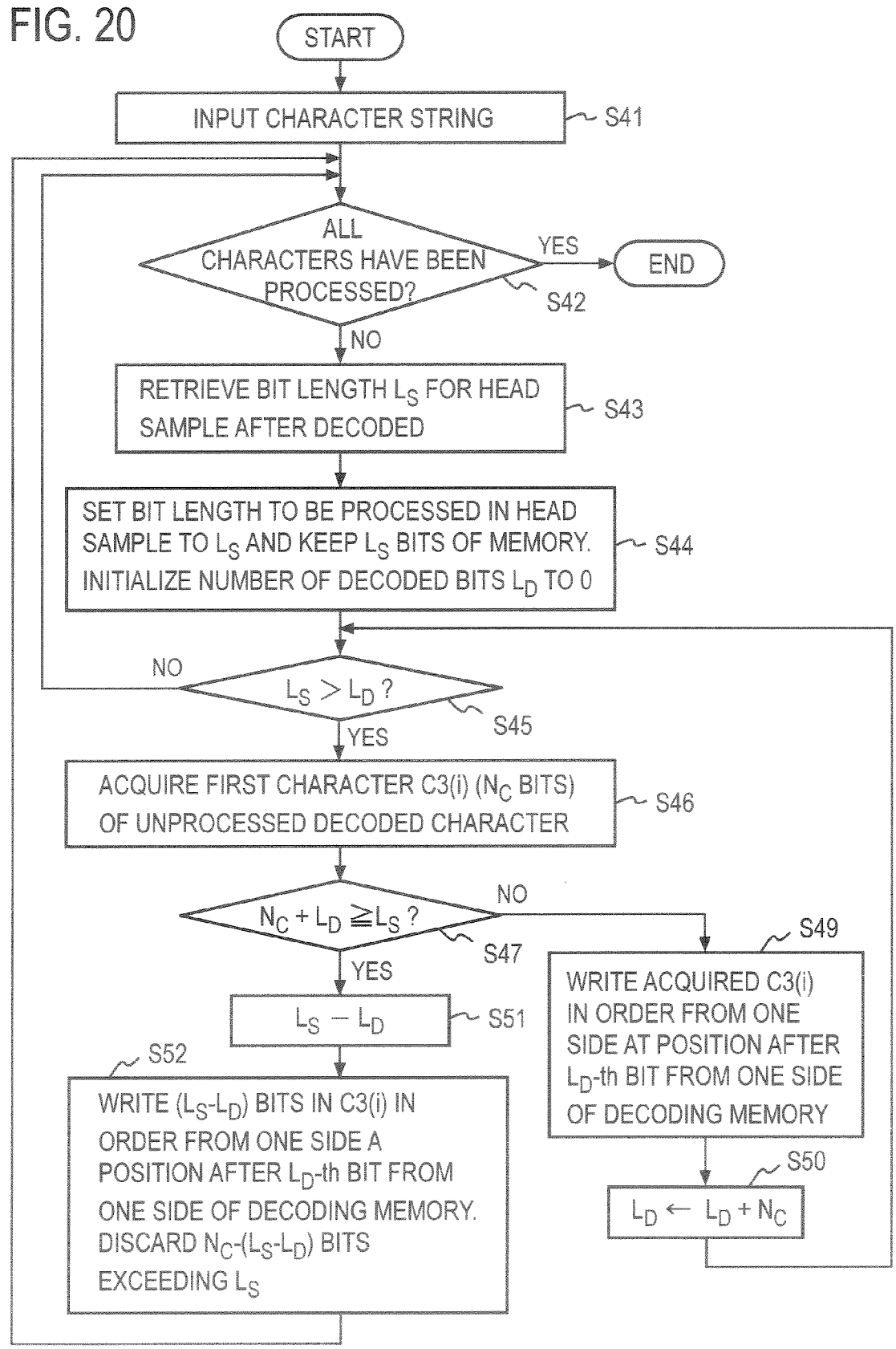
FIG. 20 is a flow diagram showing an instance of a processing procedure of a sample string converting part 84 according to the second embodiment.

FIG. 19 illustrates function configuration for decoding of an input code and conversion of the decoded information into the input sample string in FIG. 17. FIG. 20 shows an instance of a processing procedure for converting a character string (unit processing information string) into a sample string.

An input code from the input terminal 51 is inputted to a mask LZ decoding part 81. As necessary, effective digits information of each sample from an input terminal 82 is converted into mask data for each character (unit processing information) by a mask data converting part 83 and inputted to the mask LZ decoding part 81. The effective digits information from the terminal 82 is inputted on, for example, a frame basis. The mask LZ decoding part 81 is one of the various types of decoding devices mentioned in the embodiments A-1 to A-5. Effective digits information or an effective digits code corresponding to the input from the terminal 51' in FIG. 10 instead of the mask data converting part 83 can be inputted.

The character string (unit processing information string) decoded by the mask LZ decoding part 81 is inputted from the terminal 56 to a sample string converting part 84 (step S41). A controlling part 88 checks whether or not the conversion processing on all characters (unit processing information) has been completed (step S42). If not, the controlling part 88 gets the word length (bit length) $L_S$ of the first sample after decoding (step S43). A bits-unit coupling part 87 prepares an $L_S$ bits of memory part 87a in it. The bits-unit coupling part 87 initializes the number $L_D$ of decoded bits to 0 (step S44).

The controlling part 88 checks whether or not $L_D$ is less than $L_S$ (step S45). If so, the bits-unit coupling part 87 acquires the first character C3(i) from an unprocessed character string (step S46). The number $L_D$ of decoded bits is added to the number $N_C$ of bits in a character, and then it is determined whether the addition result is not less than the length $L_S$ of a sample word (step S47). If the result is less than $L_S$, the acquired C3(i) is serially written into an unwritten portion by starting from one end in the memory part 87a (step S49). That is, if a sample string is converted into an unit processing information string by starting from the LSB (or MSB) side, it is written into the memory part 87a also by starting the LSB (or MSB) side and C3(i) is stored next to a stored $L_D$-th bit from the LSB (or MSB) side.

After step S49, $L_D+N_C$ is set as the new number $L_D$ of decoded bits and the processing returns to step S45 (step S50).

If the addition result at step S47 is not less than the length $L_S$ of the sample word, $L_S-L_D$ is computed (step S51). The $(L_S-L_D)$ bits are written into an unwritten portion by starting from the LSB (or MSB) side in the masked character C3(i) and the processing returns to step S42 (step S52). In this processing, $N_C-(L_S-L_D)$ bits over the sample bit length $L_S$ are discarded. The discarding method can include various methods. For example, the method includes a method of discarding the first $N_C-(L_S-L_D)$ bit and writing the remaining bits, or a method of writing $N_C-(L_S-L_D)$ bits into a decoding memory and then discarding them by bit shifting.

If the number $L_D$ of decoded bits is not less than the sample bit length $L_S$ at step S45, the processing returns to step S42. If the processing on all characters is completed at step S42, the conversion of a sample string finishes.

The controlling part 88 in FIG. 19 comprises registers 88a, 88b and 88c that store such as parameters $L_S$, $N_C$ and $L_D$ for the processing, an operation part 88d that performs such as an addition of $x_C+L_D$, a determining part 88e that performs such as the determination at steps S42, S45 and S48 and other parts. The controlling part 88 performs various types of processing such as capturing of a character string or reserving of the bit length $L_S$ of the first sample and the memory part 87a and operates other parts serially.

In the processing at step S52 in FIG. 20, $N_C-(L_S-L_D)$ over $L_S$ is discarded. However, if the bits correspond to the bits added as dummy bits at encoding, the mask LZ decoding part 81 in FIG. 19 does not need to mask the outputted character string. That is, output from the information retrieving part 53 is outputted to the character string combining part 55 without being processed by the mask computing part 152, as indicated by the dashed line 157' in FIG. 8. Then, the character string combining part 55 concatenates a masked mismatching character inputted from the code parsing part 52 and a character string from the information retrieving part 53 to produce a decoded character string for outputting. Then, the dictionary registering part 57 registers the outputted character string in a dictionary, as indicated by a dashed line 159.

The above configuration can simplify the processing by the mask LZ decoding part 81 in FIG. 19.

Similarly, the output from the effective digits decoding part 156 in FIG. 10 can be input to a mask data generating part 85 in FIG. 19. In this case, the mask data generating part 151 and the mask computing part 152 in FIG. 10 can be omitted. Specifically, the output from the information retrieving part 53 is outputted as a decoded character string as indicated by a dashed line in FIG. 10. Then, effective digits information is outputted to a terminal 56'. The output is inputted to the terminal 56' in FIG. 19. In this way, the processing by the mask data converting part 83 is unnecessary.

Third Embodiment

In a third embodiment, the present invention is applied to encoding and decoding of a sample string in a floating-point format, particularly the encoding and decoding discussed in the non-patent literature 4.

Encoding Side

Figure 21:
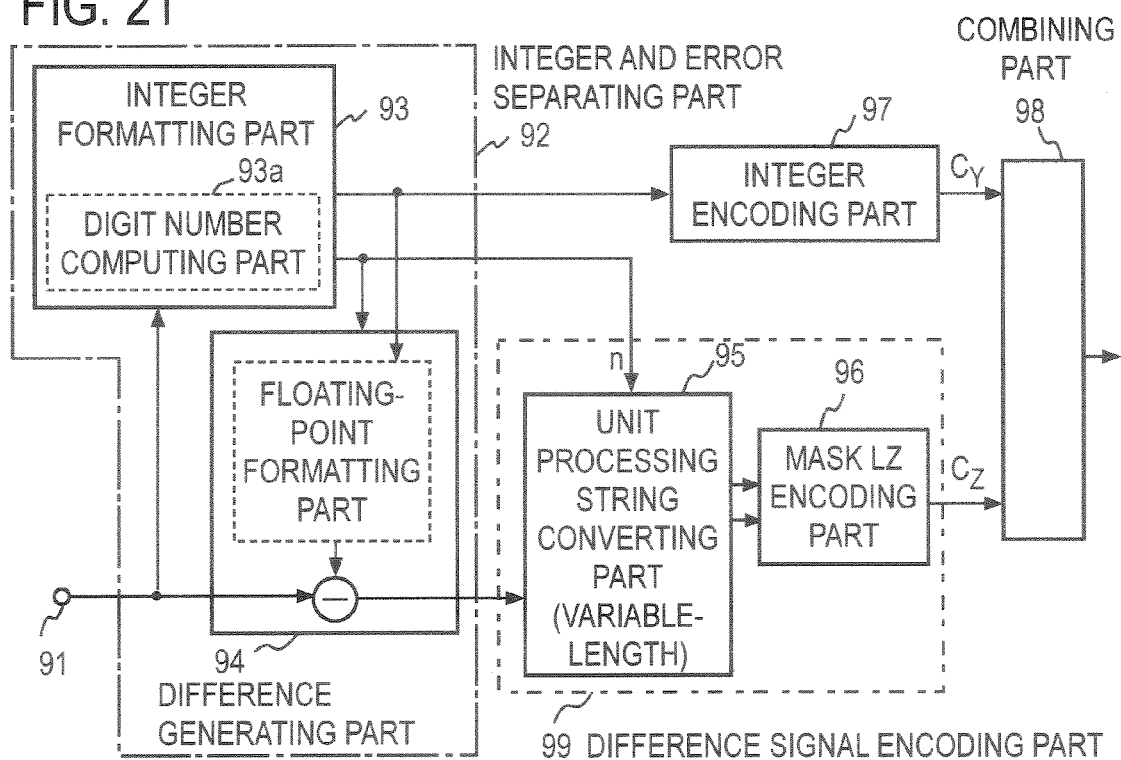
FIG. 21 is a block diagram showing an instance of function configuration of an encoding device according to a third embodiment.
Figure 22:
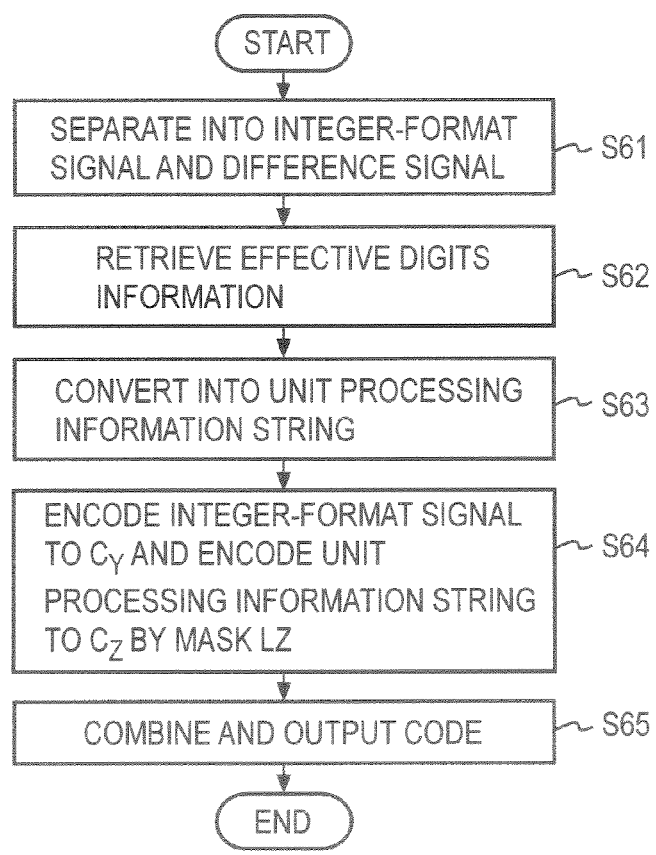
FIG. 22 is a flow diagram showing an instance of a processing procedure according to the third embodiment.

FIG. 21 shows an instance of an encoding device and FIG. 22 shows an instance of processing, with respect to this embodiment. An input terminal 91 inputs a sample string in a floating-point format according to the IEEE-754 standard. An integer and error separating part 92 separates each sample into an integer signal Y of a pre-determined number, for example 24 or 16, of bits and a difference signal Z between the integer signal and the input sample (step S61). The input sample string (for example, an audio signal in a 32-bit floating-point format according to IEEE-754 standard) is a signal in a floating-point format containing a fractional part below the decimal point. An integer formatting part 93 generates the signal Y in an integer format represented by a complement number of two taking the sign from each sample into account. A difference generating part 94 outputs difference between the signal Y converted into a floating-point format and the input sample. The difference signal Z is composed of lower (23−n) bits in the mantissa of the input sample. A digit number computing part 93a calculates the number n of digits in the integer-format signal Y and outputs the number as effective digits information of the difference signal Z (step S62). In this step, the number n of effective digits in the integer-format signal Y is decided using the method described in the non-patent literature 4 so as to satisfy $2^n \leq |Y| < 2^{(n+1)}$. The non-patent literature 4 describes that upper n−1 bits in the mantissa are 0 by setting a sample of an integer-format signal to M if $2^{(n-1)} \leq |M| < 2^{(n)}$. This equals that upper n bits in the mantissa are 0 in the present invention if $2^n \leq |Y| < 2^{(n+1)}$. If |Y|=0 the entire 32 bits in an inputted floating-point signal can be the difference signal Z, as described with respect to an embodiment 5.

Figure 23:
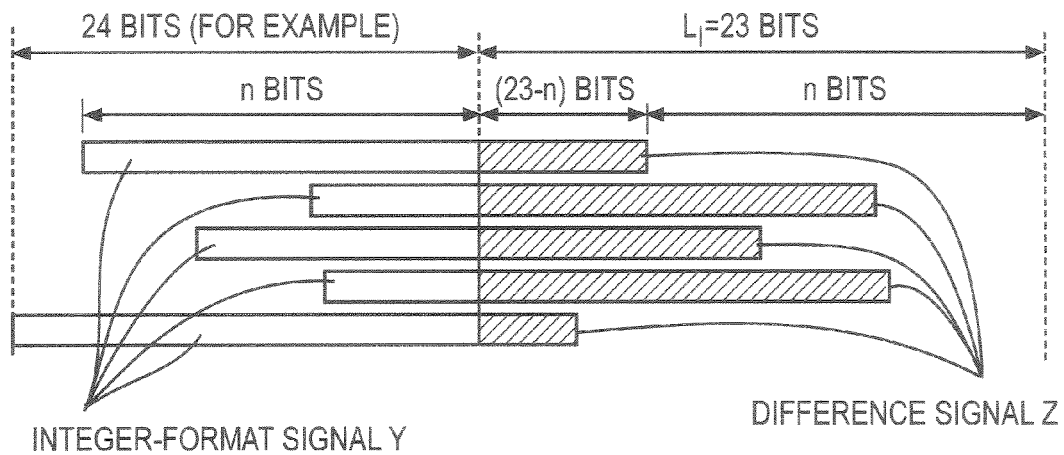
FIG. 23 is a diagram showing an instance of relation between integer-format signals and their difference signals of various types of samples.

The difference signal from the difference generating part 94 is a (23−n)-bit variable-length sample subtracted by n bits being always 0 in the upper side of the 23-bit mantissa in the floating-point format input sample. FIG. 23 shows an instance of the conversion into the integer-format signal Y and the difference signal Z. The largest number of bits in the integer-format signal Y is, for example 24 bits. The difference signal Z is a variable-length signal that has the number $L_I$ of bits being 23 bits at maximum and 1 bit at minimum.

An unit processing string converting part 95 in FIG. 21 converts the variable-length difference signal Z into a character string (unit processing information string) having a predetermined number of bits by means of the configuration as in FIG. 17 and the processing procedure as in FIG. 18 (step S63). Since the (23−n) bits in the number of effective digits in the difference signal Z are obtained from the number n of digits in the integer-format signal Y, n can indicate information of the number of effective digits. The conversion format shown in FIG. 16B or 16C can be applied by setting the number $N_C$ of bits in a character (unit processing information) for the mask LZ method to $L_E$=23 bits, or the conversion format shown in FIG. 16D or 16E can be applied by setting the number $N_C$ of bits in a character to, for example 8 bits. Applying the conversion format in FIG. 16B, n upper bits in mask data M1(i) indicate dummy bits, i.e. bits indicating that they are not effective digits. The mask data M1(i) for the difference signal Z can also be generated based on the number n of integer digits. Because the difference signal Z is of one bit at least, the mask data has at least one bit of "1". The maximum length of effective digits of the difference signal Z is 23 bits. However, if every difference signal Z is converted into a character string by adding a dummy bit "0" to be 24 bits (for example, as shown in FIG. 16E), the difference signal Z can be converted on a unit basis of $N_C$=8 when the character size $N_C$ is 8 bits. Similarly, the conversion format illustrated in FIG. 15E can be applied to the difference signal Z.

A mask LZ encoding part 96 encodes a character string converted by the unit processing string converting part 95 (step S64). As a specific instance of a numerical value in the mask LZ encoding, application of the mask LZW method according to the embodiment A-3 will be described. In the dictionary part 43 (FIG. 5), all combinations that can be represented in eight bits are previously set as initial values.

The amount of information for an index in the dictionary part 43 is set, for example, to nine bits in the initial state A character or character string is registered in the dictionary part 43 for each index. If the maximum number of character strings that can be represented in nine bits is reached, the number of bits used to represent an index is incremented by one bit. The maximum number of bits for an index is 16 bits, for example.

An input character string C(i+k) and effective digits information (mask data) M(i+k) are inputted in order, an then the longest matching character string is searched for among character strings registered in the dictionary part 43. The search is performed at steps R10 to R6 in FIG. 7. The code generating part 49 outputs a dictionary index $j_{max}$ of the longest matching character string obtained by the search as a code. The inputted character is labeled as C1(i+k), its effective digits information (mask data) is labeled as M1(i+k) (k is incremented from 0), the length of a j-th (index) character string registered in the dictionary part 43 is labeled as $K_j$ and the character string is labeled as D(j)(k) [k: $0 \leq k < K_j$]. In this case, determination of the match is the processing for obtaining an index $j_{max}$ in the dictionary part containing the longest k where C1(i+k)&M1(i+k)=D(j)(k)&M1(i+k) is satisfied for all (k) between 0 and $K_j$−1.

Each time a code is outputted, a character string is obtained by adding the first masked character $D(j_{max})(0)$&M1(i+0) obtained by masking the first character $D(j_{max})(0)$ in a character string corresponding to the current outputted code with M1(i+0) to a character string $D(j_{max}')(k)$ [k: $0 \leq k < k_{max}'$] corresponding to the previous outputted code, and is newly registered in the dictionary. In this way, longer character strings will be registered in the dictionary part, thereby enabling to search for a match with longer character strings.

The integer-format signal Y is compression-coded by an integer encoding part 97 (step S64). The compression-coding can use the correlation of a waveform value as an integral value to perform efficient compression-coding by the lossless compression method. A combining part 98 combines a code $C_Y$ of an integer-format signal with an encoded code $C_Z$ of the difference signal Z from the mask LZ encoding part 96. Then, the combining part 98 outputs the combined code as an encoded code for each sample or frame (step S65).

Decoding Side

Figure 24:
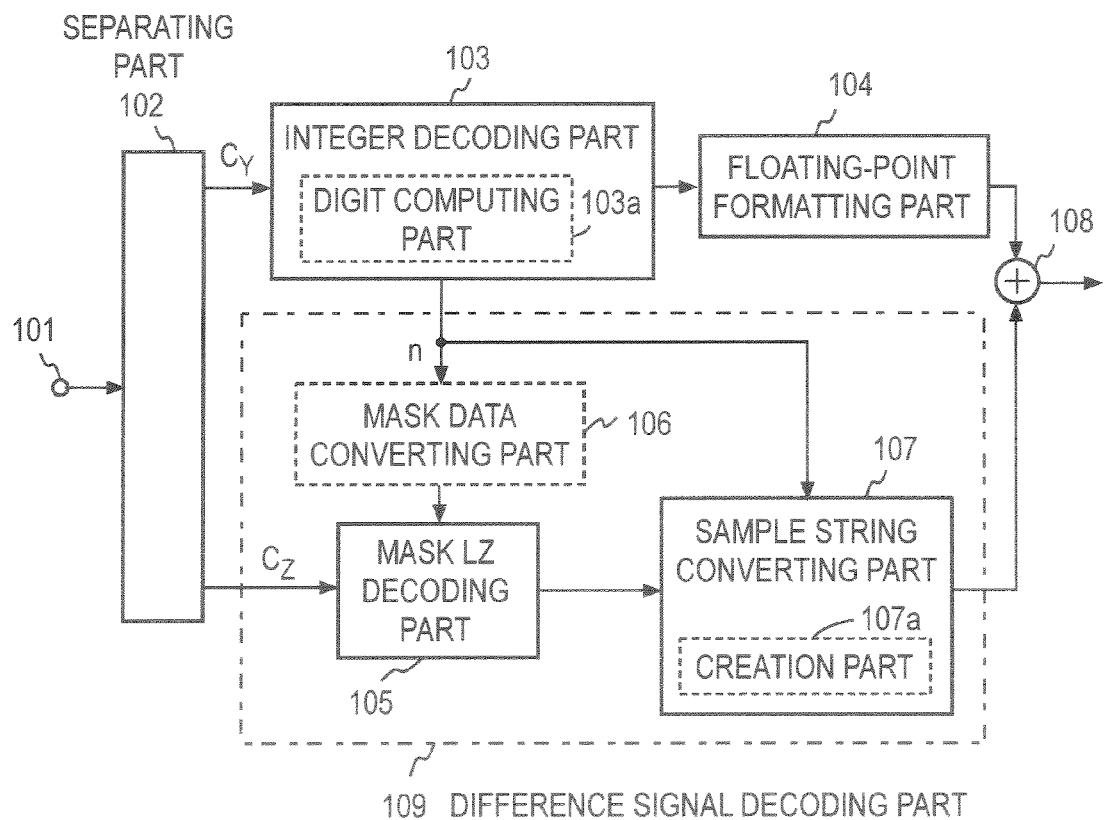
FIG. 24 is a block diagram showing an instance of function configuration of a decoding device according to the third embodiment.
Figure 25:
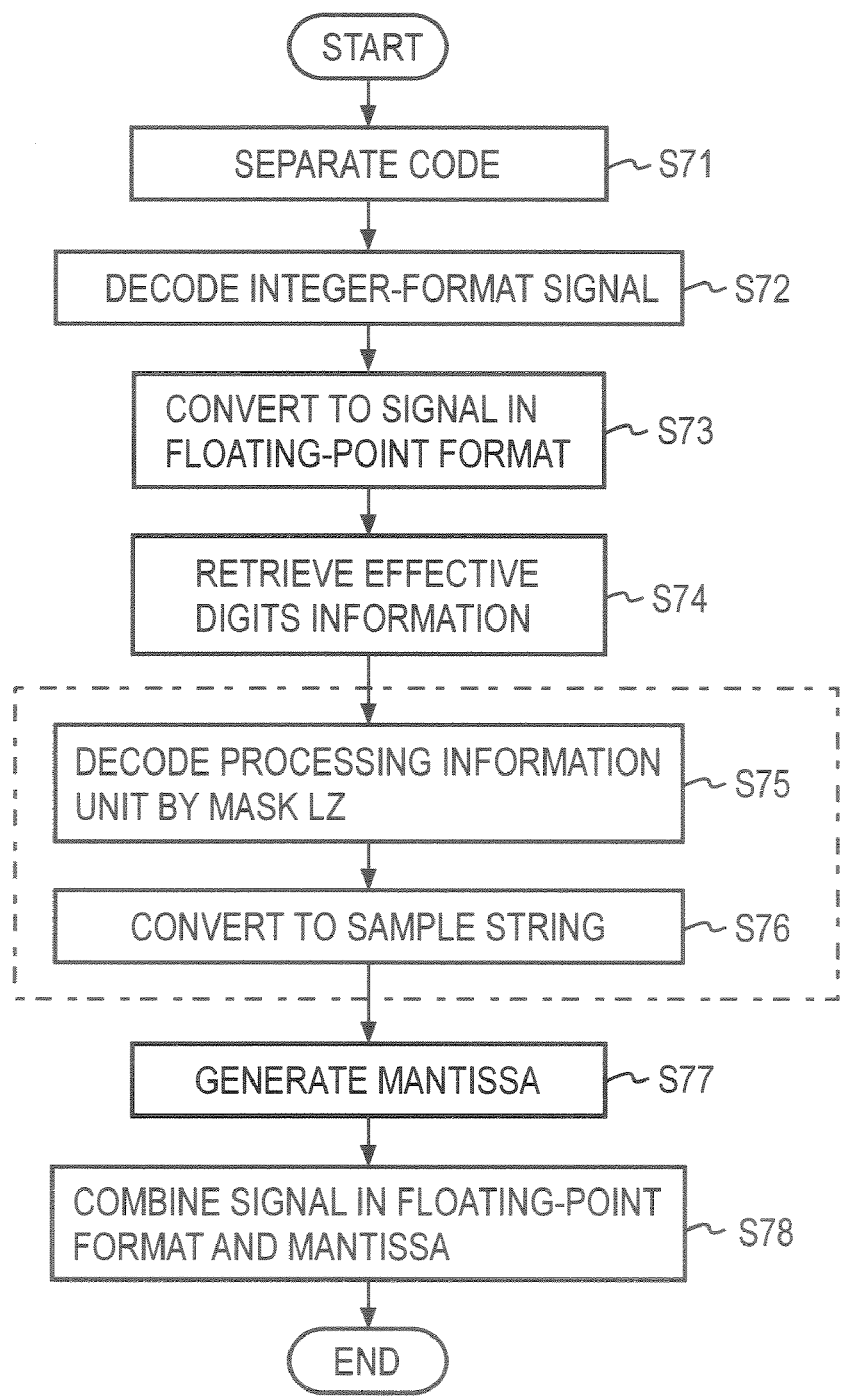
FIG. 25 is a flow diagram showing an instance of a processing procedure of a decoding device according to the third embodiment.

FIG. 24 illustrates function configuration of a decoding device corresponding to FIG. 21 while FIG. 25 shows an instance of a processing procedure in the configuration. A separating part 102 separates a set of codes $C_Y$ and $C_Z$ from an input terminal 101 into the code $C_Y$ and the code $C_Z$ (step S71). An integer decoding part 103 decodes the code $C_Y$ into the integer-format signal Y (step S72). A floating-point formatting part 104 converts the integer-format signal Y into a floating-point format signal (step S73).

The code $C_Z$ is inputted to a mask LZ decoding part 105. A digit computing part 103a calculates the number n of digits in the integer-format signal Y decoded by the integer decoding part 103, and then outputs the number n of digits as effective digits information to the mask LZ decoding part 105 (step S74). As indicated by a dotted line, a mask data converting part 106 can be provided between the integer decoding part 103 and the mask LZ decoding part 105. In that case, effective digits information n is inputted to the mask data converting part 106. The mask data converting part 106, which sets effective digits for each sample to (23−n) bits, generates mask data for each character (unit processing information) and outputs the data to the mask LZ decoding part 105. In this processing, the number n of effective digits in the integer-format signal Y is decided by the same method as the encoding processing. That is, n is decided to satisfy $2^n \leq |Y| < 2^{(n+1)}$.

The mask LZ decoding part 105 is the same as the decoding device that performs the configuration and processing shown in FIGS. 10 and 11. The mask LZ decoding part 105 decodes the code $C_Z$ into an unit processing information string by the mask LZ (step S75). The mask LZ decoding part 105 inputs a string of decoded characters (unit processing information) to a sample string converting part 107. The sample string converting part 107 has similar configuration to the sample string converting part 84 in FIG. 19. The sample string converting part 107 masks the character string decoded by the mask LZ decoding part 105 with effective digits information. After the mask processing, the sample string converting part 107 converts the character string into the difference signal Z by removing dummy bits (step S76). The difference signal Z is composed of (23−n) bits that can be other than 0 for every sample. A creation part 107a converts the difference signal Z into a 23-bit mantissa signal in a floating point format (step S77). A combining part 108 combines a difference code Z determined to be a mantissa with a floating-point signal of the decoded integer-format signal Y and outputs an original floating-point signal sample (step S78).

In this embodiment, the mask LZ encoding and decoding are performed on a variable-length bit string that can be a value other than 0 as the difference signal Z. However, the mask LZ encoding and decoding can be performed on the difference signal Z remaining to be a 23-bit mantissa. In this case, the length of a sample is the fixed word length.

Embodiment 4

For example, in the case of encoding by a universal coding method, the compression ratio can improve by encoding a result of a division of an input sample string by a common multiplier. In this embodiment, the present invention is applied to the method of encoding using division by a common multiplier. First, it will be described in brief that the division by a common multiplier can improve the compression ratio.

If input signal sample strings are x(1), x(2), x(3) and x(1)=250, x(2)=50, x(3)=350 in decimal notation as shown in FIG. 26A, then in binary notation for them, "0" and "1" are arranged in a comparatively random way.

If the samples x(1), x(2), x(3) are divided by a common number A=1.5625, their quotient signals y(1), y(2), y(3) are y(1)=160, y(2)=32, y(3)=224 in decimal notation, respectively, as shown in FIG. 26B.

The arrangement in the quotient signals y(1), y(2), y(3) in binary notation is such that many portions contain sequential "0"s, as shown in FIG. 26C. As such, y(1), y(2), y(3) can be encoded at high compression ratio. However, the multiplication A also needs to be sent out. Nevertheless, if the number of samples is large and a large portion can become a quotient signal that can be highly compressed, the total amount of the compression-code can be reduced extremely.

FIG. 27 shows an instance of application to a sample string of a floating-point number according to the IEEE-754. In floating-point notation for numerical values 478.4, 95.68 and 669.76 in decimal notation, arrangement of 23 bits of "1" and "0" in mantissas are considerably random in general, as shown in FIG. 27A. However, if the values are divided by a common multiplier 2.99, their quotient signals are 160, 32 and 224 in decimal notation, as shown in FIG. 27B. The arrangement of 23 bits of "1" and "0" in a mantissa in floating-point notation contains too many "0"s. Consequently, encoding at much higher compression ratio is possible than compression-coding on the forms in FIG. 27A.

Encoding Side

Figure 28:
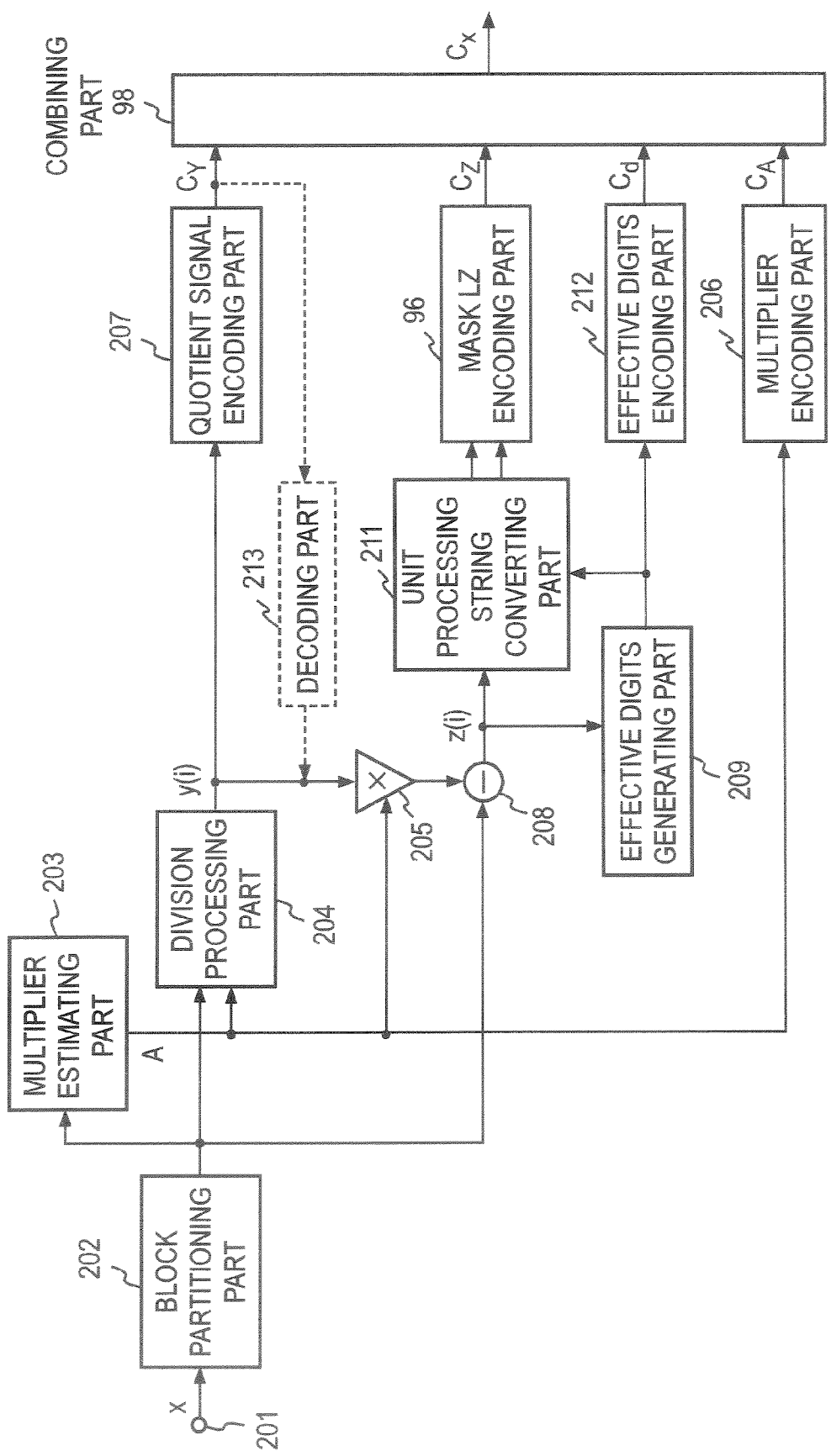
FIG. 28 is a block diagram showing an instance of function configuration of an encoding device according to a fourth embodiment.
Figure 29:
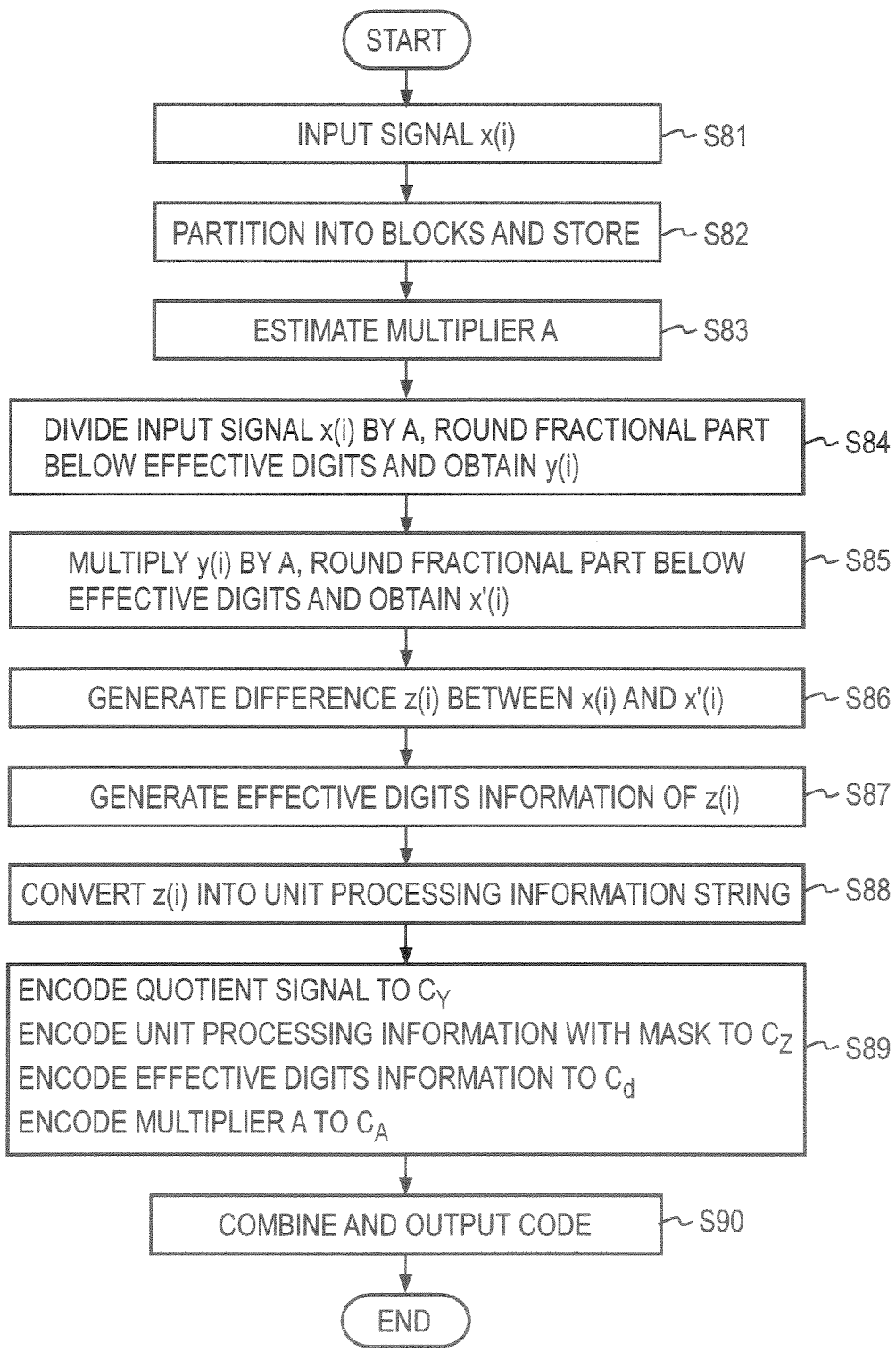
FIG. 29 is a flow diagram showing an instance of a processing procedure according to the fourth embodiment.

An encoding side will be described according to the embodiment 4 and with reference to FIG. 28.

An input signal X=(x(1), x(2), . . . ) from an input terminal 201 is a digitized sample string. When such a signal is inputted (step S81), it is partitioned into a predetermined number N (for example, 1024) of sample strings by a block (frame) partitioning part 202 and temporarily stored in a storage part (step S82), although not shown in the drawing. A sample string can be an integer sample string quantized with 24-bit quantization bit rate, a 32-bit single-precision sample string in a floating-point format or the like, in the case of an acoustic signal. The sample string is a digitized sample string of pixel information resolved into color information elements and raster-scanned in the ease of a color image signal.

A group of samples x(i) (i=0, 1, . . . , N−1) as input signals in different partition blocks is passed to a multiplier estimating part 203 on a frame basis. The multiplier estimating part 203 estimates a common multiplier A for all the samples x(i) (i=0, 1, . . . , N) (step S83). For example, if all the samples x(i) can be divided by a common value 99.0 without a remainder, a common multiplier is A=99.0. A method of estimating the common multiplier A can be various kinds of methods. For example, rational approximation of an Approximate Common Factor (ACF) is used. It is assumed that an appropriate multiplier A is given herein.

The multiplier A defined by the multiplier estimating part 203 is passed to a division processing part 204, a multiplication part 205 and a multiplier encoding part 206.

The division processing part 204 uses the multiplier A passed from the multiplier estimating part 203 and N samples x(i) as input to calculate N quotient signals y(i)=x(i)/A (step S84). In this calculation, y(i) can be any of an integer format, a floating-point format or a fixed decimal point format. When y(i) is converted into a decided notation format, it can be rounded by rounding off, rounding up, rounding to nearest, nearest tie to even or the like.

For example, x(i) is converted into a double-precision floating-point number, 64-bit floating-point number herein and then divided by the multiplier A. The resulting double-precision quotient is rounded to the nearest single-precision (32-bit) floating-point number to be a quotient signal y(i).

The a string of N quotient signals Y=(y(0), y(1), . . . , y(N−1)) obtained in the division processing part 204 are passed to a quotient signal encoding part 207, as well as the multiplication part 205 in this instance.

The multiplication part 205 multiplies each signal y(i) in the string Y of N quotient signals passed from the division processing part 204 by the multiplier A passed from the multiplier estimating part 203 and obtains N decoded samples x'(0), x'(1), . . . , x'(N−1) (step S85).

In the above processing, the decoded samples x'(i) are rounded within a range of values that can be represented in 32-bit floating-point notation. For example, a result of y(i) multiplied by A is retained as a double-precision (64-bit) floating-point number, and the obtained double-precision multiplication result is rounded to the nearest single-precision (32-bit) floating-point number, i.e., x'(i). The resulting sample string X'=(x'(0), x'(1), . . . , x'(N−1)) is passed to an error calculating part 208.

The error calculating part 208 subtracts the N decoded samples x'(0), x'(1), . . . , x'(N−1) passed from the multiplication part 205 from the N samples $x(0), x(1), \ldots, x(N-1)$ acquired from an input signal, respectively, and obtains a difference signal string $Z=(z(0), z(1), \ldots, z(N-1))$ of N difference signals $z(0), z(1), \ldots, z(N-1)$ (step S86). The calculation of the difference signal can be an exclusive OR operation (xor) on a bit basis on 32 bits of $x(i)$ and $x'(i)$ as they are, instead of a subtraction. That is, the difference operation between $x(i)$ and $x'(i)$ needs only to be performed.

The difference signal string Z from the error calculating part 208 is inputted to effective digits generating part 209 and an unit processing string converting part 211. The effective digits generating part 209 obtains a bit position (digit) containing "1" at its uppermost part in the N input difference signals $z(0), z(1), \ldots, z(N-1)$. That is, the effective digits generating part 209 obtains the maximum bit length in a frame as effective digits information (step S87). Then, the effective digits information is inputted to the unit processing string converting part 211. The unit processing string converting part 211 has, for example, the function configuration shown in FIG. 17, and converts a difference signal string into a character string (unit processing information string) having a predetermined number of bits using the processing procedure shown FIG. 18. Then, the unit processing string converting part 211 outputs a character string converted into a character string (unit processing information string) shown in any of FIGS. 15B to 15G and FIGS. 16B to 16E and the effective digits information to the mask LZ encoding part 96 (step S88).

The quotient signal encoding part 207 compression-codes a quotient signal string Y from the division processing part 204 to outputs a quotient code $C_Y$. The compression-coding methods can include a lossless compression-coding method at high compression ratio using waveform value correlation such as a linear prediction encoding method (for example, see the non-patent literature 3) or other lossy compression-coding methods (MPEG4, AAC, TwinVQ or the like). The mask LZ encoding part 96 compression-codes a character string from the unit processing string converting part 211 to output it as a unit processing code $C_Z$. The mask LZ encoding part 96 performs mask LZ encoding such as the above mentioned mask LZ77, mask LZ78 or mask LZW. An effective digits encoding part 212 losslessly encodes effective digits information indicating the longest bit length in a frame into an effective digits code $C_d$. The multiplier encoding part 206 losslessly encodes a multiplier A to output it as a multiplier code $C_A$ (step S89). The combining part 98 outputs a quotient signal code $C_Y$, a unit processing code $C_Z$, an effective digits code $C_d$ and a multiplier code $C_A$ as a set of codes $C_x$ on a frame basis (step S90). A quotient signal can be encoded at any time after step S84, a multiplier A can be encoded at any time after step S83 and effective digits information can be encoded at any time after step S87.

Decoding Side

Figure 30:
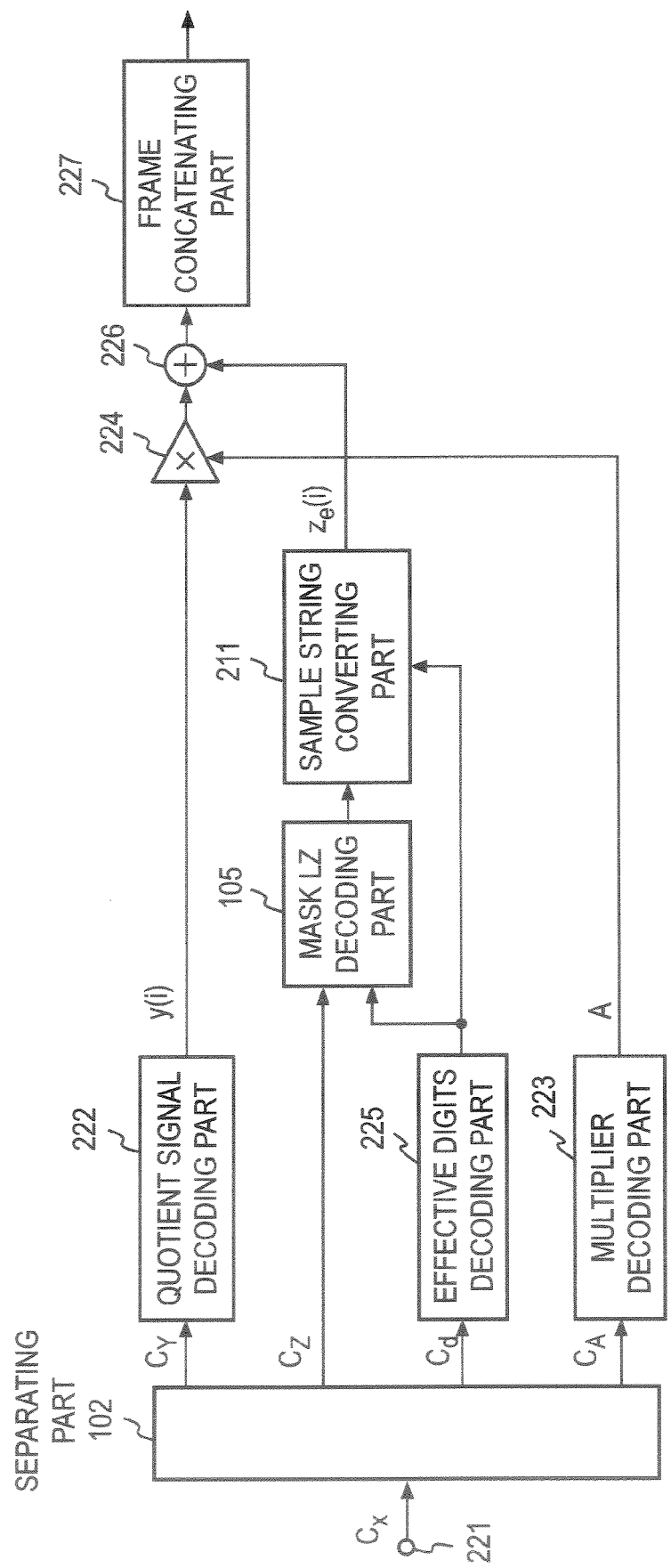
FIG. 30 is a block diagram showing an instance of function configuration of a decoding device according to the fourth embodiment.
Figure 31:
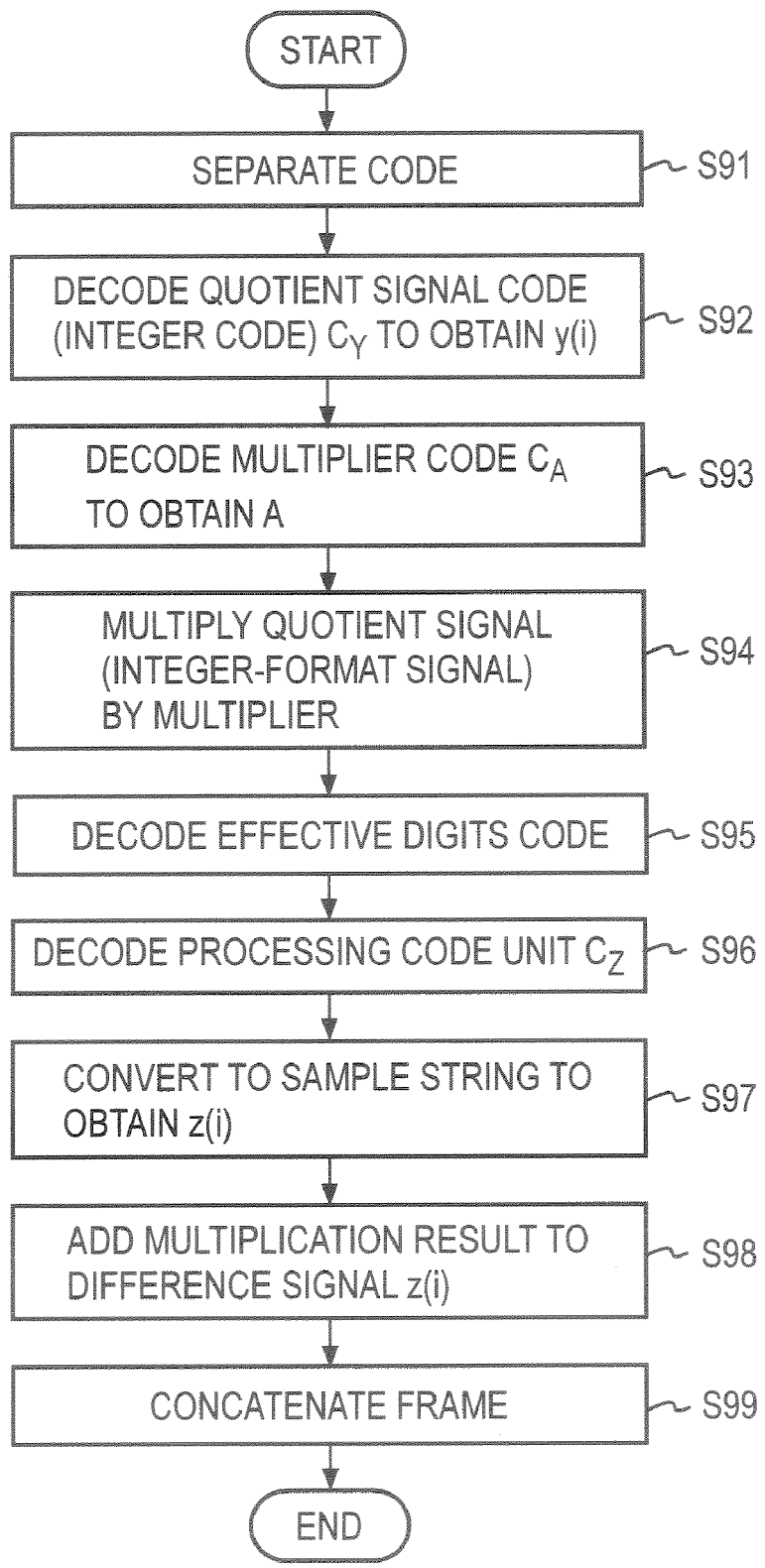
FIG. 31 is a flow diagram showing an instance of a processing procedure of a decoding device according to the fourth embodiment.

FIG. 30 shows an instance of function configuration of a decoding device according to the embodiment 4 and FIG. 31 shows an instance of a processing procedure by the decoding device.

The separating part 102 separates an encoded data $C_x$ from a terminal 221 into a quotient signal code $C_Y$, a unit processing code $C_Z$, an effective digits code $C_d$ and a multiplier code $C_A$ (step S91). A quotient signal decoding part 222 decodes the quotient signal code $C_Y$ into N quotient signals $y(0), y(1), \ldots, y(N-1)$ by a decoding method corresponding to an encoding method used in the quotient signal encoding part 207 (step S92). A multiplier decoding part 223 decodes the multiplier code $C_A$ (step S93). A multiplication part 224 multiplies each of the N decode quotient signals $y(0), y(1), \ldots,$ $y(N-1)$ by the decoded multiplier A (step S94). An effective digits decoding part 225 losslessly decodes the effective digits code $C_d$ to generate effective digits information (information indicating the longest bit length in a frame) (step S95). The mask LZ decoding part 105 decodes the unit processing code $C_Z$ into a character string using the above mentioned effective digits information (step S96). A sample string converting part 211 converts the character string decoded by the mask LZ decoding part 105 into difference signals $z(0), z(1), \ldots, z(N-1)$ in the sample string (step S97). An addition part 226 adds each of the difference signals $z(0), z(1), \ldots,$ $z(N-1)$ to output from the multiplication part 224 (step S98). A frame concatenating part 227 concatenates the output signals $x(0), x(1), \ldots, x(N-1)$ from the addition part 226 to output the concatenation result as a decoded signal (step S99). Either of the processing of obtaining a multiplication signal $Ay(i)$ as a result of multiplying $y(i)$ by A or the processing of obtaining the difference signal sample $z(i)$ can precede the other. If the effective digits code $C_d$ or the multiplier code $C_A$ is the same as the previous frame, a code having a smaller number of bits indicative of being same as the previous frame can be outputted instead of the codes themselves. If lossy compression-coding is used as the quotient signal encoding part 207, as indicated by dashed lines in FIG. 28, the quotient signal code $C_Y$ can be decoded by a decoding part 213 and the decoded signal can be inputted to the multiplication part 205 instead of the output signal $y(i)$ from the division processing part 204.

Embodiment 5

An embodiment 5 will be described in which the method according to the present invention is applied to the method of compression-coding using division by a common multiplier and the encoding method for a floating-point signal described in the non-patent literature 4.

Encoding Side

Figure 32:
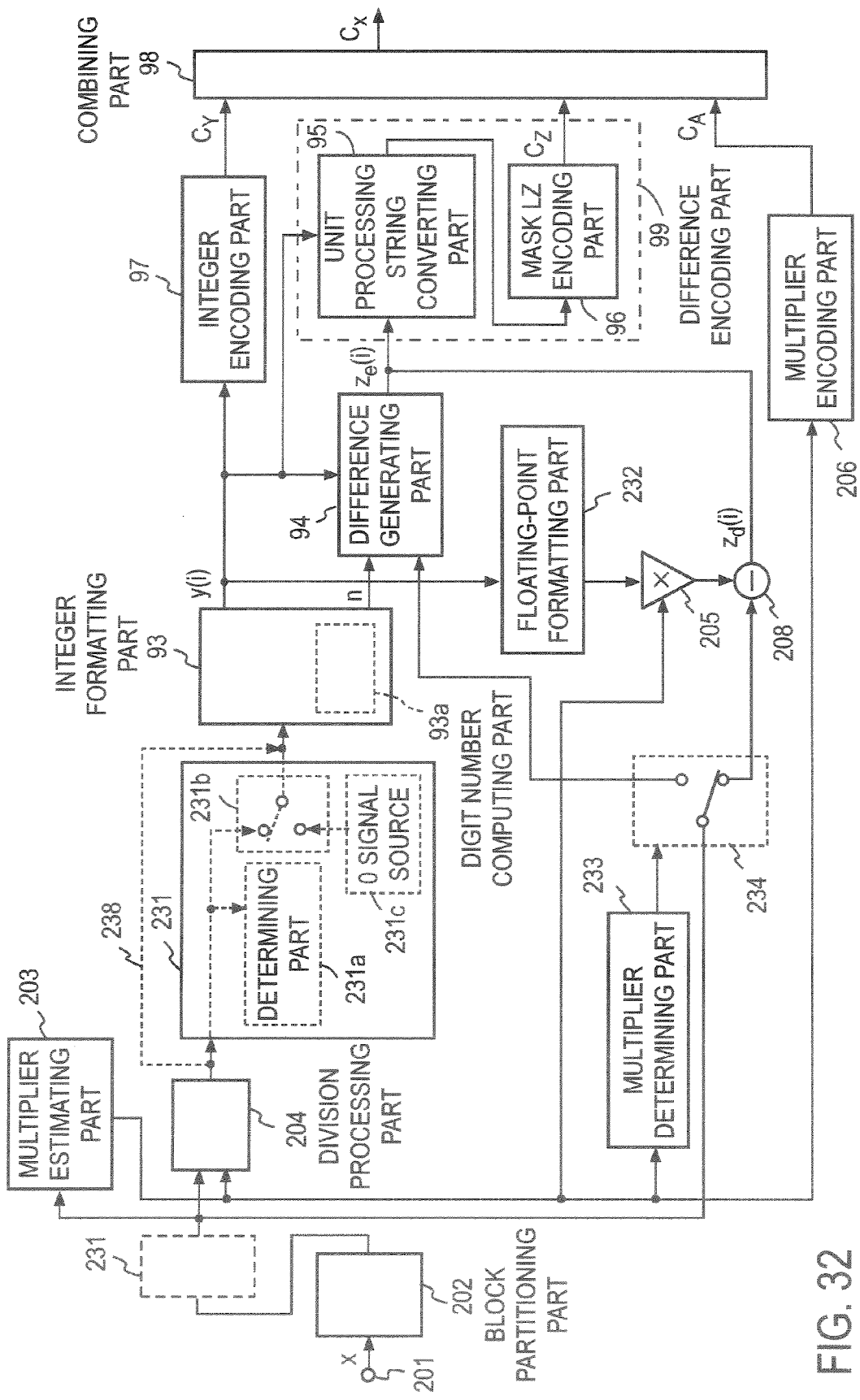
FIG. 32 is a block diagram showing an instance of function configuration of an encoding device according to a fifth embodiment.
Figure 33:
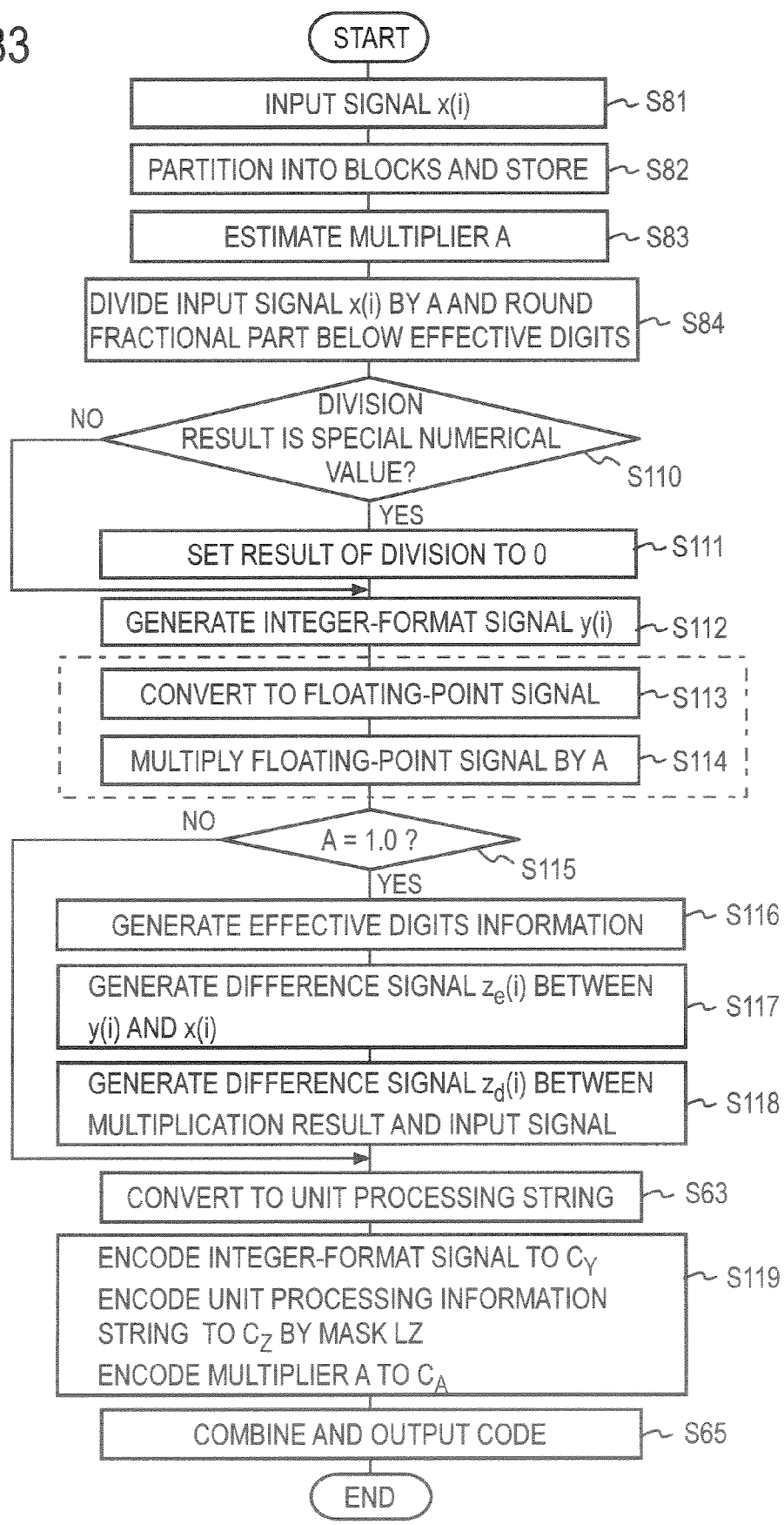
FIG. 33 is a flow diagram showing an instance of a processing procedure according to the fifth embodiment.

FIG. 32 shows an instance of function configuration and FIG. 33 shows an instance of a processing procedure.

As with the embodiment 4, a block partitioning part 202 captures an input signal $x(i)$ (step S81), partitions it into frames and stores them in a storage part (step S82). The multiplier estimating part 203 estimates a multiplier A (step S83). The division processing part 204 divides the input signal $x(i)$ by the multiplier A and rounds the signal under effective digits (step S84). If the multiplier A is 1, the division processing by the division processing part 204 can be omitted. In this instance, a determining part 231a in a determination processing part 231 determines whether or not a unit precision floating-point number as a result of the division processing is a special numerical value as an infinitely large value, an unnormalized number, or NaN that cannot be represented as a numerical value (step S110). Hereinafter, an infinitely large value, an unnormalized number and NaN that cannot be represented as a numerical value are generically called a "special numerical value". If the determination at step S110 is a special numerical value, a switch 231b is switched from the side of the division processing part 204 to the side of a zero-signal source 231c, such that a zero-signal is supplied to the integer formatting part 93 (step S111). If the determination at step S110 is not a special numerical value, the result of division processing at step S84 is inputted to the integer formatting part 93.

The integer formatting part 93 generates an integer-format signal $y(i)$ from the input signal from the determination processing part 231 (step S112). A floating point formatting part 232 converts the integer-format signal y(i) into a floating-point signal (step S113). A multiplier part 205 multiplies the floating-point signal by a multiplier A and rounds the multiplication result (step S114). In the above processing, if it is determined to be a special numerical value or the multiplication result is 0 when y(i)=0, 32 bits in the input signal (sample) x(i) pass through the error calculating part 208 without being processed and are inputted to the unit processing string converting part 95. If the multiplier A is 1, the multiplication processing at step S114 can be omitted. Steps S113 and step S114 can be performed as a single step by multiplying the integer signal y(i) by a floating-point multiplier A, as indicated by a dashed line surrounding steps S113 and S114.

Meanwhile, a multiplier determining part 233 determines whether or not a multiplier A is 1 (step S115). If A=1, a switch 234 is connected to the difference generating part 94 and an input signal x(i) is inputted to the difference generating part 94. A digit number computing part 93a in the integer formatting part 93 calculates the number n of digits of a signal y(i) in an integer format and generates effective digits information. The effective digits information n is also inputted to the difference generating part 94 (step S116). The difference generating part 94 generates a difference signal $z_e(i)$ composed of lower (23−n) bits in a mantissa of the input signal (sample) x(i), similarly to the encoding device according to the third embodiment (step S117). Herein, the difference signal $z_e(i)$ is a variable-length sample. If x(i) is a special numerical value or y(i)=0, 32 bits in the input signal (sample) x(i) are inputted to the unit processing string converting part 95. If the multiplier A is not 1 at step S115, the switch 234 is connected to the error calculating part 208. The error calculating part 208 generates a difference signal $z_d(i)$ between the input signal x(i) and the output signal from the multiplication part 205 (step S118).

The unit processing string converting part 95 receives the difference signal $Z_d(i)$ from the error calculating part 208 or the difference signal $z_e(i)$ from the difference generating part 94 and converts it into an unit processing information string (step S63). The integer encoding part 97 encodes the integer-format signal y(i) into an integer code $C_Y$. The mask LZ encoding part 96 encodes the unit processing information string into a unit processing code $C_Z$ by the mask LZ method. The multiplier encoding part 206 encodes the multiplier A into a multiplier code $C_A$ (step S119). The combining part 98 combines the codes $C_Y$, $C_Z$ and $C_A$ and outputs the result on a frame basis (step S65).

If the determining part 231a determines the determination result to be a special numerical value, then y(i)=0. Consequently, 32 bits in the input signal (sample) x(i) pass through the error calculating part 208 and are inputted to the unit processing string converting part 95. If the multiplier determining part 233 determines that A is not 1, the error calculating part 208 inputs 23 bits in a mantissa of the input signal (sample) x(i) to the unit processing string converting part 95. If it is determined that A=1, the difference generating part 94 inputs lower (23−n) bits in the mantissa of the input signal (sample) x(i) to the unit processing string converting part 95. The unit processing string converting part 95 can convert such a variable-length sample into an unit processing information string, as described with reference to FIGS. 15A to 15G. If the maximum length of samples is 32 bits the sample can be similarly converted into an unit processing information string.

Figure 35A:
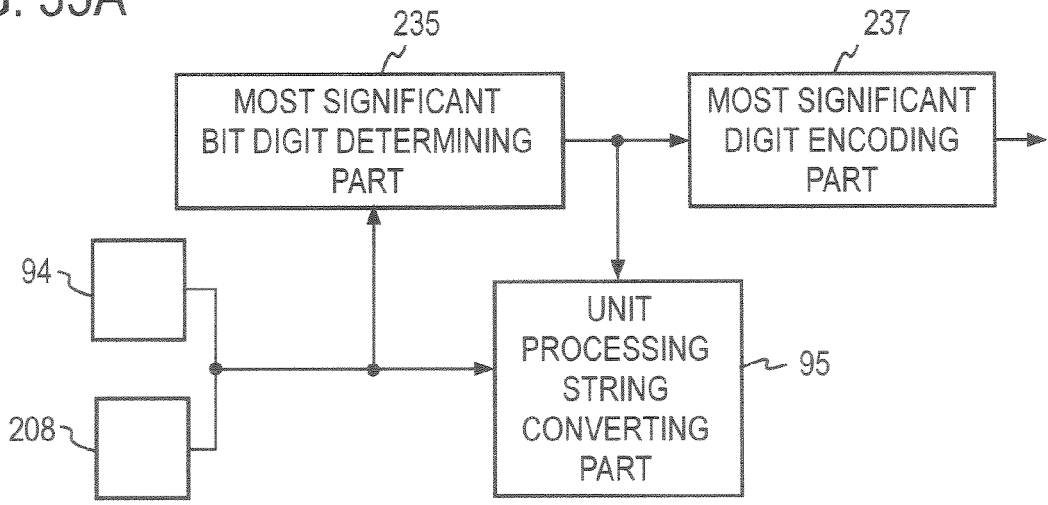
FIG. 35A is a block diagram showing an instance of function configuration of a part transformed from an encoding part for an unit processing information string.

In the above processing, a most significant bit digit determining par 235 can be used before the unit processing string converting part 95, as in FIG. 35. The most significant bit digit determining part 235 determines the most significant nonzero bit digit in an input sample string (the difference signal $z_d(i)$ or the difference signal $z_e(i)$ from the difference generating part 94) of the current processing block, and outputs it as the most significant digit (bit) information $L_{S\ max}$ to the unit processing string converting part 95 and a most significant digit encoding part 237. The most significant digit encoding part 237 encodes information of the most significant nonzero digit (bit) and outputs it to the combining part 98.

The unit processing string converting part 95 converts the inputted signal (the difference signal $z_d(i)$ or the difference signal $z_e(i)$ from the difference generating part 94) into an unit processing string using the most significant digit (bit) information $L_{S\ max}$ of a signal.

Figure 35B:
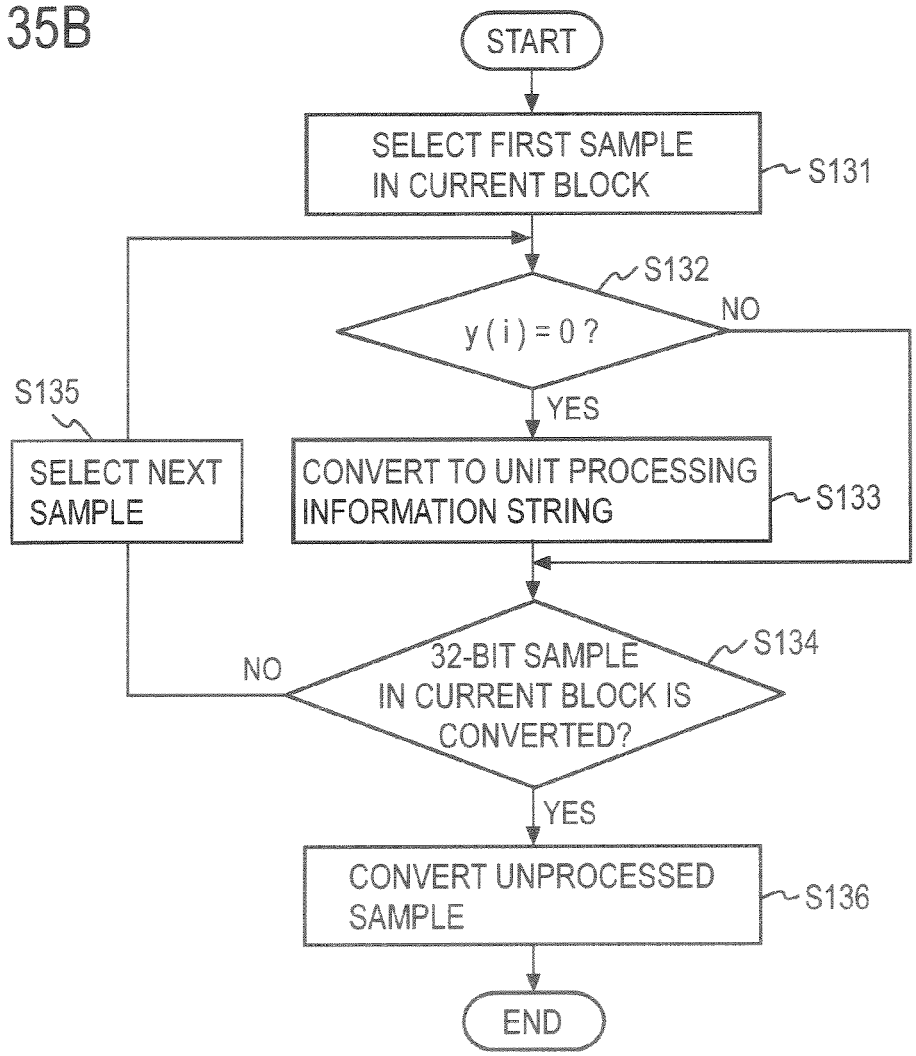
FIG. 35B is a flow diagram showing an instance of a procedure transformed from a portion of the conversion of an unit processing string.

Also, samples can be classified based on whether they have the integer-format signal y(i) of a value 0 or nonzero to order the samples such that the samples are inputted sequentially to the mask LZ encoding part. For example, a processing method is known as shown in FIG. 35B. The first input sample in a processing block (frame) from the difference generating part 94 or an error computing part 208 is selected (step S131). It is determined whether the sample is a sample satisfying y(i)=0 or another sample (step S132). Herein, a sample satisfying y(i)=0 corresponds to a sample in which the effective digits of bits to be encoded is 32 bits. Another sample corresponds to a sample in which the effective digits of bits to be encoded is less than 32 bits. If Yes at step S132, the sample is converted into an unit processing information string (step S133). Next, it is determined whether or not steps S132 and S133 has been performed on the last sample in the processing block (step S134). If the processing on the last sample has not been performed, the next sample is selected and the processing returns to step S132 (step S135). If y(i) is determined to be a nonzero sample at step S132, the processing moves to step S134. If it is determined that the processing on the last sample at step S134 has been completed, unprocessed samples in the block, i.e., difference signals not satisfying y(i)=0, are sequentially converted into an unit processing information string (step S136).

The most significant digit (bit) information can be determined for both a sample collection in which effective digits of bits to be encoded is 32 bits and another sample collection in which effective digits of bits to be encoded is less than 32 bits.

Decoding Side

Figure 34:
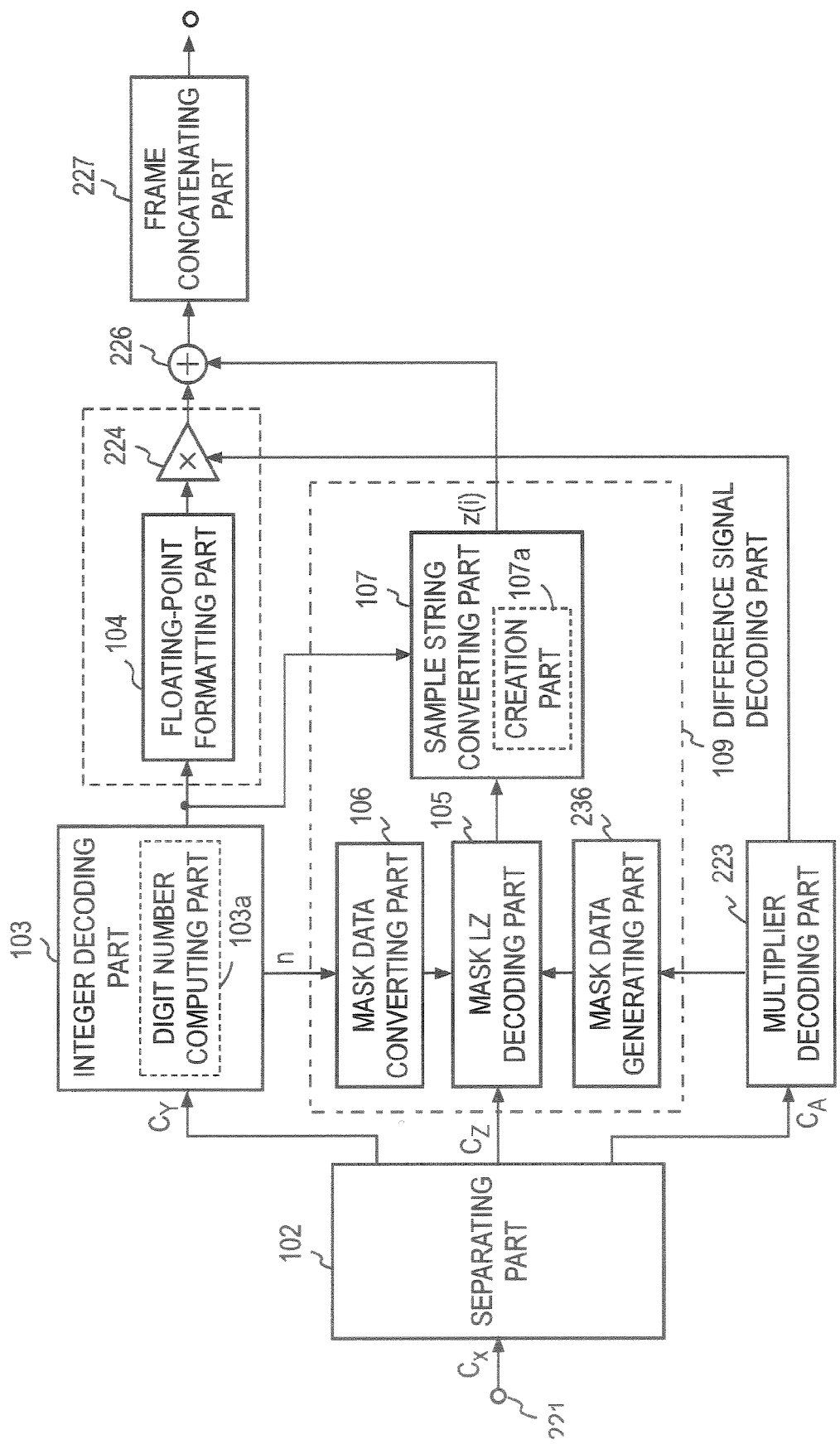
FIG. 34 is a block diagram showing an instance of function configuration of a decoding device according to the fifth embodiment.

FIG. 34 shows an instance of function configuration according to the embodiment 5. The processing procedure is almost same as that shown in FIG. 31. However, a quotient signal code $C_Y$ corresponds to an integer code $C_Y$.

The separating part 102 separates an inputted code $C_X$ into an integer code $C_Y$, a unit processing code $C_Z$ and a multiplier code $C_A$. The integer decoding part 103 decodes the integer code $C_Y$ into an integer-format signal y(i). The integer decoding part 103 inputs the number n of digits in the integer-format signal y(i) and information indicating that y(i)=0 if the equation is satisfied as effective digits information to the mask data converting part 106. The mask data converting part 106 converts the effective digits information into mask data for each unit processing information. That is, (23−n) bits and corresponding mask data for each sample if A=1, or 32 bits and corresponding mask data for the sample if y(i)=0 are inputted to the mask LZ decoding part 105. The mask LZ decoding part 105 decodes the unit processing information $C_Z$ using the mask LZ method and generates an unit processing information string. The multiplier decoding part 223 decodes the multiplier code $C_A$ into a multiplier A. If the multiplier A is not 1, a mask data generating part 236 generates mask data corresponding to 23 bits in a mantissa and input it to the mask LZ decoding part 105.

The floating-point formatting part 104 converts the decoded integer-format signal y(i) into a floating-point signal. The multiplication part 224 multiplies the output from the floating-point formatting part 104 by a multiplier A. The sample string converting part 107 converts the unit processing information string from the mask LZ decoding part 105 into a sample string, i.e., a difference signal z(i). The addition part 226 adds the difference signal z(i) to the output from the multiplication part 224 and the output is inputted to the frame concatenating part 227. In the case of a (23−n)-bit sample, the sample string converting part 107 creates a 23-bit mantissa by concatenating n 0s to the upper portion, similarly to a corresponding portion in FIG. 24. If the decoded integer-format signal y(i) is 0, a 32-bit floating-point signal (sample) is outputted by the sample string converting part 107 and inputted to the frame concatenating part 227.

As indicated by a dashed line in FIG. 32, the determination processing part 231 can be inserted next to the block partitioning part 202. A special numerical value is an exceptional value. As such, for a floating-point signal containing no special numerical value, an output side of the division processing part 204 can be connected directly to the integer formatting part 93, as indicated by a dashed line 238 in FIG. 32.

[Variation]

According to this variation, if the size of a result of encoding by the mask LZ encoding part is larger than the size inputted to the unit processing string converting part 95, information indicating that no mask LZ encoding will be performed and the original data itself can be outputted to the combining part 98.

In that case, the data sizes are compared in the cases that the mask LZ is used and is not used for the blocks partitioned by the block partitioning part, and then the smaller size of data is outputted along with the selected code.

At the start of encoding the blocks, an internal state of the mask LZ encoding part is saved. If the size does not become smaller after the compression the internal state of the mask LZ encoding part is returned to the saved state before mask LZ encoding processing on the next block. This enables to keep synchronization between internal states of the encoding side and the decoding side.

Next, an instance of application to encoding of an input signal with different effective digits for different samples will be described.

For example, in encoding of an acoustic signal, an encoding method is known that involves, using an auditory psychological model or the like, large distortion in a portion in which distortion is difficult to perceive due to the human auditor characteristics. Based on the amount of the involved distortion, effective digits information of a value will be provided. For example, as shown in FIG. 16A, the word length of the inputted sample string is definite, for example 31 bits. An unit processing string converting part 79 shown in FIG. 17 assigns the word length to the string to be a suitable for the processing by the mask LZ encoding part 78 and sets mask data based on the effective digits information.

Taking the conversion of a character string shown in FIG. 16E for instance, assume that the word length of a single character is eight bits. As shown in FIG. 16E, the inputted signal string is aligned from the LSB side based on information of effective digits, cut into eight-bit processing units for the mask LZ method and arranged as a character string. In this processing, if the word length of an input signal string is not an integral multiplication (in this instance, a multiplication of eight) of the word length of a character, dummy bits of value "0" are added to the MSB side till the length becomes a multiplication of eight bits.

In addition, mask data representing effective digits is created. The mask data is set such that effective bits are "1" while bits involving distortion and dummy bits are "0". Assuming that an i-th character pulled out from the input signal is C1(i) and corresponding mask data is M1(i), the compression-coding method according to the first embodiment (including variations of the first embodiment) shown in FIG. 5 can be applied using the character string and the mask data string as input.

A specific instance of applying the embodiment A-1 (mask-LZ77) will be described below.

The size of a read-ahead buffer is defined as 256 characters (8 bits) and the buffer size of the dictionary part 43 (FIG. 14A) is defined as 65,536 characters (16 bits).

Using the definition, position information (an index) is represented in 16 bits and the maximum matching length is represented in 8 bits. This is just one instance, and more efficient processing is possible using known methods. For example, the LZSS can be applied instead of the LZ77 without losing the effectiveness of the present invention.

The longest matching character string is searched for in input character strings C1(i) and effective digits information (mask data) M1(i) in the read-ahead buffer 65 (FIG. 14A) and character strings registered in the dictionary part 43 (slide buffer). An index corresponding to the searched longest matching character string in the dictionary, the matching length and the next mismatching character $C1_D$ in the read-ahead buffer are outputted as a code.

Assuming that a character string in the read-ahead buffer is C1(i+k), effective digits information is M1(i+k) [k=0, 1, 2, . . . ] and representing a character string registered in the dictionary part (slide buffer) and starting from a j-th position as D(j)(k) and effective digits as M(j)(k), and assuming that the length of a match between a character string starting from the j-th position in the dictionary and a character string in the read-ahead buffer is $k_{max}$, the match determination results a position j in the dictionary having the longest $k_{max}$ satisfying C1(i+k)&M1(i+k)=D(j)(k)&M(j)(k) for every k from k=0 to k=$k_{max}$−1.

According to the embodiment A-4 alternative to the embodiment A-1, an element j in the dictionary is obtained that has the longest $k_{max}$ satisfying C1(i+k)&M1(i+k)&M(j)(k)=D(j)(k)&M(j)(k)&M1(i+k) for every k form k=0 to k=$k_{max}$−1.

Next, each time a code is outputted, a matching character string and the following mismatching character are deleted from the read-ahead buffer and a matching character and the following mismatching character are registered in the dictionary part 43. The oldest character string in the dictionary part 43 is discarded.

When a matching character string C1(i+k) and M1(i+k) [k: 0≦k<$k_{max}$] are registered in the dictionary part 43 (slide buffer) according to the embodiment A-1, in a lossy instance, the matching $k_{max}$-character C1(i+k) and M1(i+k) in the read-ahead buffer are not copied, but a set of matching D($j_{max}$)(k) outputted as a code and effective digits information M1(i+k) for C1(i+k) is added to the dictionary part 43. Then, a character C1(i+k)(=$C1_D$) next to the longest matching character string and M1(i+k)(=$M1_D$) are added to the read-ahead buffer 65. That is the dictionary part 43 is also provided with a masking part 43c that stores mask data M(i), as indicated by the dashed line in FIG. 14A.

The read-ahead buffer 65 reads in a same number of new input character strings as deleted ones and corresponding effective digits information.

The following will describe decoding processing.

In the decoding processing, opposite operations are performed correspondingly to the respective processing in the encoding processing.

As already described with reference to FIG. 8, the decoding device receives a code string and effective digits information as input. The effective digits information is converted into mask data (M1($i$) string) by the mask data generating part 151.

The code obtained by the above processing and the effective digits mask data are inputted into the mask LZ decoding device.

The mask LZ decoding device decodes the original character string using the code input and the effective digits information (mask data). The character string obtained by the above processing is decoded into a signal string of which original word length is 31 bits by the sample string converting part 84 in FIG. 19.

In the above description an input character (unit processing information) is assumed to be numerical value information. As such, in effective digits, upper digits are generally more important. Ineffective or ignorable digits (bits) are on the LSB side. Also, when dummy bits are aligned from the LSB side, they are not lower than the most significant bit of effective digits of the sample and are sequential enough to reach the size of a character. On the other hand, for example even if there is a change in one or more of certain bits in constitution bits in a general character, it can hardly affect the whole information string. In this case, effective digits or dummy bits are not sequential. The present invention can be applied by setting a bit (digit) in a bit string of a character as an ineffective digit. In this case, in converting a character string into a sample string, the mask data generating part 85 generates mask data from effective digits information for each character, as shown by a dashed line in FIG. 19. Then, a selecting part 86 needs only select bits in the digits (bits) being "1" in corresponding mask data from each character in a character string to be inputted to the bits-unit coupling part 87. The effective digits information is provided from the mask LZ decoding part 81 or outside.

Fast Search Process Using Hashing

A specific instance will be described in which hashing is used for the dictionary search processing at step S4 in FIG. 6 to speed up the search. In the method shown in FIG. 7, a dictionary index j varies from 0 to the maximum value to compare all character strings registered in the dictionary with an input character string. In the conventional LZ encoding method without using mask processing, a method is known that uses hash unction processing to speed up the search. However, in the mask LZ, the known hash function processing approach cannot be applied as it is, since it is necessary to search whether or not the same dictionary-registered character matches a plurality of input characters depending on the mask.

The following describes an instance of applying the method of using hash unction processing considering effective digits at registration of a character string to the dictionary part to the mask LZW in order to speed up the search.

Consider that a character string concatenated with the following mismatching character C1($i$+K$_j$) is newly registered at an index J+1 in the dictionary part while assuming that an input character string matching the content registered in the dictionary part is D(j)(k) [k: 0≦k<K$_j$]. In the known hash function processing, a hash value is calculated by, for example, j and C1($i$+K$_j$) as keys and registered at a corresponding place J in a hash table in the dictionary part.

Figure 36:
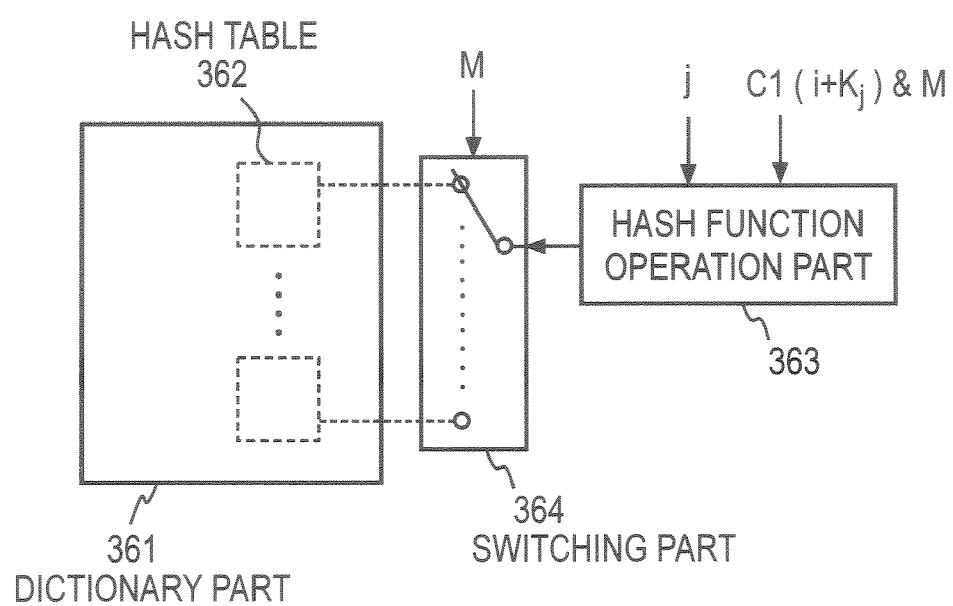
FIG. 36 is a block diagram illustrating a portion of function configuration in which hash function processing is applied to the longest matching character search.

For the above processing, according to the present invention, a number of hash tables 362 are provided in a dictionary part 361, for example as shown in FIG. 36, in which the number of tables 362 corresponds to the number or different masks. A hash function operation part 363 computes a hash value by keys j and C1($i$+K$_j$)&M. A switching part 364 switches to a hash table corresponding to mask data M to register the character string. Herein M is mask data with different mask bits and varies within eight values, from 00000001 to 11111111 if a processing unit of a character is eight bits and the search is performed in alignment from the LSB side.

In the search processing, a hash table is selected by a key, the number of bits set to 1 at M(i+k), and then the selected hash table 362 is searched by keys j and C1($i$+K$_j$)&M(i+k).

For example, information of both positions of the most significant bit and the least significant bit in the effective digits can be used as effective digits information. In that case, for example in two characters to be compared, it is checked whether or not there is a match between a bit position in one character and each corresponding bit. If there is a match, it is checked whether there is a match for the next bit. If there are matches for all bits the two characters match each other. If any of them mismatches, the two characters mismatch each other.

The above mentioned encoding device and decoding device can both be operated through a computer. In that case, a program that causes a computer to function as a desired device (device with the function configuration shown in the diagrams according to the various types of embodiments) or a program that causes the computer to execute the steps in the processing procedures (shown according to the embodiments) is downloaded into the computer from a recording medium such as a CD-ROM, a magnetic disc or a semiconductor recording device, or via a communication line to execute the program.

[Reason for Capability of Encoding Variable-Length Sample at High Compression Ratio According to the Present Invention]

The following will describe the reason why a sample string of a digital value such as a signal of audio such as voice or music, an image signal, various types of measured signals or a linear prediction error signal can be converted into an unit processing information string that can be encoded at high compression ratio according to the present invention. FIG. 37A shows an instance of a string of samples, each of which has a different number of bits (or an instance of effective bits portion in a string of samples, each of which has a different number of effective bits). Consider that the sample string is converted into a 4-bit character string. FIG. 37B shows an instance (conventional method) of converting the sample string into a character string by simply defining four bits as a character. FIG. 37C shows an instance (the method according to the present invention of conversion into a character string using dummy bits such that a character does not contain bits from different samples.

First, it is demonstrated that compression-coding at high compression ratio is expected by the method of converting a character string according to the present invention.

In converting a sample string with varying number of bits into a character string (in this instance, four bits constitute a character), if an inputted bit string is simply partitioned into four-bit strings, the character string (y(1), . . . ) results as shown in FIG. 37B. With this partitioning, for example y(5) is composed of the last two bits (on the LSB side) in the sample x(1) and the first two bits (the MSB side) in the sample x(2).

On the other hand, in a digital sample string resulting from sampling a time-series signal such as an audio signal or other waveform signals, correlation between samples is generally large and the samples and chunks of samples are often alike. However, if a sample string is converted into a character string containing characters composed of bits on the LSB sides and the MSB sides in different samples as above, the similarity among the samples or chunks of samples cannot be maintained in the character string after the conversion. As a result, the simple conversion as shown in FIG. 37B results a character string that cannot be expected to be encoded at high compression ratio.

For the above reason, according to the present invention, conversion into a character string is not performed across samples, as shown in FIG. 37C. According to the present invention, dummy bits are added until each sample becomes an integral multiplication of the number of bits as a unit (four bits in this instance). Then, a sample string is converted into a character string by partitioning it into units of bits. If a variable-length sample string is converted into a definite-length character string, the similarity among the samples or chunks of samples can be maintained in the character string after the conversion. As such, a digital sample string based on a time-series string signal can be compression-coded at high compression ratio.

Next, the following will demonstrate that the mask processing according to the present invention improves the compression ratio.

In the case of a string of time-series signal samples, each of which has different effective digits, the samples differ in their effective digits, but many samples contain the same portion. However, when the conventional encoding method by searching perfectly matching character is performed on an effective digits portion only or a character containing dummy bits, a perfectly matching character string is not found in many cases. As for character strings as in FIG. 37B, no character string contains a plurality of sequential characters matching another string. According to the present invention, in comparing y(7), y(8) and y(9) in a character string in FIG. 37C with past character strings, three bits after y(9) are masked. That is, the three bits after y(9) are not compared (they can be different from those in other strings). Consequently, it is determined that y(7), y(8) and y(9) match y(3), y(4) and y(5), respectively. In this way, since the use of dummy bits and mask processing allows to identify character strings differing in their effective digits but containing the same portion to be the same, a possibility increases of encountering the same character string as a previously-encountered character string. Accordingly, efficiency of compressing a digital sample string based on a time-series signal can be improved.

Experimental Embodiment

Figures 38A, 38B:
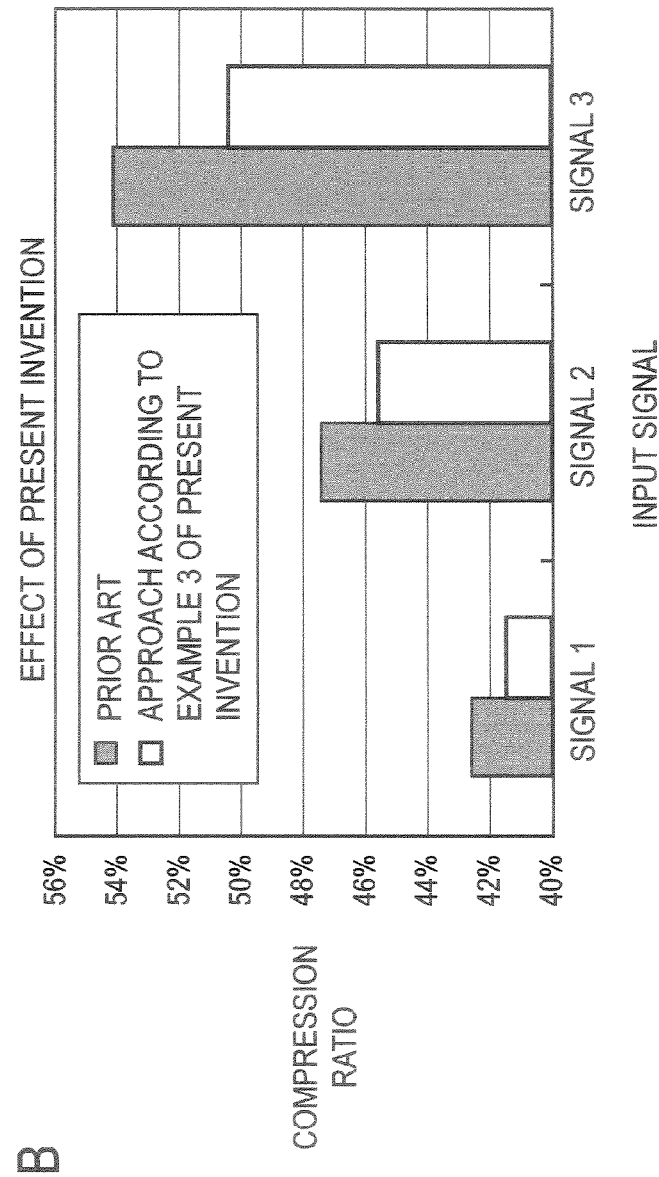
FIG. 38A is a diagram illustrating a result of compression of a floating-point signal by the methods according to prior arts and the present invention.
FIG. 38B is a diagram showing comparison of the compression ratios of the floating-point signal.

In order to demonstrate the effects of the present invention, FIGS. 38A and 38B show a result of an experiment in comparison of the compression ratios for a floating-point signal. Input signals are a signal 1 (sampled at 96 kHz and quantization bit rate is 24 bits), a signal 2 (sampled at 96 kHz and quantization bit rate is 24 bits) and a signal 3 (sampled at 48 kHz and quantization bit rate is 24 bits) being floating-point signals. In the method according to the present invention as shown in FIG. 37C, alignment corresponding to that shown in FIG. 15E is performed, in which compression is carried out by the method according to the third embodiment using eight bits as a character. According to the prior arts, in encoding an error signal Z according to the third embodiment, effective bits are concatenated serially to form a character of eight bits for encoding by the conventional LZ encoding differently from the present invention, as shown in FIG. 37B. If the size of an original input signal is x and the size after the compression is y, compression ratio in the conventional method is (y/x)×100. FIGS. 38A and 38B shows that the present invention can achieve high compression ratio.

What is claimed is:

1. An information compression-coding method of compression-coding input information by searching for a string of information represented by a processing unit of definite number of bits (hereinafter, referred to as "unit processing information") registered in a dictionary part (hereinafter, referred to as "dictionary information"), said the string of information corresponding to a string of unit processing information; and the method comprising:

a match determination step of comparing effective bits corresponding to the effective digits of the input information in a string of unit processing information generated from said input information with corresponding bits in the dictionary information, and determining that said unit processing information matches the dictionary information if there are matches between all of said effective bits and the corresponding bits;

a search step of searching for the longest dictionary information string among the dictionary information strings that can be determined to match the string of unit processing information generated from said input information, and obtaining an index of said longest dictionary information string; and an output step of outputting said index or a code corresponding to said index.

2. An information compression-coding method according to claim 1 further comprising:

a dictionary registration step of registering an unit processing information string containing an unit processing information string indicated by said index to the dictionary part.

3. An information compression-coding method according to claim 2 characterized in that:

in said dictionary registration step, if the amount of the registered unit processing information is more than a pre-determined amount, the oldest registered unit processing information is deleted.

4. An information compression-coding method according to claim 1 characterized in that:

the input information is a sample string;

the method further comprises an unit processing information generation step of, for each sample, dividing bits constituting effective digits in the sample on said processing unit basis to generate said unit processing information; and in said unit processing information generation step, if the division leaves a remainder of bits in the sample or the bits in the sample does not reach the processing unit, dummy bits are added to the remainder bits or the bits in the sample under the processing unit to form unit processing information, in which the added dummy bit portion is considered not to be effective bits.

5. An information compression-coding method according to claim 4 characterized in that:

the input signal is in a floating-point format;

the method further comprises:

a separation step of separating the input signal into a signal in an integer format and a difference signal; and an integer format encoding step of compression-coding said integer-format signal;

said unit processing information generation step, said match determination step and said search step are performed using said string of difference signals as input information composed of a sample string; and in said output step, the code compression-coded at said integer format encoding step is outputted in addition to said index.

6. An information compression-coding method according to claim 5 characterized in that:

the method further comprises the steps of:

determining whether or not said difference signal separated at said separation step is a difference signal when said integer-format signal is 0;

if said determination determines that the integer-format signal is a difference signal when the integer-format signal is 0, generating the first difference signal string based on the difference signal; and if said determination determines that the signal in an integer format is a difference signal when the signal in an integer format is not 0, generating the second difference signal string based on the difference signal; and said first difference signal string and said second difference signal string are concatenated to be used as input information composed of said sample string.

7. An information compression-coding method according to claim 4 characterized in that:

the method further comprises:

a resolving step of resolving an input signal string in a partition block composed of a plurality of pre-determined input signals into a common multiplier, a string of quotient signals in which each of the input signals are divided by the multiplier and a string of remaining difference signals;

a quotient signal encoding step of compression-coding said quotient signal string and outputting the result; and a multiplier encoding step of encoding said multiplier and outputting the result; and said unit processing information generation step, said match determination step, said search step and said outputting step are performed using said string of difference signals as input information composed of a sample string.

8. An information compression-coding method according to claim 7 characterized in that:

the method further comprises the steps of:

determining whether or not the difference signal constituting said difference signal string obtained at said resolving step is a difference signal when said quotient signal is 0;

if said determination determines that the difference signal is a difference signal when the quotient signal is 0, generating the first difference signal string based on the difference signal; and if said determination determines that the difference signal is a difference signal when the quotient signal is not 0, generating the second difference signal string based on said difference signal; and said first difference signal string and said second difference signal string are concatenated to be used as input information composed of said sample string.

9. An information compression-coding method according to claim 4 characterized in that:

the method further comprises:

a resolving step of resolving a floating-point input signal string in a partition block composed of a plurality of pre-determined floating-point input signals into a common multiplier and a string of quotient signals in which each of the floating-point input signals are divided by the multiplier;

an integer formatting step of converting said divided signal into a signal in an integer format;

a multiplication step of obtaining a floating-point signal by multiplying said integer-format signal by said multiplier;

a difference signal computing step of obtaining a difference signal between the floating-point signal obtained at said multiplication step and said floating-point input signal;

an integer format signal encoding step of compression-coding said integer format signal string and outputting the result; and a multiplier encoding step of encoding said multiplier and outputting the result; and said unit processing information generation step, said match determination step, said search step and said outputting step are performed using a string of a mantissa in said difference signal as input information composed of a sample string.

10. An information compression-coding method according to claim 4 characterized in that:

the method further comprises:

a resolving step of resolving a floating-point input signal string in a partition block composed of a plurality of pre-determined floating-point input signals into a common multiplier and a string of quotient signals in which each of the floating-point input signals are divided by the multiplier;

an integer formatting step of converting said divided signal into a signal in an integer format;

a floating-point formatting step of converting said integer-format signal into a floating-point signal;

a multiplication step of multiplying the floating-point signal obtained at said floating-point formatting step by said multiplier;

an integer format signal encoding step of compression-coding said integer format signal string and outputting the result; and a multiplier encoding step of encoding said multiplier and outputting the result; and if said multiplier is 1 and said integer-format signal is not 0;

said unit processing information generation step, said match determination step, said search step and said outputting step are performed using a string of bits containing as effective bits lower (the number of digits of a mantissa in said floating-point input signal −n) bits in a mantissa in said floating-point input signal, defined by the number n of effective digits in said integer-format signal, as input information composed of a sample string;

if said multiplier is not 1 and said integer-format signal is not 0;

the method further comprises a difference signal calculating step of obtaining a difference signal between the multiplied floating-point signal obtained at said multiplication step and said floating-point input signal;

said unit processing information generation step, said match determination step, said search step and said outputting step are performed using the mantissa string of the difference signal obtained at said difference signal computing step as an input signal composed of a sample string; and if said integer-format signal is 0;

said unit processing information generation step, said match determination step, said search step and said outputting step are performed using said floating-point input signal string as an input signal composed of a sample string.

11. An information decoding method of decoding an input code containing indices of indices in a dictionary part at which strings of unit processing information represented by a definite number of bits or information corresponding to the strings has been registered corresponding to indices, to obtain decoded information, the method comprising:
    an effective digits information retrieval step of obtaining effective digits information indicating effective bits for each of said unit processing information from the information contained in said input code;
    a unit processing information string retrieval step of retrieving a string of unit processing information corresponding to each of the indices contained in said input code from the registered strings of unit processing information or the registered information corresponding to the strings in the dictionary part; and
    a mask processing step identifying a valid portion in said retrieved string of unit processing information using said effective digits information to obtain decoded information.

12. An information decoding method of decoding an input code containing indices of indices in a dictionary part at which strings of unit processing information represented by a definite number of bits or information corresponding to the strings has been registered corresponding to indices, to obtain decoded information, the method comprising:
    an effective digits information retrieval step of obtaining effective digits information indicating effective bits for each of said unit processing information from the information contained in said input code;
    a unit processing information string retrieval step of retrieving a string of unit processing information corresponding to each of the indices contained in said input code from the registered strings of unit processing information or the registered information corresponding to the strings in the dictionary part; and
    a coupling step of coupling effective bits in one or more unit processing information contained in said one or more retrieved strings of unit processing information using said effective digits information to produce a decoded signal.

13. An information decoding method according to claim 12 characterized in that:
    the method further comprises:
    a separation step of separating the input code into an integer code and a difference code;
    an integer-format signal decoding step of decoding said integer code to generate a signal in an integer format;
    a floating-point formatting step of converting said integer-format signal into a signal in a floating-point format; and
    a combination step of setting said floating-point format signal in which a mantissa is replaced in a combination of the mantissa of said floating-point format signal and the output at said coupling step as a decoded signal; and
    said effective digits information retrieval step and said unit processing information string retrieval step process the information or index contained in said difference code.

14. An information decoding method according to claim 12 characterized in that:
    the method further comprises:
    a separation step of separating the input code into a quotient code, a multiplier code and a difference code;
    a quotient decoding step of decoding said quotient code to obtain a quotient signal;
    a multiplier decoding step of decoding said multiplier code to obtain a multiplier;
    a multiplication step of multiplying said quotient signal by said multiplier; and
    an addition step of adding the output at said multiplication step and the output at said coupling step and setting the result as a decoded signal; and
    said effective digits information retrieval step and said unit processing information string retrieval step process the information or index contained in said difference code.

15. An information decoding method according to claim 12 characterized in that:
    the method further comprises:
    a separation step of separating the input code into an integer code, a multiplier code and a difference code;
    an integer signal decoding step of decoding said integer code to obtain a signal in an integer format;
    a multiplier decoding step of decoding said multiplier code to obtain a multiplier; and
    a multiplier determination step of determining whether or not said multiplier is 1;
    said unit processing information string retrieval step processes the index contained in the difference code;
    if said multiplier is 1 and said integer signal is not 0;
    said effective digits information retrieval step obtains the number n of effective digits in said integer signal as effective digits information;
    the method further comprises a step of outputting a signal in a floating-point format in which the decoded signal obtained at said coupling step is a lower (the number of digits in a mantissa of the output signal −n) bit portion of a mantissa based on said effective digits information;
    if said multiplier is not 1 and said integer signal is not 0;
    the method further comprises:
    a multiplication step of multiplying said integer signal by said multiplier; and
    an addition step of adding the output at said multiplication step and the decoded signal obtained at said coupling step and setting the result as the output signal; and
    if said integer signal is 0;
    the method further comprises a step of setting a signal in a floating-point format in which the decoded signal obtained at said coupling step is a mantissa as an output signal.

16. An information compression-coding device that compression-codes input information by searching for a string of information represented by a processing unit of definite number of bits (hereinafter, referred to as "unit processing information") registered in a dictionary part (hereinafter, referred to as "dictionary information"), said string of information corresponding to an unit processing information string; and
    the method comprising:
    a match determining part that compares effective bits corresponding to the effective digits of the input information in an unit processing information string generated from said input information with corresponding bits in the dictionary information, and determining that said unit processing information matches the dictionary information if there is matches between all of said effective bits and the corresponding bits;
    a searching part that searches for the longest dictionary information string among the dictionary information strings that can be determined to match the unit processing information string generated from said input information, and obtaining an index of said longest dictionary information string; and
    an output part that outputs said index.

17. An information compression-coding device according to claim 16 characterized in that:

the input information is a sample string;

the device further comprises an unit processing information generating part that, for each sample, divides bits constituting an effective digits in the sample on said processing unit basis to generate said unit processing information; and in said unit processing information generating part, if the division leaves a remainder of bits in the sample or the bits in the sample does not reach the processing unit, dummy bits are added to the remainder bits or the bits in the sample under the processing unit to form unit processing information, in which the added dummy bit portion is considered not to be effective bits.

18. An information decoding device that decodes an input code containing any index of indices in a dictionary part at which a string of information represented by a processing unit of definite number of bits (hereinafter, referred to as "unit processing information") has been registered to obtain decoded information, the device comprising:

an effective digits information retrieving part that obtains information indicating effective bits for each of said unit processing information (hereinafter, referred to as an "effective digits information") from the information contained in said input code;

an unit processing information string retrieving part that retrieves an unit processing information string registered in the dictionary part from the index contained in said input code; and a coupling part that couples effective bits in one or more unit processing information contained in said one or more retrieved unit processing information strings using said effective digits information to produce a decoded signal.

19. An information decoding device according to claim 18 characterized in that:

the device further comprises:

a separating part that separates the input code into an integer code and a difference code;

an integer-format signal decoding part that decodes said integer code to generate a signal in an integer format;

a floating-point formatting part that converts said integer-format signal into a signal in a floating-point format; and a combination part that sets said floating-point format signal in which a mantissa is replaced in a combination of the mantissa in said floating-point format signal and the output by said coupling part as a decoded signal; and said effective digits information retrieving part and said unit processing information string retrieving part process the information or index contained in said difference code.

20. An information decoding device according to claim 18 characterized in that:

the device further comprises:

a separating part that separates the input code into a quotient code, a multiplier code and a difference code;

a quotient decoding part that decodes said quotient code to obtain a quotient signal;

a multiplier decoding part that decodes said multiplier code to obtain a multiplier;

a multiplication part that multiplies said quotient signal by said multiplier; and an addition part that adding the output by said multiplication step and the output by said coupling part and sets the result as a decoded signal; and said effective digits information retrieving part and said unit processing information string retrieving part process the information or index contained in said difference code.

21. An information compression-coding device according to claim 16 characterized in that:

the device comprises:

a plurality of hash tables; and a switching part that, if k character-length unit processing information have been registered in the dictionary, registers a mismatching character to a hash table using registered dictionary indices and the mismatching character as hash keys in adding the character; and in one dictionary registration, said searching part changes effective digits information of a character next to the longest matching character, performs registration by selecting a hash table depending on the effective digits information, and then performs searching the hash table corresponding to the effective digits information in the searching.

22. A program to cause a computer to execute the steps of a method according to any one of claims 1, 11 and 12.

23. A computer-readable recording medium that records the program to cause a computer to execute the steps of a method according to any one of claims 1, 11 and 12.

* * * * *